(12) United States Patent
Hada et al.

(10) Patent No.: US 7,494,759 B2
(45) Date of Patent: Feb. 24, 2009

(54) POSITIVE RESIST COMPOSITIONS AND PROCESS FOR THE FORMATION OF RESIST PATTERNS WITH THE SAME

(75) Inventors: Hideo Hada, Kawasaki (JP); Masaru Takeshita, Kawasaki (JP); Satoshi Yamada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 74 days.

(21) Appl. No.: 11/597,696

(22) PCT Filed: May 24, 2005

(86) PCT No.: PCT/JP2005/009450

§ 371 (c)(1), (2), (4) Date: Nov. 27, 2006

(87) PCT Pub. No.: WO2005/116768

PCT Pub. Date: Dec. 8, 2005

(65) Prior Publication Data

US 2007/0224538 A1 Sep. 27, 2007

(30) Foreign Application Priority Data

| May 31, 2004 | (JP) | ............................. 2004-161881 |
| May 31, 2004 | (JP) | ............................. 2004-161882 |
| Apr. 28, 2005 | (JP) | ............................. 2005-133205 |
| Apr. 28, 2005 | (JP) | ............................. 2005-133206 |

(51) Int. Cl.
G03F 7/00 (2006.01)
G03F 7/004 (2006.01)

(52) U.S. Cl. .................... 430/270.1; 430/311; 430/330

(58) Field of Classification Search .............. 430/270.1, 430/311, 330
See application file for complete search history.

(56) References Cited

U.S. PATENT DOCUMENTS

| 6,004,720 A | 12/1999 | Takechi et al. |
| 6,013,416 A | 1/2000 | Nozaki et al. |
| 6,455,223 B1 | 9/2002 | Hatakeyama et al. |
| 6,632,586 B1 | 10/2003 | Aoai et al. |
| 6,645,695 B2 * | 11/2003 | Zampini ................... 430/270.1 |
| 6,656,659 B1 | 12/2003 | Nozaki et al. |
| 6,887,644 B1 | 5/2005 | Nozaki et al. |
| 6,982,140 B2 * | 1/2006 | Hada et al. ................ 430/270.1 |
| 2001/0031421 A1 | 10/2001 | Takeda et al. |
| 2004/0058269 A1 * | 3/2004 | Hada et al. ................ 430/270.1 |

FOREIGN PATENT DOCUMENTS

| JP | 04-039665 | 2/1992 |
| JP | 05-346668 | 12/1993 |
| JP | 09-090637 | 4/1997 |
| JP | 10-161313 | 6/1998 |
| JP | 2002-296782 | 10/2002 |
| JP | 2003-084436 | 3/2003 |
| JP | 2004-354609 | 12/2004 |
| WO | WO 00/25178 A1 | 5/2000 |

OTHER PUBLICATIONS

Kilian et al. "Synthesis and Cleavage of Core-Labile Poly(Alkyl Methacrylate) Star Polymers." *J. Polymer Science Part A.* 3083-3093 (2003).

* cited by examiner

*Primary Examiner*—Amanda C. Walke
(74) *Attorney, Agent, or Firm*—Knobbe, Martens, Olson & Bear LLP

(57) ABSTRACT

A positive resist composition comprising (A) a resin component and (B) an acid generator component, wherein the component (A) is a copolymer which comprises constituent units (a1) derived from a mono(α-lower alkyl)acrylate having an acid-dissociable dissolution-inhibiting group, constituent units (b1) derived from a mono α-lower alkyl)acrylate having a lactone ring, and constituent units (c1) derived from a poly (α-lower alkyl)acrylate; and a positive resist composition comprising (A) a resin component and (B) an acid generator component, wherein the component (A) is a star polymer having a core containing acid-dissociable dissolution-inhibiting groups and arms bonded to the core.

17 Claims, No Drawings

POSITIVE RESIST COMPOSITIONS AND PROCESS FOR THE FORMATION OF RESIST PATTERNS WITH THE SAME

RELATED APPLICATIONS

This application is the U.S. National Phase filing under 35 U.S.C. §371 of PCT/JP2005/009450, filed May 24, 2005, which designated the United States and was published in a language other than English, which claims priority under 35 U.S.C. §119(a)-(d) to Japanese Patent Application No. 2004-161881, filed May 31, 2004; Japanese Patent Application No. 2004-161882, filed May 31, 2004; Japanese Patent Application No. 2005-133205, filed Apr. 28, 2005; and Japanese Patent Application No. 2005-133206, filed Apr. 28, 2005. The content of these applications is incorporated herein by reference in their entireties.

TECHNICAL FIELD

The present invention relates to a positive resist composition and a process for forming a resist pattern using the same.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Conventionally, ultraviolet radiation typified by g-line and i-line radiation has been used, but nowadays KrF excimer lasers (248 nm) are the main light source used in mass production, and ArF excimer lasers (193 nm) are now also starting to be introduced in mass production.

Resists for use with light sources such as KrF excimer lasers and ArF excimer lasers require a high resolution capable of reproducing patterns of minute dimensions, and a high level of sensitivity relative to light sources with this type of short wavelength. One example of a known resist that satisfies these conditions is a chemically amplified positive resist composition which includes a base resin that exhibits increased alkali solubility under the action of acid, and an acid generator (hereafter referred to as a PAG) that generates acid on exposure.

In the reaction mechanism of a chemically amplified positive resist, exposure causes the PAG within the resist to generate an acid, and this acid causes a change in the solubility of the base resin. For example, if dissolution-inhibiting groups that eliminate in the presence of acid are introduced into the base resin of the chemically amplified positive resist, then these dissolution-inhibiting groups will eliminate only within the exposed portions of the resist, causing a significant increase in the solubility of the resist in the developing solution within these exposed portions. Typically, by conducting a heat treatment following exposure (post exposure baking, hereafter abbreviated as PEB), the dissociation of the dissolution-inhibiting groups and the elimination of the acid within the resist is accelerated, enabling a much higher sensitivity to be achieved than that attainable with conventional non-chemically amplified resists.

Moreover recently, the design rules prescribed for semiconductor element production have become even more stringent, and for example, resist materials with resolution levels capable of forming a resist pattern of 130 nm or less using an ArF excimer laser (193 nm) are now being demanded. In order to meet these demands for miniaturization, the development of resist materials capable of forming very fine resist patterns using an ArF excimer laser is being vigorously pursued.

Until recently, polyhydroxystyrenes or derivatives thereof in which the hydroxyl groups are protected with acid-dissociable, dissolution-inhibiting groups (hereafter also referred to as hydroxystyrene-based resins), which exhibit high transparency relative to a KrF excimer laser (248 nm), have been used as the base resin component of chemically amplified resists.

However, resins such as hydroxystyrene-based resins that contain benzene rings have insufficient transparency in the vicinity of 193 nm. As a result, chemically amplified resists that use these resins as a base resin suffer from lower levels of resolution.

Accordingly, resist compositions that employ a resin that contains, within the principal chain, structural units derived from a (meth)acrylate ester containing a polycyclic hydrocarbon group such as an adamantane skeleton at the ester portion (for example, see patent references 1 through 8) as the base resin have been proposed as resist materials that contain no benzene rings, exhibit excellent transparency in the vicinity of 193 nm, and also exhibit superior dry etching resistance.

However, the polymer that functions as the base resin component within these types of chemically amplified photoresist compositions is obtained by radical polymerization of a plurality of (meth)acrylate ester monomers. Unfortunately, the molecular weight distribution of a polymer obtained by such radical polymerization exceeds 1.5, which can cause problems such as an inability to adequately control the molecular weight and a low yield.

On the other hand, Japanese Unexamined Patent Application, First Publication No. 2003-84436 (patent reference 9) has proposed a resist that uses a polymer for which the molecular weight distribution is 1.5.

(Patent Reference 1)
Japanese Patent (Granted) Publication No. 2,881,969
(Patent Reference 2)
Japanese Unexamined Patent Application, First Publication No. Hei 5-346668
(Patent Reference 3)
Japanese Unexamined Patent Application, First Publication No. Hei 7-234511
(Patent Reference 4)
Japanese Unexamined Patent Application, First Publication No. Hei 9-73173
(Patent Reference 5)
Japanese Unexamined Patent Application, First Publication No. Hei 9-90637
(Patent Reference 6)
Japanese Unexamined Patent Application, First Publication No. Hei 10-161313
(Patent Reference 7)
Japanese Unexamined Patent Application, First Publication No. Hei 10-319595
(Patent Reference 8)
Japanese Unexamined Patent Application, First Publication No. Hei 11-12326
(Patent Reference 9)
Japanese Unexamined Patent Application, First Publication No. 2003-84436

DISCLOSURE OF INVENTION

However, even with the technology disclosed in the patent reference 9, the collapse margin and PEB margin remain inadequate for the very fine patterns now being demanded.

The collapse margin describes the resistance of a resist pattern to collapse when a fine resist pattern is resolved at a certain pitch (the sum of the resist pattern size and the space size). The PEB margin describes a property wherein the targeted resist pattern size is able to formed with good stability independently of any variations in temperature during the PEB treatment conducted during formation of the resist pattern.

Furthermore, in terms of improving throughput, the resist composition also requires a high level of sensitivity.

However, conventional resist compositions have been unable to adequately resolve these problems, and further improvements are desirable.

The present invention has been developed with a view to resolving the problems described above, and has an object of providing a chemically amplified positive resist composition that exhibits high levels of sensitivity and resolution, and an excellent collapse margin and PEB margin, as well as a process for forming a resist pattern that uses this composition.

In order to achieve the object described above, the present invention adopts the aspects described below.

A first aspect of the present invention is a positive resist composition that includes a resin component (A) that exhibits increased alkali solubility under the action of acid, and an acid generator component (B) that generates acid on irradiation, wherein the component (A) is a copolymer that includes a structural unit (a1) derived from a mono($\alpha$-lower alkyl)acrylate that contains an acid-dissociable, dissolution-inhibiting group, a structural unit (b1) derived from a mono($\alpha$-lower alkyl)acrylate that contains a lactone ring, and a structural unit (c1) derived from a poly($\alpha$-lower alkyl)acrylate represented by a general formula (1) shown below.

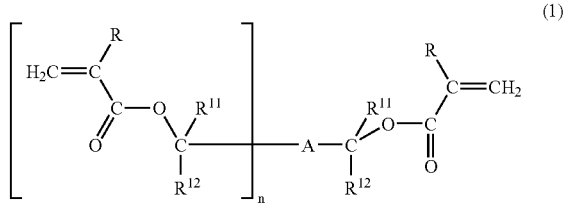

(wherein, R represents a lower alkyl group or a hydrogen atom, $R^{11}$ and $R^{12}$ each represent, independently, a lower alkyl group, n represents an integer from 1 to 5, and A represents a bivalent to hexavalent organic group)

Furthermore, a second aspect of the present invention is a process for forming a resist pattern that includes the steps of applying a positive resist composition according to the above first aspect to a support, conducting a prebake, performing selective exposure, conducting PEB (post exposure baking), and performing alkali developing to form the resist pattern.

In order to achieve the object described above, the present invention also adopts the aspects described below.

A third aspect of the present invention is a positive resist composition that includes a resin component (A) that exhibits increased alkali solubility under the action of acid, and an acid generator component (B) that generates acid on irradiation, wherein the component (A) is a star polymer that includes a core that contains acid-dissociable, dissolution-inhibiting groups, and arms that are bonded to the core.

Furthermore, a fourth aspect of the present invention is a process for forming a resist pattern that includes the steps of applying a positive resist composition according to the above third aspect to a support, conducting a prebake, performing selective exposure, conducting PEB (post exposure baking), and performing alkali developing to form the resist pattern.

In this description, the term "($\alpha$-lower alkyl)acrylate" is a generic term that includes $\alpha$-lower alkyl acrylates such as methacrylate, and/or acrylate. The term "$\alpha$-lower alkyl acrylate" refers to a structure in which the hydrogen atom bonded to the $\alpha$-carbon atom of an acrylate has been substituted with a lower alkyl group.

Furthermore, the term "structural unit" refers to a monomer unit that contributes to the formation of a polymer.

Furthermore, the term "structural unit derived from an ($\alpha$-lower alkyl)acrylate" refers to a structural unit that is formed by the cleavage of the ethylenic double bond of the ($\alpha$-lower alkyl)acrylate.

In the claims and the description of the present invention, unless stated otherwise, the "lower alkyl group" within an "($\alpha$-lower alkyl)acrylic acid" or an "($\alpha$-lower alkyl)acrylate" is preferably a straight-chain or branched alkyl group of 1 to 5 carbon atoms, and suitable examples include a methyl group, ethyl group, propyl group, isopropyl group, n-butyl group, isobutyl group, tert-butyl group, pentyl group, isopentyl group or neopentyl group, although of these, a methyl group is preferred industrially.

According to a positive resist composition of the present invention and a process for forming a resist pattern that uses such a composition, a resist pattern can be formed that exhibits high levels of sensitivity and resolution, and an excellent collapse margin and PEB margin.

BEST MODE FOR CARRYING OUT THE INVENTION

As follows is a more detailed description of the present invention.

Positive Resist Composition of a First Embodiment

A positive resist composition of a first embodiment of the present invention includes a resin component (A) that exhibits increased alkali solubility under the action of acid, and an acid generator component (B) that generates acid on irradiation, wherein as described above in the first aspect, a specific component (A) is used.

The above component (A) is a resin component that contains acid-dissociable, dissolution-inhibiting groups, and these acid-dissociable, dissolution-inhibiting groups dissociate under the action of acid generated by the component (B), causing an increase in the alkali solubility of the component (A).

More specifically, when the acid generated from the component (B) by exposure acts upon the component (A), the acid-dissociable, dissolution-inhibiting groups within the component (A) dissociate, causing the entire positive resist to change from an alkali-insoluble state to an alkali-soluble state. As a result, when the positive resist is exposed through a mask pattern during the formation of a resist pattern, or alternatively, is exposed and then subjected to PEB, the exposed portions of the resist shift to an alkali-soluble state, whereas the unexposed portions remain insoluble in alkali, meaning that alkali developing can then be used to form a positive resist pattern.

Component (A)

In the first aspect, the component (A) is a copolymer that includes at least the three structural units described below.

(a1): a structural unit derived from a mono(α-lower alkyl) acrylate that contains an acid-dissociable, dissolution-inhibiting group.

(b1): a structural unit derived from a mono(α-lower alkyl) acrylate that contains a lactone ring.

(c1): a structural unit derived from a poly(α-lower alkyl) acrylate represented by a general formula (1) shown below.

In this description, the term "mono" within the expression "mono(α-lower alkyl)acrylate" describes a compound that contains a single (α-lower alkyl)acrylate residue.

As is evident from the general formula (1), the term "poly" within the expression "poly(α-lower alkyl)acrylate" describes a compound that contains two or more (α-lower alkyl)acrylate residues. In the component (A), both the structural units derived from mono(α-lower alkyl)acrylates and the structural unit derived from the poly(α-lower alkyl)acrylate bond to the adjacent structural unit via a cleavage of the ethylenic double bond, thereby generating a polymer.

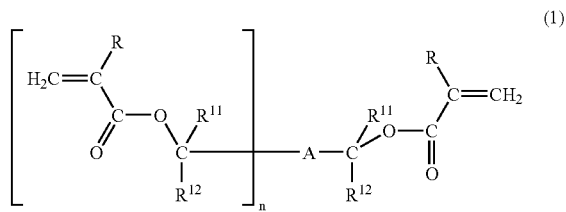

(1)

(wherein, R represents a lower alkyl group or a hydrogen atom, $R^{11}$ and $R^{12}$ each represent, independently, a lower alkyl group, n represents an integer from 1 to 5, and A represents a bivalent to hexavalent organic group)

Structural Unit (a1)

The structural unit (a1) is a structural unit derived from a mono(α-lower alkyl)acrylate that contains an acid-dissociable, dissolution-inhibiting group.

There are no particular restrictions on the acid-dissociable, dissolution-inhibiting group, and conventional groups may be used.

The structural unit (a1) may be either a structural unit derived from a mono(α-lower alkyl)acrylate that contains a monocyclic or polycyclic group-containing acid-dissociable, dissolution-inhibiting group, or a structural unit derived from a mono(α-lower alkyl)acrylate that contains a chain-like acid-dissociable, dissolution-inhibiting group.

Generally, acid-dissociable, dissolution-inhibiting groups that form a chain-like or cyclic tertiary alkyl ester with the side chain carboxyl group of the (α-lower alkyl)acrylic acid residue are the most widely known, although acid-dissociable, dissolution-inhibiting groups that include a chain-like hydrocarbon group, or a monocyclic or polycyclic alicyclic hydrocarbon group are preferred, and those that include a polycyclic alicyclic hydrocarbon group are particularly desirable. The hydrocarbon group is preferably saturated.

Examples of monocyclic alicyclic hydrocarbon groups include groups in which one hydrogen atom has been removed from a cycloalkane or the like. Specific examples include groups in which one hydrogen atom has been removed from cyclohexane or cyclopentane or the like.

Examples of polycyclic alicyclic hydrocarbon groups include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. Of these possibilities, an adamantyl group, norbornyl group, or tetracyclododecanyl group is preferred industrially.

In the present invention, the structural unit (a1) preferably includes two or more different units. Including these different units simultaneously enables the polydispersity to be more readily controlled to a value of 1.5 or lower, and is particularly favorable in terms of the synthesis of the star polymer described below.

In the present invention, the two or more structural units of different structure included within the structural unit (a1) are referred to as the structural unit (a1-1) and the structural unit (a1-2) respectively.

In the present invention, the structural unit (a1-1) is preferably a structural unit derived from a mono(α-lower alkyl) acrylate that contains a monocyclic or polycyclic group-containing acid-dissociable, dissolution-inhibiting group, whereas the structural unit (a1-2) is preferably a structural unit derived from a mono(α-lower alkyl)acrylate that contains a chain-like acid-dissociable, dissolution-inhibiting group.

Examples of the mono(α-lower alkyl)acrylate (monomer) containing an acid-dissociable, dissolution-inhibiting group that gives rise to the structural unit (a1) include the compounds listed below.

Namely, mono(α-lower alkyl)acrylates (monomers) that give rise to the structural unit (a1-2) include mono(α-lower alkyl)acrylates that contain a chain-like acid-dissociable, dissolution-inhibiting group, such as tert-butyl(meth)acrylate, tert-amyl(meth)acrylate, tert-butyloxycarbonylmethyl (meth)acrylate, tert-amyloxycarbonylmethyl(meth)acrylate, tert-butyloxycarbonylethyl(meth)acrylate and tert-amyloxycarbonylethyl(meth)acrylate. Of these, tert-butyl(meth)acrylate is particularly preferred.

Furthermore, mono(α-lower alkyl)acrylates (monomers) that give rise to the structural unit (a1-1) include 1-methylcyclopentyl(meth)acrylate, 1-ethylcyclopentyl(meth)acrylate, and (α-lower alkyl)acrylates (monomers) that contain a monocyclic or polycyclic group-containing acid-dissociable, dissolution-inhibiting group, such as the compounds represented by the chemical formulas (3), chemical formulas (4), and chemical formulas (5) shown below.

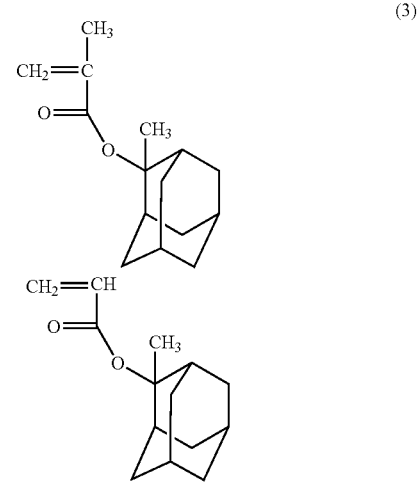

(3)

-continued
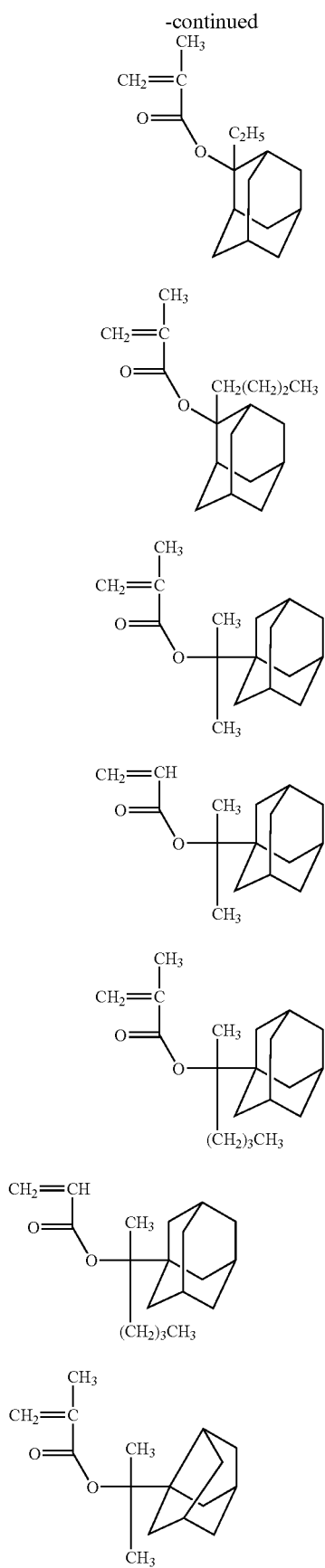
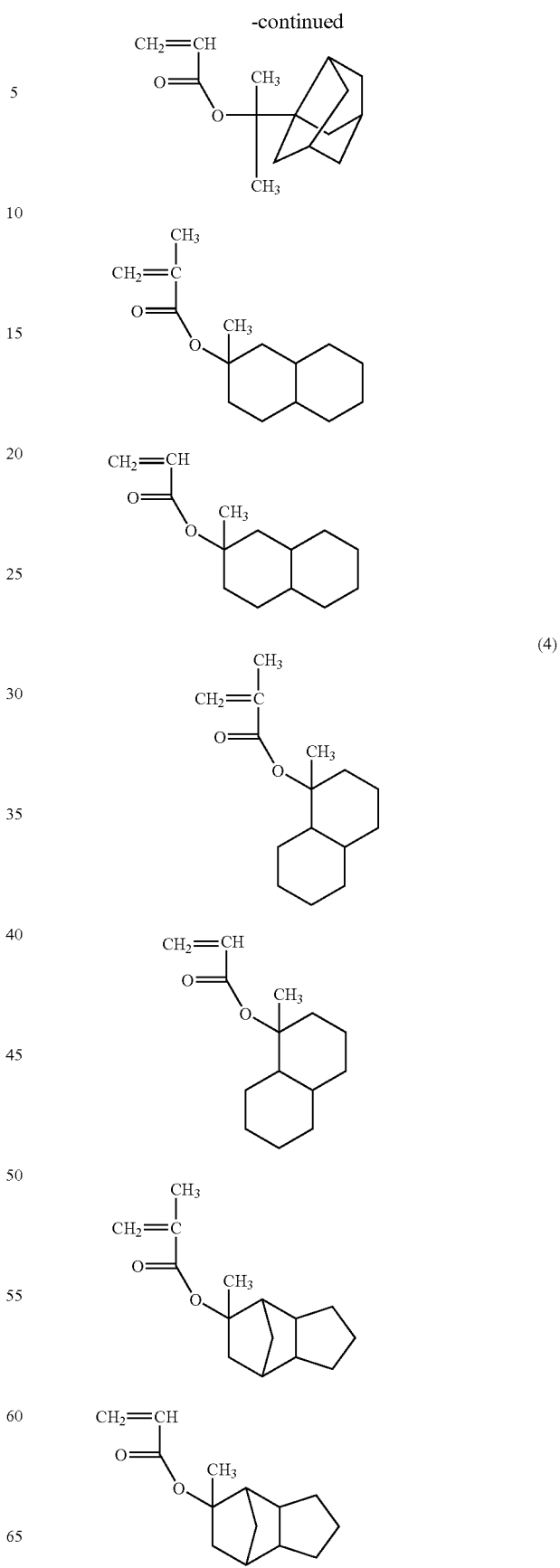
(4)

-continued
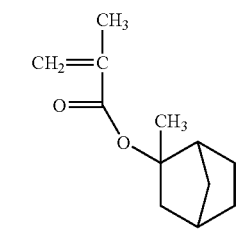
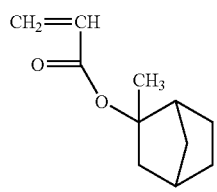
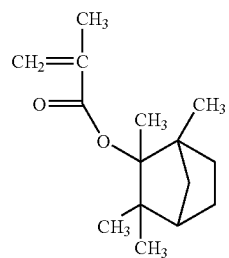
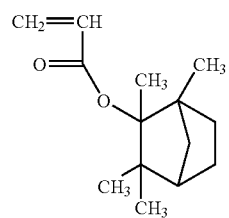
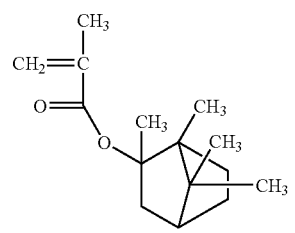
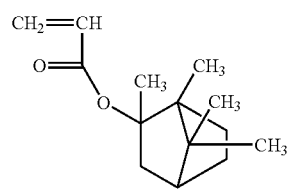
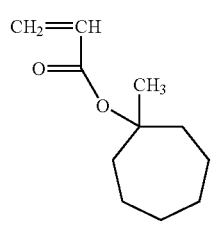
-continued
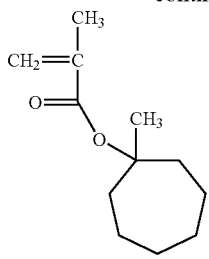
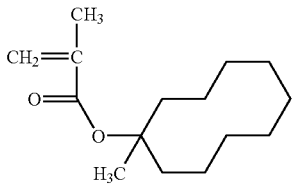
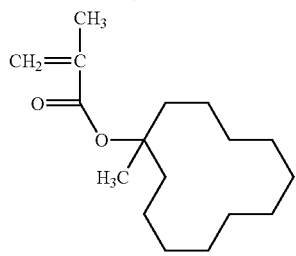
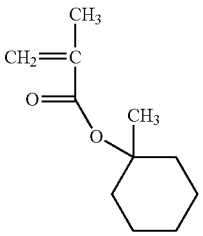
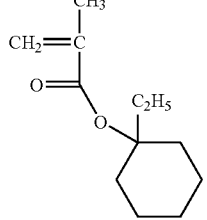
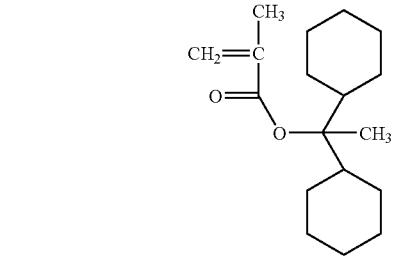
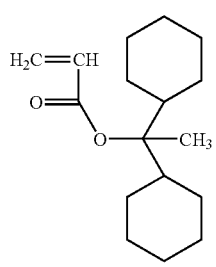
(5)

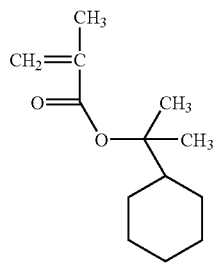
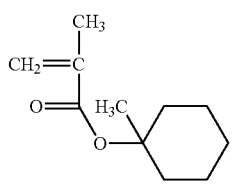
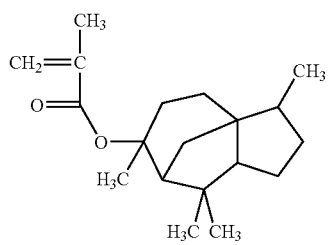
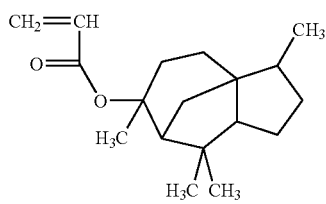
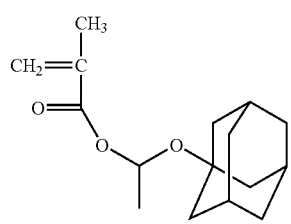
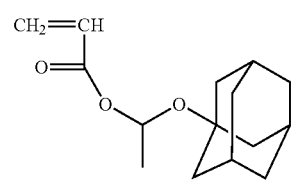
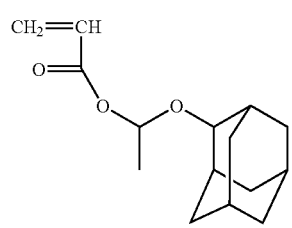
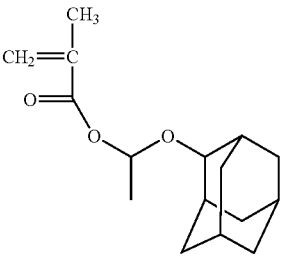
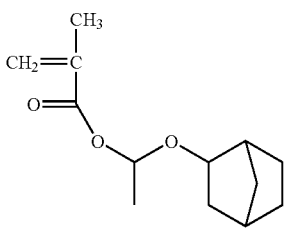
Of these (a1-1) units, units represented by the formulas (I), (II), and (III) shown below are preferred.
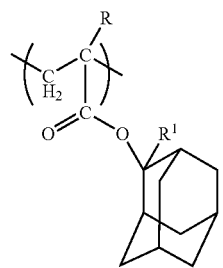
(I)
(wherein, R represents a hydrogen atom or a lower alkyl group, and $R^1$ represents a lower alkyl group)
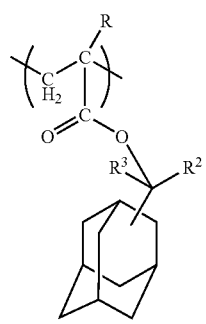
(II)
(wherein, R represents a hydrogen atom or a lower alkyl group, and $R^2$ and $R^3$ each represent, independently, a lower alkyl group)

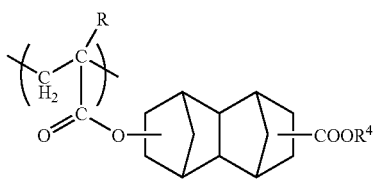

(wherein, R represents a hydrogen atom or a lower alkyl group, and $R^4$ represents a tertiary alkyl group)

In the above formulas, the α-lower alkyl group represented by R is preferably a straight-chain or branched alkyl group of 1 to 5 carbon atoms, and suitable examples include a methyl group, ethyl group, propyl group, isopropyl group, n-butyl group, isobutyl group, tert-butyl group, pentyl group, isopentyl group or neopentyl group. A methyl group is preferred industrially.

The group $R^1$ is preferably a straight-chain or branched lower alkyl group of 1 to 5 carbon atoms, and suitable examples include a methyl group, ethyl group, propyl group, isopropyl group, n-butyl group, isobutyl group, pentyl group, isopentyl group or neopentyl group. Of these groups, a methyl group or ethyl group is preferred in terms of industrial availability.

The groups $R^2$ and $R^3$ each preferably represent, independently, a straight-chain or branched lower alkyl group of 1 to 5 carbon atoms. Of the various possibilities, the case in which $R^2$ and $R^3$ are both methyl groups is preferred from an industrial viewpoint, and specific examples include structural units derived from 2-(1-adamantyl)-2-propyl (α-lower alkyl)acrylate.

The group $R^4$ represents a tertiary alkyl group such as a tert-butyl group or tert-amyl group, although the case in which $R^4$ is tert-butyl group is preferred industrially.

Furthermore, the group —$COOR^4$ may be bonded to either position 3 or 4 of the tetracyclododecanyl group shown in the formula, although the bonding position cannot be further specified. Furthermore, the carboxyl group residue of the (α-lower alkyl)acrylate structural unit may be bonded to either position 8 or 9 of the tetracyclododecanyl group, although similarly, the bonding position cannot be further specified.

The structural unit (a1) preferably accounts for 20 to 70 mol %, and even more preferably from 30 to 60 mol %, of the combined total of all the structural units that constitute the component (A). Ensuring that this proportion is at least as large as the lower limit of the above range enables a more favorable fine pattern to be obtained, whereas ensuring that the proportion is no greater than the upper limit enables a more favorable balance to be achieved with the other structural units.

Furthermore, examples of preferred units for the structural unit (a1-1) include structural units represented by the aforementioned general formula (I), whereas examples of preferred units for the structural unit (a1-2) include structural units derived from aliphatic tertiary alkyl(meth)acrylates.

Furthermore, using structural units represented by the aforementioned general formula (II) is ideal for those cases where the substrate includes a nitrogen-containing layer.

When a substrate that includes a nitrogen-containing layer is used, the resist pattern that contacts the nitrogen-containing layer is prone to a tailing phenomenon, which tends to cause a deterioration in the lithography characteristics such as the resolution. However, by using a structural unit represented by the above general formula (II), the effects of the present invention (improvements in the levels of sensitivity and resolution, and in the collapse margin and PEB margin) can be realized, while phenomena that are peculiar to substrates that employ a nitrogen-containing layer, such as the tailing phenomenon, can be suppressed.

A nitrogen-containing layer typically refers to a layer such as an insulating layer or metal layer or the like, which contains nitrogen, and is provided on top of the substrate in accordance with the intended use of the substrate. Examples of this type of insulating layer include silicon nitride (SiN), trisilicon tetranitride ($Si_3N_4$), and silicon oxynitride (SiON). Examples of the above type of metal layer include titanium nitride (TiN).

The nitrogen-containing layer is typically formed on top of a silicon substrate or the like, using a method such as vapor deposition.

Substrates that include this type of nitrogen-containing layer are typically referred to as "nitrogen-containing substrates".

Furthermore, using a structural unit represented by the above general formula (II) also provides a favorable reduction in LWR. This reduction in LWR is particularly favorable when a pattern is formed on a substrate that include a nitrogen-containing layer.

"LWR" is an abbreviation for "Line Width Roughness", which describes the phenomenon where the line width of a line pattern is irregular.

The relative proportions of the structural unit (a1-1) and the structural unit (a1-2) within all the structural units (a1) of the component (A) are typically within a range from 50 to 99.9 mol %, and preferably from 70 to 90 mol % for the former, and within a range from 0.1 to 50 mol %, and preferably from 10 to 30 mol % for the latter, as these proportions result in a more favorable improvement in the collapse margin and PEB margin. Furthermore, in the case of a star polymer, these proportions yield a favorable improvement in the solubility of the component within the resist solvent.

Structural Unit (b1)

The structural unit (b1) is a structural unit derived from a mono(α-lower alkyl)acrylate that contains a lactone ring, and examples include structural units in which a monocyclic group formed from a lactone ring or a polycyclic alicyclic group that includes a lactone ring is bonded to the ester side-chain portion of an (α-lower alkyl)acrylate.

The term "lactone ring" refers to a single ring containing a —O—C(O)— structure, and this ring is counted as the first ring. Accordingly, in this description, the case in which the only ring structure is the lactone ring is referred to as a monocyclic group, and groups containing other ring structures are described as polycyclic groups regardless of the structure of the other rings.

Specific examples of the structural unit (b1) include monocyclic groups in which one hydrogen atom has been removed from γ-butyrolactone, and polycyclic groups in which one hydrogen atom has been removed from a lactone ring-containing polycycloalkane.

Examples of the mono(α-lower alkyl)acrylates (monomers) that give rise to these types of structural unit (b1) include compounds represented by the chemical formulas (9), chemical formulas (10), chemical formulas (11), and chemical formulas (12) shown below.

(9)
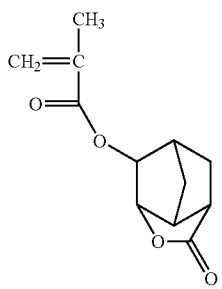
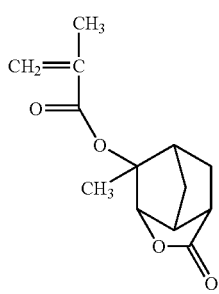
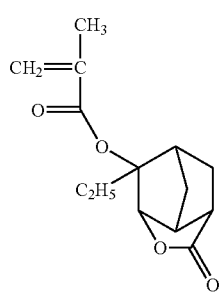
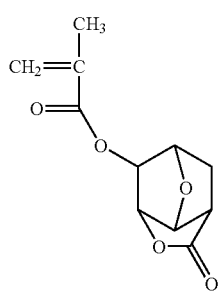
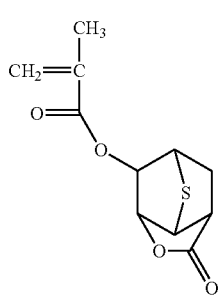
-continued
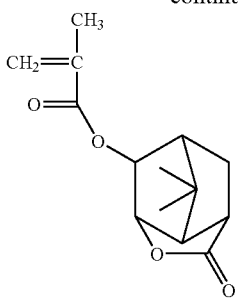
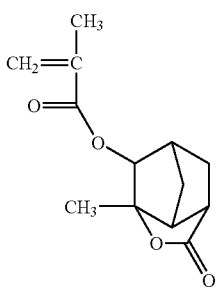
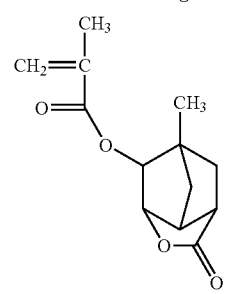
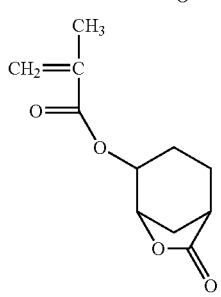
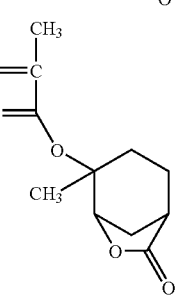
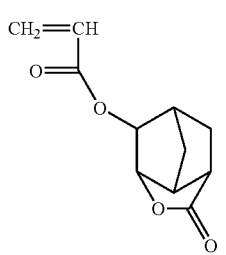

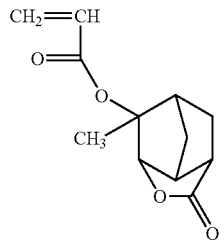
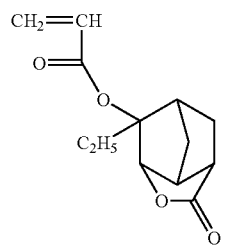
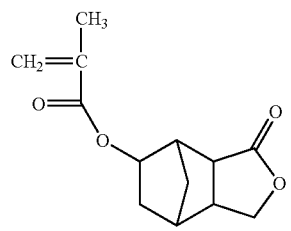
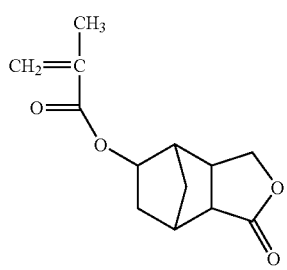
(10)
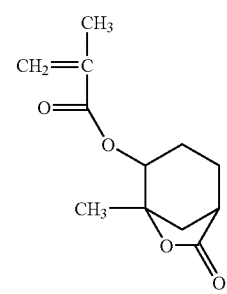
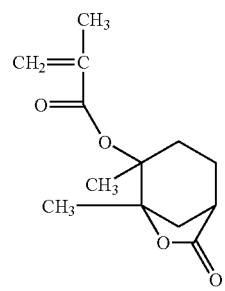
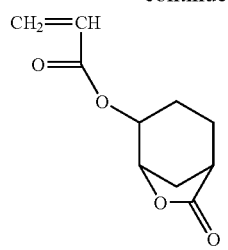
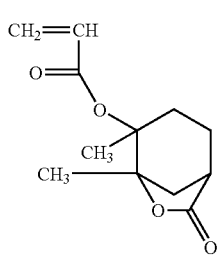
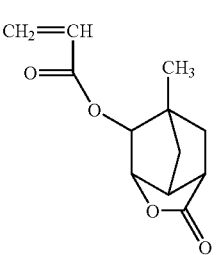
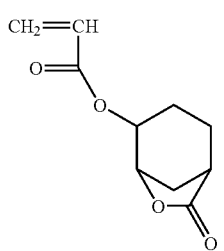
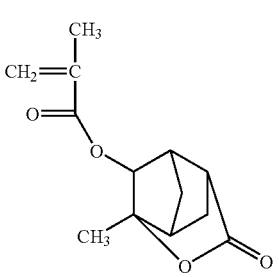
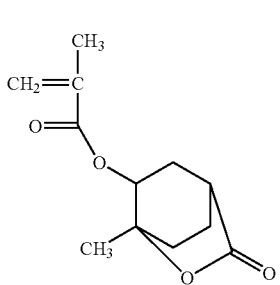

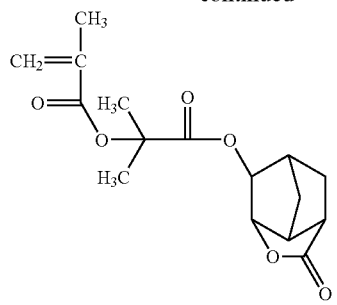
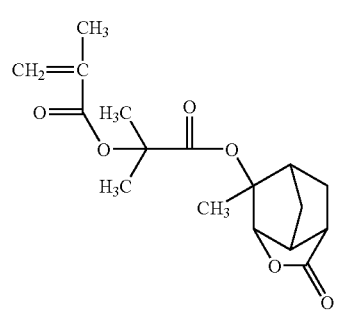
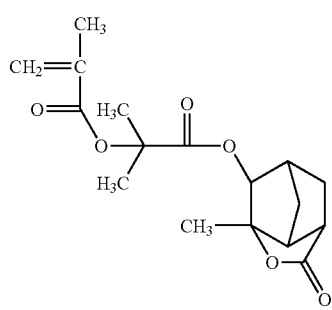
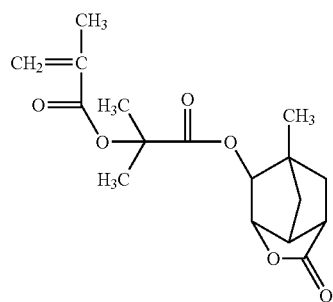
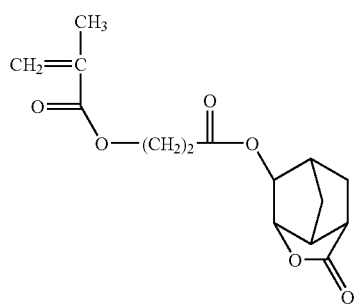
(11)
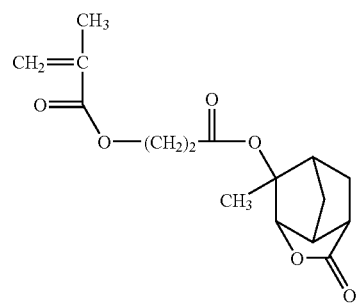
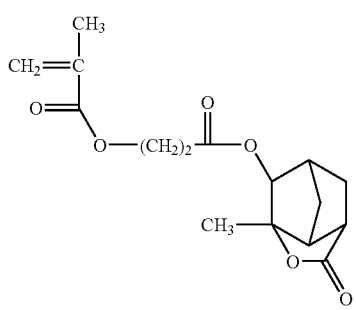
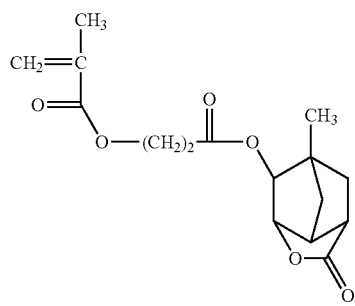
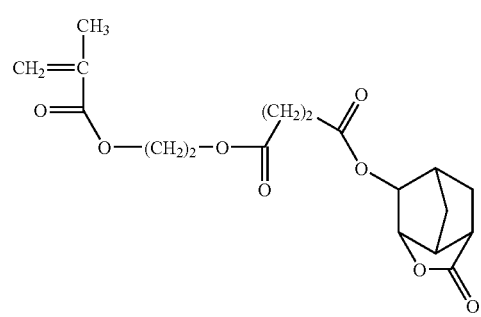
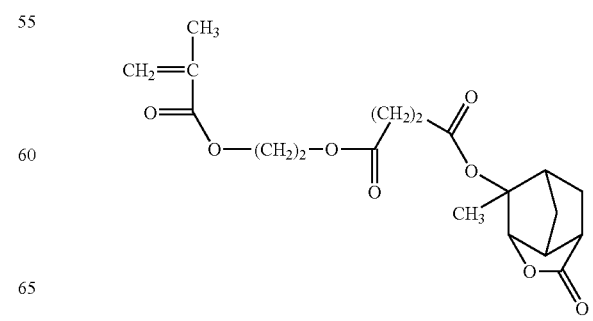

-continued
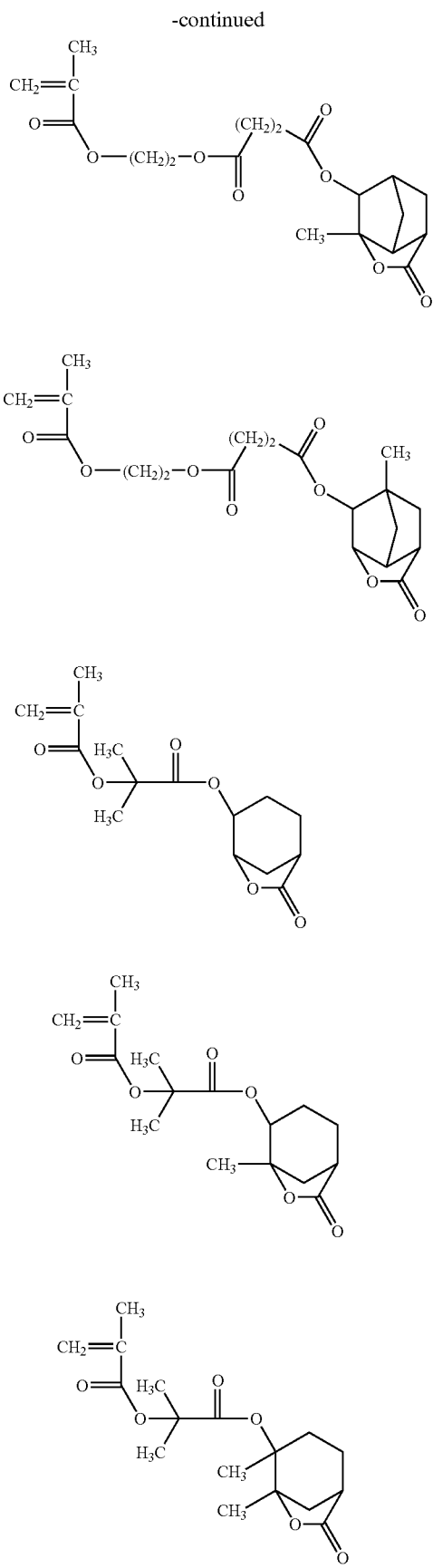
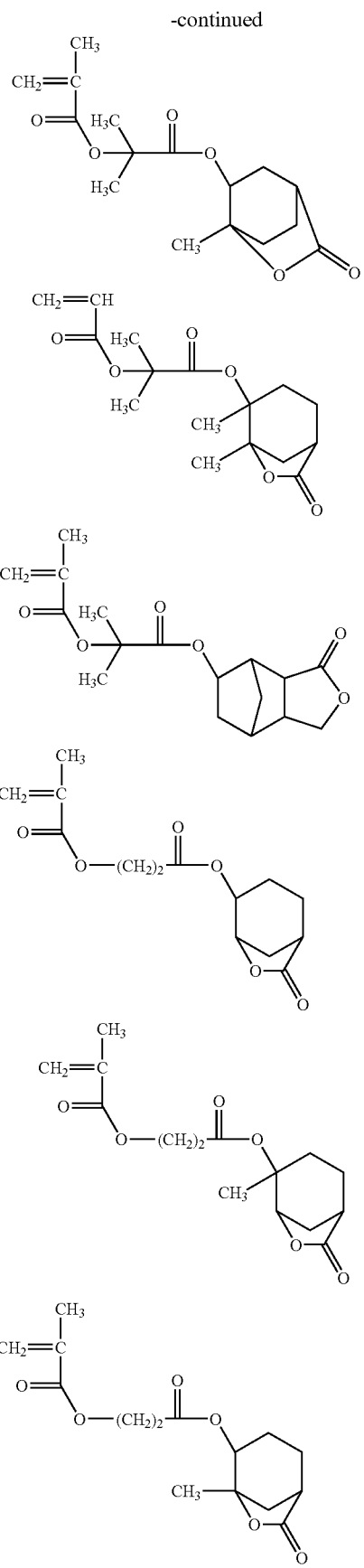

-continued

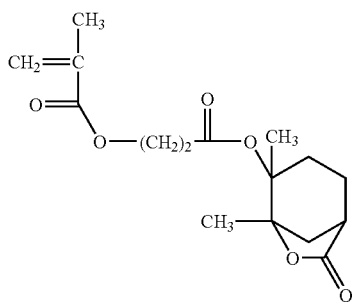

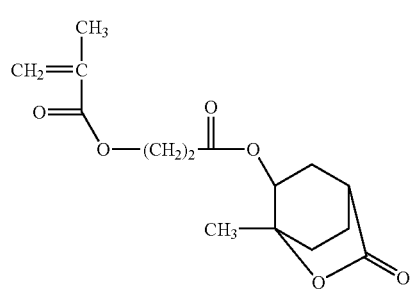

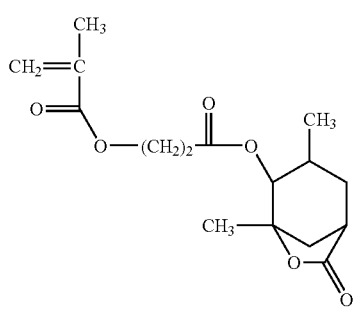

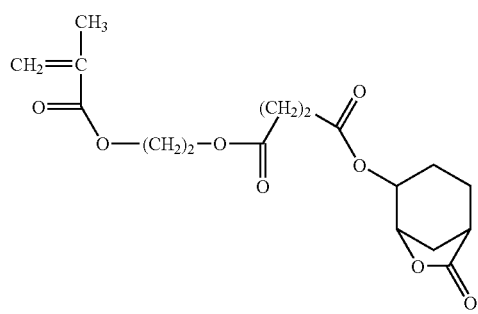

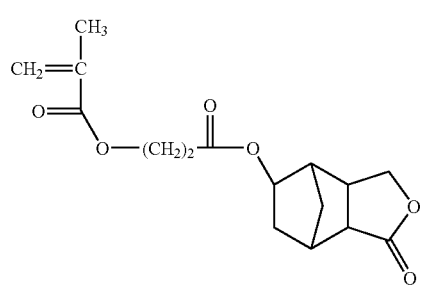

Of these possibilities, structural units represented by the structural formulas (IV) and (V) shown below are preferred.

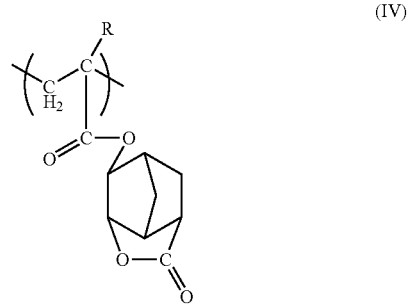

(IV)

(wherein, R represents a hydrogen atom or a lower alkyl group, and preferably a methyl group)

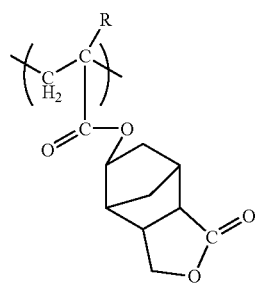

(V)

(wherein, R represents a hydrogen atom or a lower alkyl group, and preferably a methyl group)

The structural unit (b1) preferably accounts for 20 to 60 mol %, and even more preferably from 20 to 50 mol %, of the combined total of all the structural units that constitute the component (A). Ensuring that this proportion is at least as large as the lower limit of the above range improves the lithography characteristics such as the resistance to pattern collapse of very fine resist patterns, whereas ensuring that the proportion is no greater than the upper limit enables a more favorable balance to be achieved with the other structural units.

Structural Unit (c1)

The structural unit (c1) is a structural unit derived from a poly($\alpha$-lower alkyl)acrylate represented by a general formula (1) shown below. Because the carbon atoms to which the groups $R^{11}$ and $R^{12}$ are bonded become tertiary alkyl groups, this structural unit also functions as an acid-dissociable group.

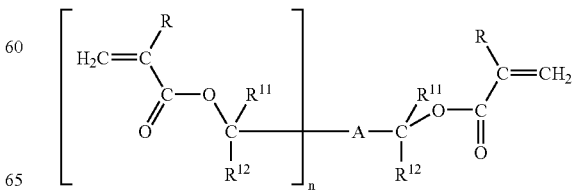

(1)

(wherein, R represents a lower alkyl group or a hydrogen atom, $R^{11}$ and $R^{12}$ each represent, independently, a lower alkyl group, n represents an integer from 1 to 5, and A represents a bivalent to hexavalent organic group)

The group R represents a hydrogen atom or a lower alkyl group. The groups $R^{11}$ and $R^{12}$ each represent, independently, a lower alkyl group. The group A represents a bivalent to hexavalent organic group.

In other words, when the group A is bivalent, n is 1, and the structural unit adopts a structure in which two (α-lower alkyl) acrylate residues are bonded to A. When the group A is trivalent, n is 2, and the structural unit adopts a structure in which three (α-lower alkyl)acrylate residues are bonded to A. In this manner, as the valency of the group A increases, the number of group residues bonded to A also increases, forming a structure with a more dense radial structure.

Specific examples of suitable lower alkyl groups for the groups R, $R^{11}$, and $R^{12}$ include lower alkyl groups such as a methyl group, ethyl group, n-propyl group, isopropyl group, n-butyl group, or t-butyl group, and of these, a methyl group is preferred.

Furthermore, examples of suitable organic groups for the group A include saturated or unsaturated aromatic or aliphatic hydrocarbon groups (which may include an oxygen atom in the form of an ether group, polyether group, or ester group) such as alkylene groups and arylene groups, and saturated or unsaturated aromatic or aliphatic hydrocarbon groups which may include other atoms such as nitrogen or the like.

Specific examples of suitable groups include the structures shown in the formulas below. In those cases where the component (A) includes two or more different partial structures represented by the formula (1), these structures may be either the same or different.

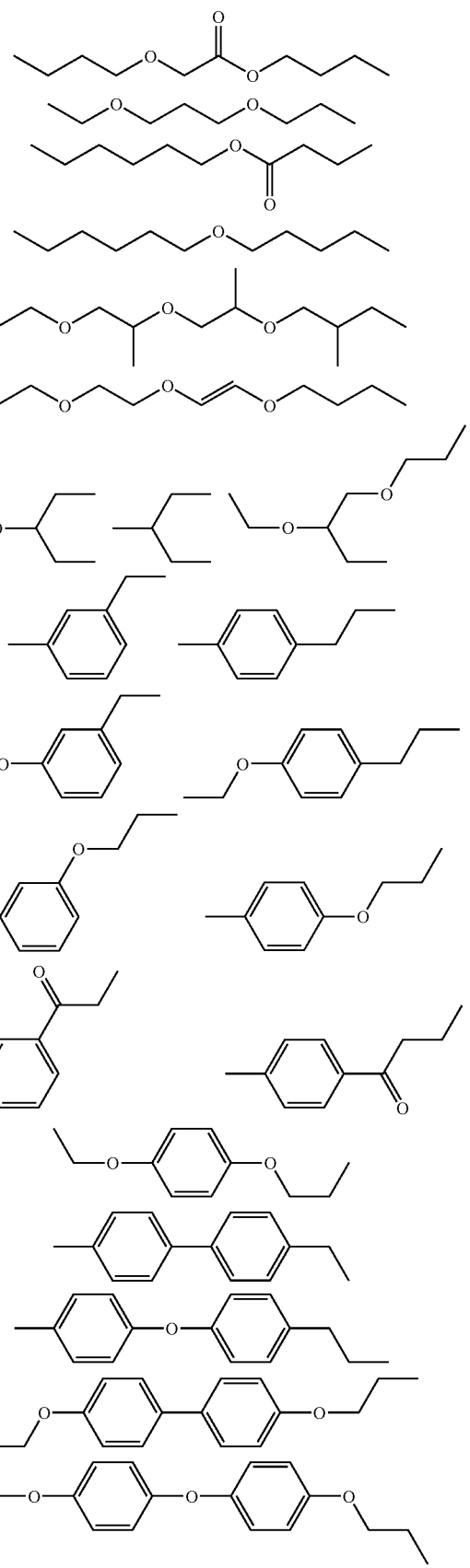

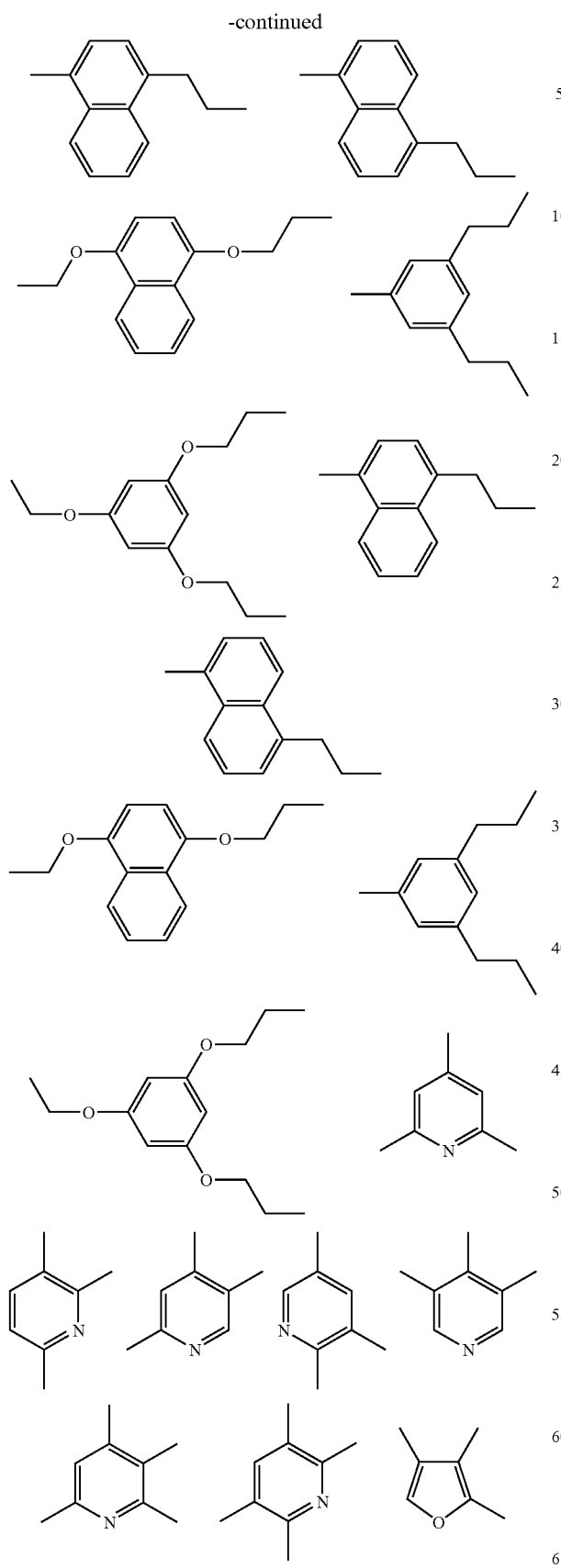
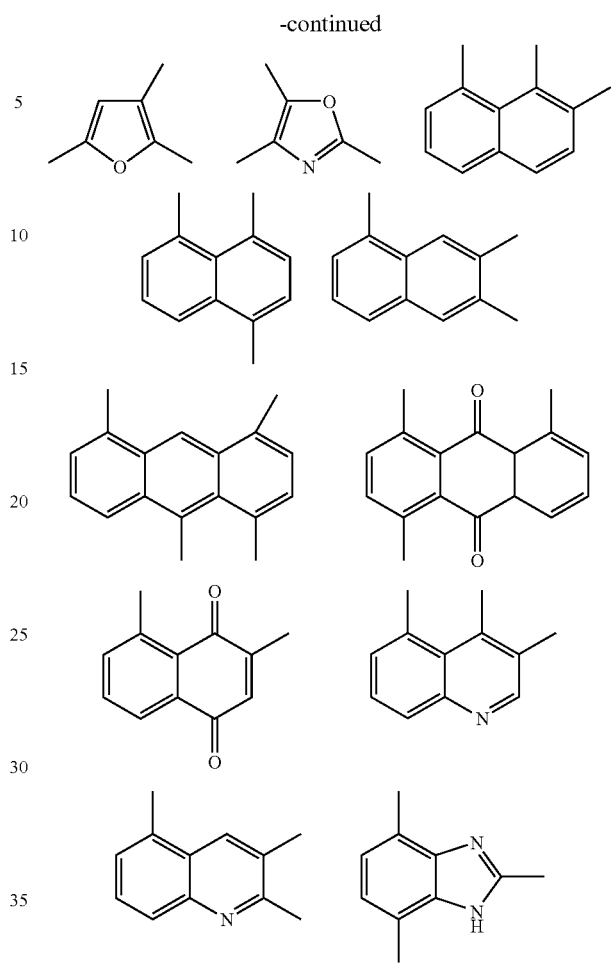

For the group A, of the organic groups shown above, alkylene groups of 2 to 5 carbon atoms, phenylene groups, and polyether groups of 3 to 6 carbon atoms are particularly preferred.

Compounds in which the group A is either bivalent or trivalent are preferred as the compound (monomer) that gives rise to the structural unit (c1), and the compounds shown below represent specific examples of preferred compounds.

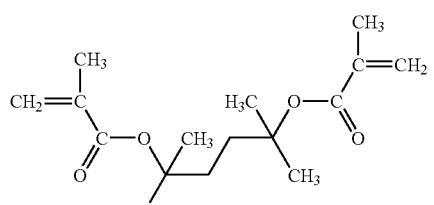
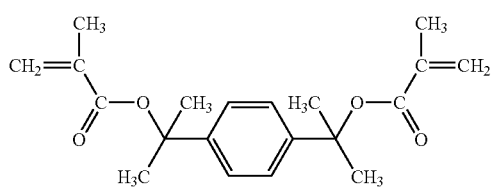

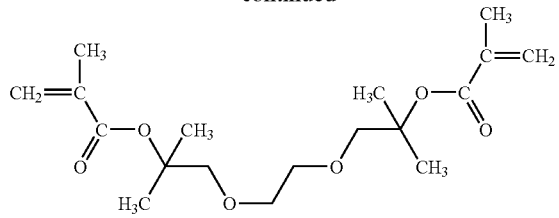

The structural unit (c1) preferably accounts for 1 to 30 mol %, and even more preferably from 5 to 20 mol %, of the combined total of all the structural units that constitute the component (A). Ensuring that this proportion is at least as large as the lower limit of the above range improves the lithography characteristics such as the resistance to pattern collapse of very fine resist patterns and the PEB margin, whereas ensuring that the proportion is no greater than the upper limit enables a more favorable balance to be achieved with the other structural units.

Other Structural Units

The component (A) may include structural units other than the aforementioned structural units (a1), (b1), and (c1), although the combined total of these three structural units, relative to the combined total of all the structural units, is typically at least 70 mol %, preferably 80 mol % or greater, and is most preferably 100 mol %.

Examples of other structural units (d1) besides the structural units (a1), (b1), and (c1) include units derived from the types of (meth)acrylate esters listed below.

In other words, examples of the monomers that give rise to the structural unit (d1) include acrylate esters such as methyl acrylate, ethyl acrylate, propyl acrylate, amyl acrylate, cyclohexyl acrylate, ethylhexyl acrylate, octyl acrylate, t-octyl acrylate, chloroethyl acrylate, 2-ethoxyethyl acrylate, 2,2-dimethyl-3-ethoxypropyl acrylate, 5-ethoxypentyl acrylate, 1-methoxyethyl acrylate, 1-ethoxyethyl acrylate, 1-methoxypropyl acrylate, 1-methyl-1-methoxyethyl acrylate, 1-(isopropoxy)ethyl acrylate, benzyl acrylate, methoxybenzyl acrylate, furfuryl acrylate, and tetrahydrofurfuryl acrylate; methacrylate esters such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-ethoxyethyl methacrylate, 4-methoxybutyl methacrylate, 5-methoxypentyl methacrylate, 2,2-dimethyl-3-ethoxypropyl methacrylate, 1-methoxyethyl methacrylate, 1-ethoxyethyl methacrylate, 1-methoxypropyl methacrylate, 1-methyl-1-methoxyethyl methacrylate, 1-(isopropoxy)ethyl methacrylate, furfuryl methacrylate, and tetrahydrofurfuryl methacrylate;

crotonate esters such as methyl crotonate, ethyl crotonate, propyl crotonate, amyl crotonate, cyclohexyl crotonate, ethylhexyl crotonate, octyl crotonate, t-octyl crotonate, chloroethyl crotonate, 2-ethoxyethyl crotonate, 2,2-dimethyl-3-ethoxypropyl crotonate, 5-ethoxypentyl crotonate, 1-methoxyethyl crotonate, 1-ethoxyethyl crotonate, 1-methoxypropyl crotonate, 1-methyl-1-methoxyethyl crotonate, 1-(isopropoxy)ethyl crotonate, benzyl crotonate, methoxybenzyl crotonate, furfuryl crotonate, and tetrahydrofurfuryl crotonate; and itaconate esters such as dimethyl itaconate, diethyl itaconate, dipropyl itaconate, diamyl itaconate, dicyclohexyl itaconate, bis(ethylhexyl)itaconate, dioctyl itaconate, di-t-octyl itaconate, bis(chloroethyl)itaconate, bis(2-ethoxyethyl)itaconate, bis(2,2-dimethyl-3-ethoxypropyl) itaconate, bis(5-ethoxypentyl)itaconate, bis(1-methoxyethyl)itaconate, bis(1-ethoxyethyl)itaconate, bis(1-methoxypropyl)itaconate, bis(1-methyl-1-methoxyethyl) itaconate, bis(1-(isopropoxy)ethyl)itaconate, dibenzyl itaconate, bis(methoxybenzyl)itaconate, difurfuryl itaconate, and ditetrahydrofurfiryl itaconate.

The weight average molecular weight (Mw) of the copolymer (A) of the first aspect of the present invention, as measured by gel permeation chromatography, and referenced against polystyrene standards, is typically within a range from 10,000 to 50,000, preferably from 15,000 to 40,000, and even more preferably from 20,000 to 38,000.

The polydispersity, namely, the ratio (Mw/Mn) between the weight average molecular weight (Mw) and the number average molecular weight (Mn) is preferably within a range from 1.01 to 3.00, even more preferably from 1.01 to 2.00, and most preferably from 1.01 to 1.50.

In the present invention, provided the component (A) is a copolymer that includes the structural unit (a1), the structural unit (b1), and the structural unit (c1), there are no particular restrictions on the shape or form of the copolymer, although a component (A) that exists in the form of a star polymer is preferred.

A broad definition of star polymers is disclosed in L. Kilian et al., J. Polymer Science Part A, 2003, 3083. A star polymer includes a core portion, and arm portions that are bonded to the core. In other words, a star polymer includes a core and a plurality of arms (polymer chains) that extend radially outward from this core.

In those cases where the component (A) is a star polymer, the core may be either a polymer or not a polymer, but is preferably a polymer. Here, the term polymer preferably refers to a structure in which at least one of the ethylenic double bonds in the monomer represented by the above general formula (1) that gives rise to the structural unit (c1) undergoes cleavage to generate a polymer. Furthermore, the core preferably includes a structural unit that contains an acid-dissociable, dissolution-inhibiting group, and even more preferably includes the structural unit (c1).

Alternatively, the core may be formed solely from the structural unit (c1). Cores formed from the structural unit (c1) are preferred.

The structural units (a1) and (b1), and where required the structural unit (d1), are bonded to the core as arms. In these arm polymers, the structural units (a1), (b1) and (d1) may be incorporated within different arms, or within the same arm. In a preferred configuration, a plurality of arms each formed from a random polymer containing each of the structural units are bonded to the core.

Of these possibilities, arm polymers in which the structural unit (a1) forms the terminal are preferred. Such polymers yield improved contrast and a reduced level of defects, and are consequently preferred.

The number average molecular weight (Mn) of the arms, as measured by gel permeation chromatography, and referenced against polystyrene standards, is typically within a range from 1,000 to 100,000, preferably from 1,500 to 500,000, even more preferably from 2,000 to 200,000, and is most preferably from 2,500 to 100,000, and the ratio (Mw/Mn) between the weight average molecular weight (Mw) and the number average molecular weight (Mn) is preferably within a range from 1.01 to 3.00, even more preferably from 1.01 to 2.00, and most preferably from 1.01 to 1.50.

Anionic polymerization is preferably used as the method of producing the component (A). Even more preferred is a method of synthesizing a star polymer that employs living anionic polymerization.

Specific examples of suitable methods include (1) a method in which the (α-lower alkyl)acrylates or the like corresponding with the structural unit (a1) and the structural unit (b1) are subjected to anionic polymerization in the presence of an anionic polymerization initiator to synthesize the arm polymer, and this arm polymer is then reacted with a polyacrylate containing the structural unit (c1); (2) a method in which a polyacrylate containing the structural unit (c1) is reacted in the presence of an anionic polymerization initiator, thereby forming a polyfunctional core, and this polyfunctional core is then subjected to anionic polymerization with the (α-lower alkyl)acrylates or the like corresponding with the structural unit (a1) and the structural unit (b1); and (3) a method in which the (α-lower alkyl)acrylates or the like corresponding with the structural unit (a1) and the structural unit (b1) are subjected to anionic polymerization in the presence of an anionic polymerization initiator to synthesize the arm polymer, and this arm polymer is reacted with a polyfunctional coupling agent, and then with an anionic polymerizable monomer that includes a monomer that gives rise to the structural unit (c1).

The arms are formed using the structural unit (a1), the structural unit (b1), and if necessary the structural unit (d1), and random polymers of these structural units, and particularly polymers in which the structural unit (a1) forms the terminal, are preferred. Such polymers yield improved contrast and a reduced level of defects, and are consequently preferred.

Furthermore, the methods (1) and (3) described above offer more ready control of the reaction, and are consequently preferred in terms of enabling production of a star polymer with a controlled structure.

Examples of the anionic polymerization initiator used in the aforementioned anionic polymerization include alkali metals and organic alkali metal compounds. Examples of suitable alkali metals include lithium, sodium, potassium, and cesium, whereas examples of suitable organic alkali metal compounds include alkylated, allylated or arylated alkali metal compounds, and specific examples include ethyl lithium, n-butyl lithium, sec-butyl lithium, tert-butyl lithium, ethyl sodium, lithium biphenyl, lithium naphthalene, lithium triphenyl, sodium naphthalene, α-methylstyrene sodium dianion, 1,1-diphenylhexyl lithium, and 1,1-diphenyl-3-methylpentyl lithium.

In the above methods (1) and (3), the polymerization reaction for synthesizing the arm polymers may be conducted either by a method in which the anionic polymerization initiator is added dropwise to the monomer (mixture) solution, or by a method in which the monomer (mixture) liquid is added dropwise to a solution containing the anionic polymerization initiator, although from the viewpoint of enabling better control of the molecular weight and the molecular weight distribution, a method in which the monomer (mixture) liquid is added dropwise to a solution containing the anionic polymerization initiator is preferred. This arm polymer synthesis reaction is typically conducted under an atmosphere of an inert gas such as nitrogen or argon, within an organic solvent, and at a temperature within a range from −100 to 50° C., and preferably from −100 to 40° C.

Examples of suitable organic solvents for use within the above arm polymer synthesis reaction include aliphatic hydrocarbons such as n-hexane and n-heptane, cyclic hydrocarbons such as cyclohexane and cyclopentane, aromatic hydrocarbons such as benzene and toluene, ethers such as diethyl ether, tetrahydrofuran (THF), and dioxane, as well as other solvents typically used within anionic polymerizations such as anisole and hexamethylphosphoramide, and these solvents may be used either alone, or in combinations of two or more different solvents. Of the above solvents, from the viewpoints of polarity and solubility, mixed solvents of tetrahydrofuran and toluene, tetrahydrofuran and hexane, and tetrahydrofuran and methylcyclohexane are preferred.

Examples of the polymer configuration of the arm polymers include random copolymers in which each of the components is distributed statistically randomly through the copolymer chain, partial block copolymers, and complete block copolymers, and these polymer configurations can be synthesized by appropriate selection of the method used for adding the acrylates.

The reaction for generating a star polymer, in which the arm polymers formed in the manner described above function as branch polymer chains, can be conducted by first completing the synthesis reaction for the arm polymers, and then adding the aforementioned polyacrylate to the reaction solution. Typically, by conducting this polymerization reaction under an atmosphere of an inert gas such as nitrogen or argon, within an organic solvent, and at a temperature within a range from −100 to 50° C., and preferably from −70 to 40° C., the structure of the resulting polymer can be better controlled, and a polymer with a narrow molecular weight distribution can be obtained. Furthermore, this reaction for producing the star polymer may be conducted as a consecutive reaction, using the same solvent used for the formation of the arm polymers, or alternatively, further solvent may be added to alter the composition, or the solvent may be substituted with an alternative solvent. Suitable solvents include the same solvents as those described above for use within the arm polymer synthesis reaction.

In a process for producing a star polymer according to the present invention, the molar ratio between the polyacrylate (P), and the polymer chain active terminals (D) produced by anionic polymerization of the (α-lower alkyl)acrylates or the like corresponding with the structural unit (a1) and the structural unit (b1) using an anionic polymerization initiator as the polymerization initiator [namely, the ratio (P)/(D)] is preferably set within a range from 0.1 to 10. The reaction between the arm polymer chains and the polyacrylate may use either a method in which the polyacrylate is added to the arm polymer chains containing the active terminals, or a method in which the arm polymer chains containing the active terminals are added to the polyacrylate.

The number of arms within the star polymer is determined on the basis of the quantity of polyacrylate added, the reaction temperature, and the reaction time, and usually, factors such as the difference in reactivity between the living polymer terminals and the vinyl groups of the polyacrylate, and steric hindrance and the like mean that a plurality of star-shaped block copolymers with differing numbers of arms are generated simultaneously.

Furthermore, the ratio (Mw/Mn) between the weight average molecular weight (Mw) and the number average molecular weight (Mn) of the produced star polymer preferably falls within a range from 1.00 to 1.50, and the number average molecular weight is preferably within a range from 2,500 to 100,000.

In the method (3), in which a central core (a polyfunctional core) containing active terminals formed by a reaction between prepared arm polymer chains and a polyacrylate is subjected to further reaction with an anionic polymerizable monomer to form new arm portion chains, star polymers with a variety of different arm polymer chains can be produced. A polymerizable monomer may be reacted directly with the active terminals present on the central core, but by first conducting a reaction with a compound such as diphenylethylene or stilbene, or first adding a mineral acid salt of an alkali metal or an alkaline earth metal, such as lithium chloride, and then conducting the reaction with the monomer, the polymerization reaction can be caused to proceed at a slower rate in those cases where a highly reactive monomer such as an acrylic acid derivative is used, which can be effective in enabling the overall structure of the generated star polymer to be better controlled. Furthermore, the above reaction may be conducted as a consecutive reaction within the same solvent used for forming the central core containing the active terminals, or alternatively, further solvent may be added to alter the composition, or the solvent may be substituted with an alternative solvent. Suitable solvents include the same solvents as those described above for use within the arm polymer synthesis. Furthermore, the arm polymer chains newly introduced to the active terminals present on the central core in the above method (3), and the arm polymer chains within the above method (2) may be either formed as randomly copolymerized polymer chains by conducting reaction using a mixture of two monomers, or formed as block polymer chains by adding the two monomers in a sequential manner. Furthermore, following completion of the reaction, functional groups can be introduced at the terminals by adding carbon dioxide or an epoxy or the like.

(B) Compound that Generates Acid on Irradiation (Exposure)

In the present invention, the component (B) can use any of the known so-called acid generators used in conventional chemically amplified resist compositions without any particular restrictions. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes, poly(bis-sulfonyl)diazomethanes, and diazomethane nitrobenzyl sulfonates, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, and diphenylmonomethylsulfonium trifluoromethanesulfonate, heptafluoropropanesulfonate or nonafluorobutanesulfonate.

Specific examples of suitable oxime sulfonate-based acid generators include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

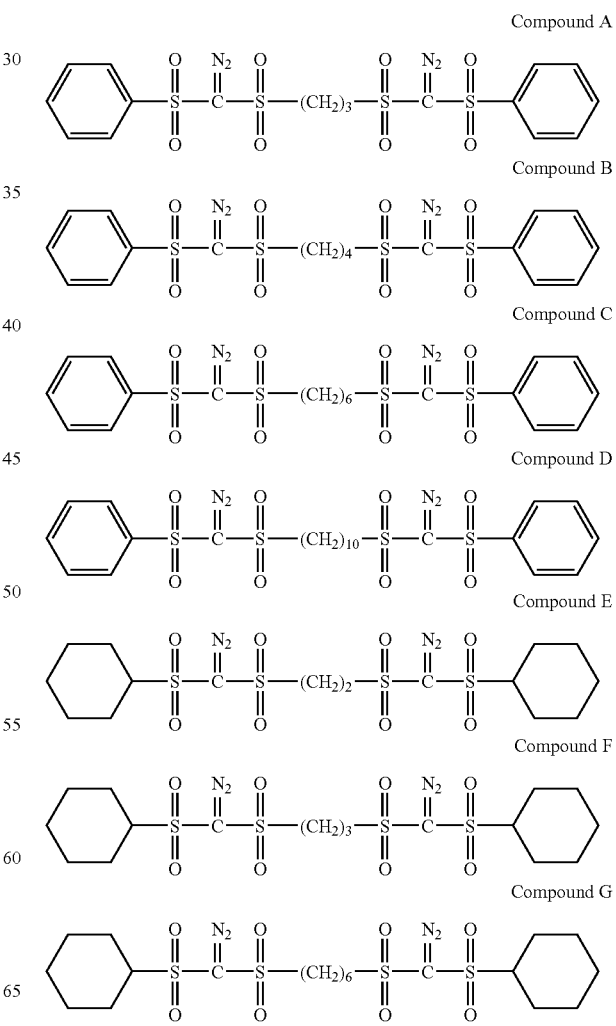

-continued

Compound H

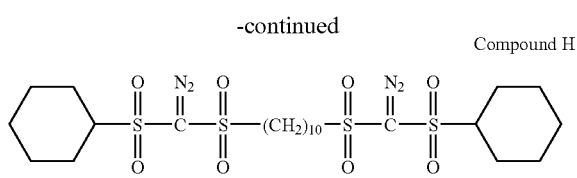

As the component (B), either a single acid generator may be used alone, or a combination of two or more different acid generators may be used.

The quantity used of the component (B) is typically within a range from 0.5 to 30 parts by weight, and preferably from 1 to 10 parts by weight, per 100 parts by weight of the component (A). By ensuring that the quantity is at least as large as the lower limit of the above range, favorable pattern formation can be achieved, whereas ensuring that the proportion is no greater than the upper limit enables a uniform solution to be obtained, and more favorable storage stability to be achieved.

(D) Nitrogen-containing Organic Compound

In a positive resist composition according to the first embodiment of the present invention, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds can be used, although an amine, and particularly a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and of these, tertiary alkanolamines such as triethanolamine are particularly preferred.

These compounds may be used either alone, or in combinations of two or more different compounds.

The component (D) is typically used in a quantity within a range from 0.01 to 5.0 parts by weight per 100 parts by weight of the component (A).

Component (E)

Furthermore, in order to prevent any deterioration in sensitivity caused by the addition of the aforementioned component (D), and improve the resist pattern shape and the post exposure stability of the latent image formed by the pattern-wise exposure of the resist layer, an organic carboxylic acid, or a phosphorus oxo acid or derivative thereof (E) may also be added as another optional component (hereafter referred to as the component (E)). The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Organic Solvent

A positive resist composition according to the first embodiment of the present invention can be produced by dissolving the materials in an organic solvent.

The organic solvent may be any solvent capable of dissolving the various components to generate a uniform solution, and one or more solvents selected from known materials used as the solvents for conventional chemically amplified resists can be used.

Specific examples of the solvent include ketones such as γ-butyrolactone, acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, mixed solvents prepared by mixing propylene glycol monomethyl ether acetate (PGMEA) and a polar solvent are preferred, and although the blend ratio (weight ratio) in such mixed solvents can be set in accordance with factors such as the co-solubility of the PGMEA and the polar solvent, the ratio is preferably within a range from 1:9 to 8:2, and even more preferably from 2:8 to 5:5.

More specifically, in those cases where EL is added as the polar solvent, the weight ratio PGMEA:EL is preferably within a range from 9:1 to 5:5, and even more preferably from 8:2 to 6:4.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent, although the quantity should provide a concentration that enables favorable application of the solution to a support such as a substrate or the like, and should be set in accordance with the required coating film thickness, and is typically set so that the solid fraction concentration within the resist composition falls within a range from 2 to 20% by weight, and even more preferably from 5 to 15% by weight.

Other Optional Components

Other miscible additives can also be added to a positive resist composition of the first embodiment of the present invention according to need, and examples include additive resins for improving the properties of the resist film, surfactants for improving the ease of application, dissolution inhibitors, plasticizers, stabilizers, colorants, and halation prevention agents.

Process for Forming a Resist Pattern According to a Second Embodiment

A process for forming a resist pattern according to a second embodiment of the present invention can be conducted, for example, in the manner described below.

Namely, a positive resist composition described above is first applied to a support such as a silicon wafer using a spinner or the like, a prebake is then conducted under temperature conditions of 80 to 150° C., for a period of 40 to 120 seconds, and preferably for 60 to 90 seconds, and following selective exposure (irradiation) of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, developing is conducted using an alkali developing solution such as a 0.1 to 10% by weight aqueous solution of tetramethylamrnmonium hydroxide. In this manner, a resist pattern that is faithful to the mask pattern can be obtained.

An organic or inorganic anti-reflective film may also be provided between the support (substrate) and the applied layer of the resist composition.

As the support, conventional materials can be used without any particular restrictions, and suitable examples include substrates for electronic componentry, as well as substrates on which a predetermined wiring pattern has already been formed.

Specific examples of suitable substrates include silicon wafers, metal-based substrates such as copper, chrome, iron and aluminum, as well as glass substrates.

Suitable materials for the wiring pattern include copper, solder, chrome, aluminum, nickel, and gold.

There are no particular restrictions on the wavelength used for the exposure (irradiation), and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A resist composition according to the present invention is particularly effective for use with an ArF excimer laser.

In other words, the positive resist composition according to the first embodiment of the present invention, and the process for forming a resist pattern according to the second embodiment of the present invention are ideal for use within the production of electronic elements such as semiconductor elements and liquid crystal display elements. Furthermore, they are particularly suited to use within processes that employ a wavelength of 200 nm or lower, and particularly an ArF excimer laser.

In the present invention, a resin with a narrow molecular weight distribution obtained using an anionic polymerization method is preferably used, and a star polymer is particularly preferred.

In the present invention, resist patterns can be formed that exhibit high levels of sensitivity and resolution, as well as an excellent collapse margin and PEB margin.

Furthermore, as an additional effect, a resist pattern with minimal defects, and particularly bridge-mode defects, can be formed.

Furthermore, in the present invention, the use of a star polymer is preferred, and star polymers in which the structural unit (c1) forms the core are particularly desirable. This enables a densely clustered star polymer copolymer to be obtained, which improves the solubility of the copolymer in the resist solvent, lowers the viscosity, and ensures excellent coating characteristics for the resist. Furthermore, because the core is acid-dissociable, the contrast between the exposed and unexposed portions is enhanced.

Moreover, the star polymer has a narrow molecular weight distribution, and can be obtained in high yield, meaning a cheap resist composition can be provided. Furthermore, the positioning of each of the monomer units within the star polymer can be controlled, meaning an improvement in the resist characteristics can also be achieved.

Positive Resist Composition of a Third Embodiment

A positive resist composition of a third embodiment of the present invention includes a resin component (A) that exhibits increased alkali solubility under the action of acid, and an acid generator component (B) that generates acid on irradiation, wherein as described above in the third aspect, a specific component (A) is used.

In this embodiment, the above component (A) is a resin component that contains acid-dissociable, dissolution-inhibiting groups, and these acid-dissociable, dissolution-inhibiting groups dissociate under the action of acid generated by the component (B), causing an increase in the alkali solubility of the component (A).

More specifically, when the acid generated from the component (B) by exposure acts upon the component (A), the acid-dissociable, dissolution-inhibiting groups within the component (A) dissociate, causing the entire positive resist to change from an alkali-insoluble state to an alkali-soluble state. As a result, when the positive resist is exposed through a mask pattern during the formation of a resist pattern, or alternatively, is exposed and then subjected to PEB, the exposed portions of the resist shift to an alkali-soluble state, whereas the unexposed portions remain insoluble in alkali, meaning that alkali developing can then be used to form a positive resist pattern.

Component (A)

The component (A) is a star polymer that includes a core that contains acid-dissociable, dissolution-inhibiting groups, and arms that are bonded to the core.

Although the specific resin structures disclosed differ from the resin component of the present invention, a broad definition of star polymers is disclosed in L. Kilian et al., J. Polymer Science Part A, 2003, 3083. A star polymer includes a core portion, and arm portions that are bonded to the core.

In other words, in the third embodiment, the star polymer includes a core and a plurality of arms (polymer chains) that extend radially outward from this core.

In the present invention, the core may be either a polymer or not a polymer, but is preferably a polymer.

Here, the term "polymer" preferably refers to a structure in which at least one of the ethylenic double bonds in the monomer represented by the above general formula (1) that gives rise to a structural unit (c2) undergoes cleavage to generate a polymer.

In this embodiment, using this type of star polymer enables a particularly superior collapse margin and PEB margin to be obtained.

As the aforementioned component (A), a star polymer in which the core is a polymer containing a structural unit (c2) derived from a poly(α-lower alkyl)acrylate that contains an acid-dissociable, dissolution-inhibiting group, as represented by a general formula (1) shown below, and in which arms that include a structural unit (a2) derived from a mono(α-lower alkyl)acrylate that contains an acid-dissociable, dissolution-inhibiting group are bonded to the core is preferred. In other words, the polymer that constitutes the core preferably includes the structural unit (c2) as one of the structural units. Alternatively, the core may be formed solely from the structural unit (c2). Cores formed from the structural unit (c2) are preferred.

In this description, the term "mono" within the expression "mono(α-lower alkyl)acrylate" describes a compound that contains a single (α-lower alkyl)acrylate residue.

As is evident from the general formula (1), the term "poly" within the expression "poly(α-lower alkyl)acrylate" describes a compound that contains two or more (α-lower alkyl)acrylate residues.

In the component (A), both the structural units derived from mono(α-lower alkyl)acrylates and the structural units derived from the poly(α-lower alkyl)acrylate bond to the adjacent structural unit via a cleavage of the ethylenic double bond, thereby generating a polymer.

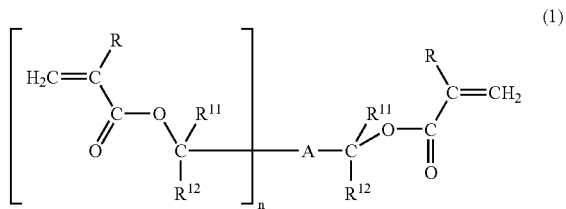

(wherein, R represents a lower alkyl group or a hydrogen atom, $R^{11}$ and $R^{12}$ each represent, independently, a lower alkyl group, n represents an integer from 1 to 5, and A represents a bivalent to hexavalent organic group)

Furthermore, a composition in which the component (A) is a star polymer in which the core is a polymer containing the structural unit (c2), and in which arms that include a structural unit (b2) derived from a mono(α-lower alkyl)acrylate that contains a lactone ring are bonded to this core is particularly preferred.

In the cases where the star polymer includes both the structural unit (a2) and the structural unit (b2), these structural units may both be incorporated within the same arm, or may be incorporated within different arms. Star polymers in which the plurality of arms bonded to the core are formed from random polymers that include both the structural unit (a2) and the structural unit (b2) are particularly desirable. Of these possibilities, arm polymers in which the structural unit (a2) forms the terminal are preferred. Such polymers yield improved contrast and a reduced level of defects, and are consequently preferred.

A component (A) that includes the three structural units described below is particularly desirable in terms of achieving a high resolution, reducing the level of defects, and ensuring improved coating characteristics.

(a2): a structural unit derived from a mono(α-lower alkyl) acrylate that contains an acid-dissociable, dissolution-inhibiting group. As mentioned above, this structural unit is preferably incorporated within the polymer that forms the arms.

(b2): a structural unit derived from a mono(α-lower alkyl) acrylate that contains a lactone ring. As mentioned above, this structural unit is preferably incorporated within the polymer that forms the arms. (c2): a structural unit derived from a poly(α-lower alkyl)acrylate represented by a general formula (1) shown above. As mentioned above, this structural unit is preferably incorporated within the polymer that forms the core.

As follows is a description of each of these structural units.

Structural Unit (a2)

The structural unit (a2) is a structural unit derived from a mono(α-lower alkyl)acrylate that contains an acid-dissociable, dissolution-inhibiting group, and preferably forms the polymer that functions as the arms.

There are no particular restrictions on the acid-dissociable, dissolution-inhibiting group, and conventional groups may be used.

The structural unit (a2) may be either a structural unit derived from a mono(α-lower alkyl)acrylate that contains a monocyclic or polycyclic group-containing acid-dissociable, dissolution-inhibiting group, or a structural unit derived from a mono(α-lower alkyl)acrylate that contains a chain-like acid-dissociable, dissolution-inhibiting group.

Generally, acid-dissociable, dissolution-inhibiting groups that form a chain-like or cyclic tertiary alkyl ester with the side chain carboxyl group of the (α-lower alkyl)acrylic acid residue are the most widely known, although acid-dissociable, dissolution-inhibiting groups that include a chain-like hydrocarbon group, or a monocyclic or polycyclic alicyclic hydrocarbon group are preferred, and those that include a polycyclic alicyclic hydrocarbon group are particularly desirable. The hydrocarbon group is preferably saturated.

Examples of monocyclic alicyclic hydrocarbon groups include groups in which one hydrogen atom has been removed from a cycloalkane or the like. Specific examples include groups in which one hydrogen atom has been removed from cyclohexane or cyclopentane or the like.

Examples of polycyclic alicyclic hydrocarbon groups include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. Of these possibilities, an adamantyl group, norbornyl group, or tetracyclododecanyl group is preferred industrially.

In the present invention, the structural unit (a2) preferably includes two or more different units. Including these different units simultaneously enables the polydispersity to be more readily controlled to a value of 1.5 or lower, and is particularly favorable in terms of the synthesis of the star polymer described below.

In the present invention, the two or more structural units of different structure included within the structural unit (a2) are referred to as the structural unit (a2-1) and the structural unit (a2-2) respectively.

In the present invention, the structural unit (a2-1) is preferably a structural unit derived from a mono(α-lower alkyl) acrylate that contains a monocyclic or polycyclic group-containing acid-dissociable, dissolution-inhibiting group, whereas the structural unit (a2-2) is preferably a structural unit derived from a mono(α-lower alkyl)acrylate that contains a chain-like acid-dissociable, dissolution-inhibiting group.

Examples of the mono(α-lower alkyl)acrylate (monomer) containing an acid-dissociable, dissolution-inhibiting group that gives rise to the structural unit (a2) include the compounds listed below.

Namely, mono(α-lower alkyl)acrylates (monomers) that give rise to the structural unit (a2-2) include mono(α-lower alkyl)acrylates that contain a chain-like acid-dissociable, dissolution-inhibiting group, such as tert-butyl(meth)acrylate, tert-amyl(meth)acrylate, tert-butyloxycarbonylmethyl (meth)acrylate, tert-amyloxycarbonylmethyl(meth)acrylate, tert-butyloxycarbonylethyl(meth)acrylate and tert-amyloxycarbonylethyl(meth)acrylate. Of these, tert-butyl(α-lower alkyl)acrylate is particularly preferred.

Furthermore, mono(α-lower alkyl)acrylates (monomers) that give rise to the structural unit (a2-1) include 1-methylcyclopentyl(meth)acrylate, 1-ethylcyclopentyl(meth)acrylate, and (α-lower alkyl)acrylates (monomers) that contain a monocyclic or polycyclic group-containing acid-dissociable, dissolution-inhibiting group, such as the compounds represented by the chemical formulas (22), chemical formulas (23), and chemical formulas (24) shown below.

(22)

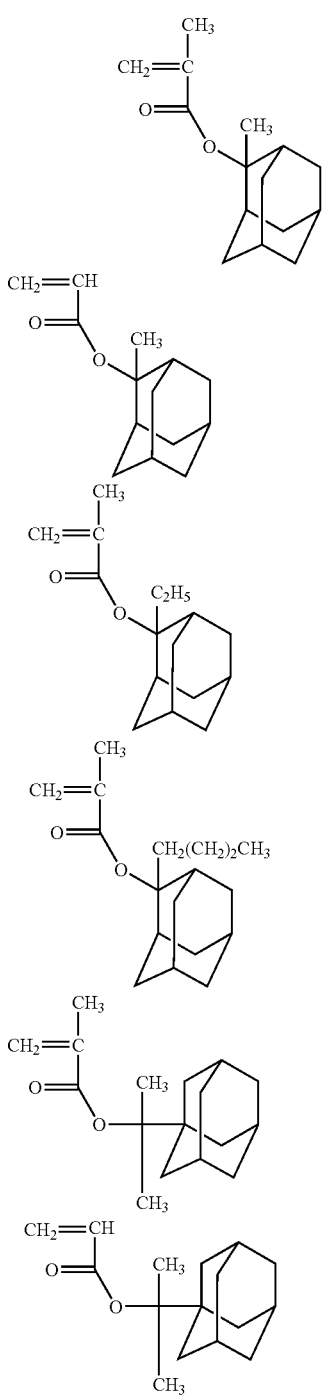

-continued

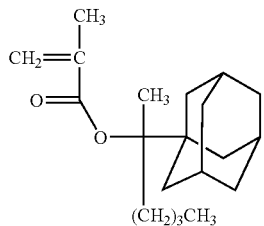

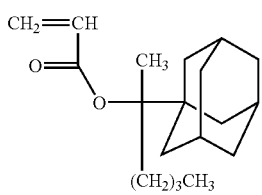

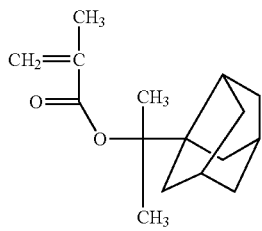

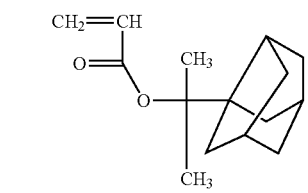

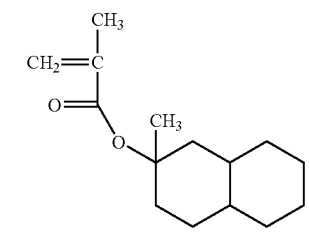

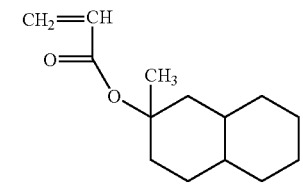

(23)

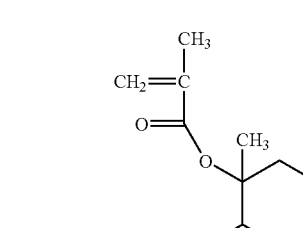

-continued
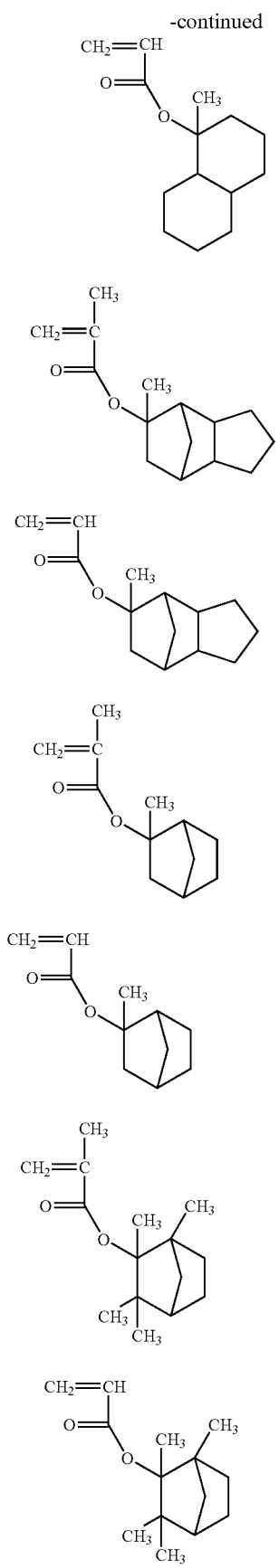
-continued
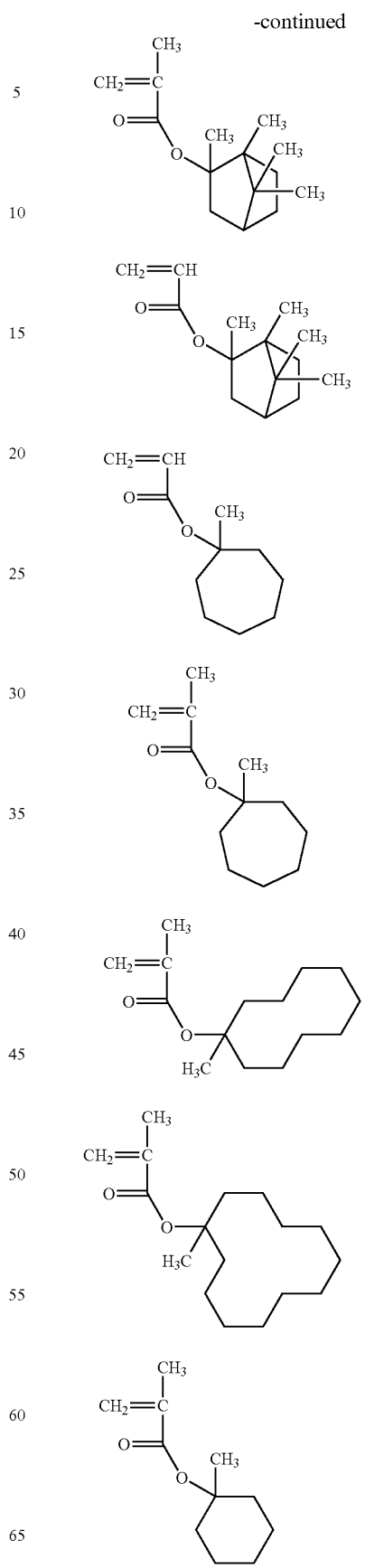

-continued
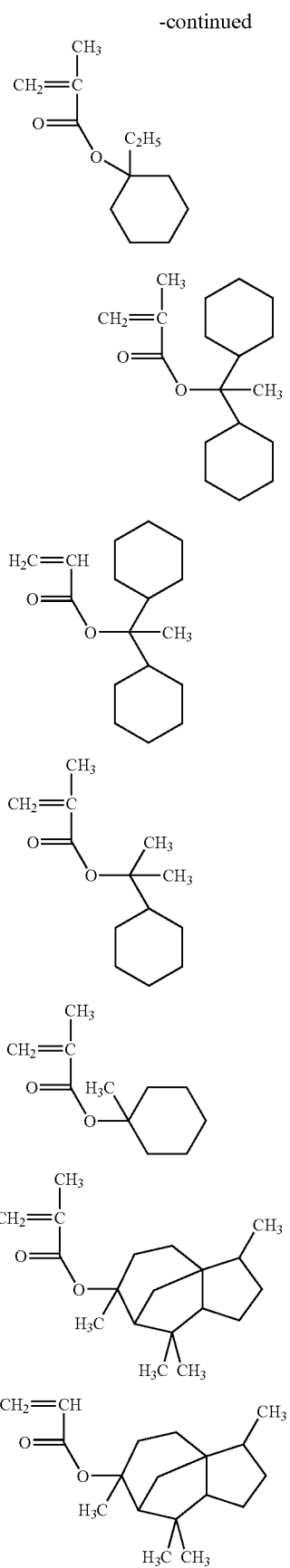
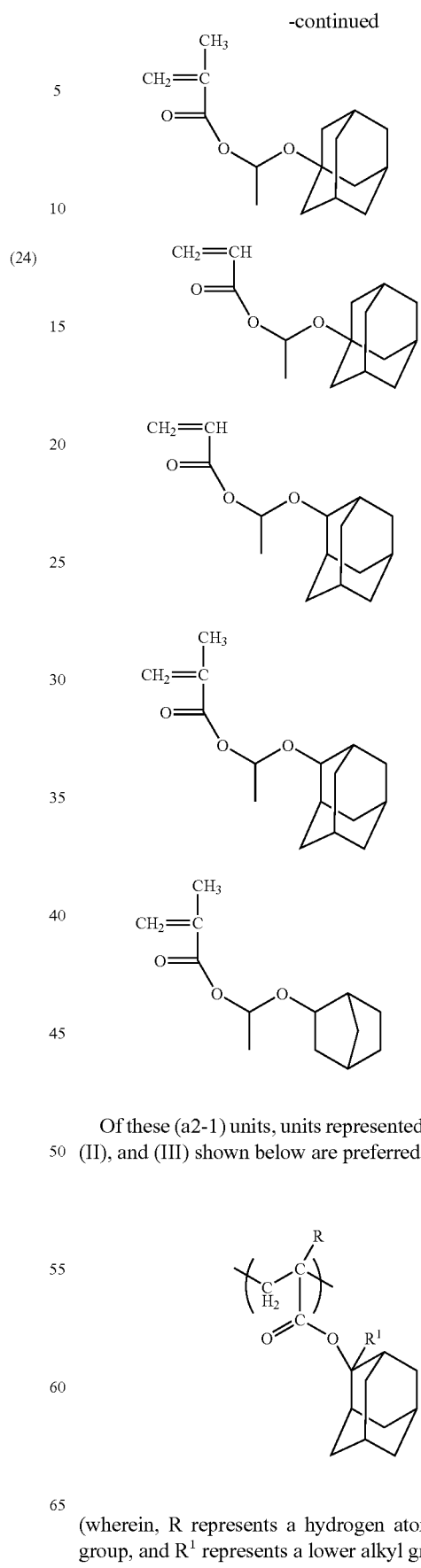
Of these (a2-1) units, units represented by the formulas (I), (II), and (III) shown below are preferred.
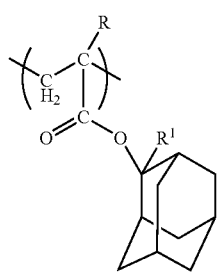
(wherein, R represents a hydrogen atom or a lower alkyl group, and $R^1$ represents a lower alkyl group)

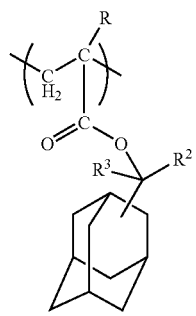

(wherein, R represents a hydrogen atom or a lower alkyl group, and $R^2$ and $R^3$ each represent, independently, a lower alkyl group)

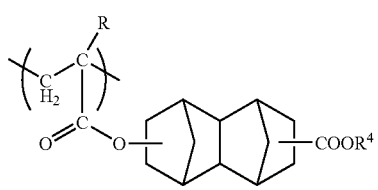

(wherein, R represents a hydrogen atom or a lower alkyl group, and $R^4$ represents a tertiary alkyl group)

In the above formulas, the lower alkyl group represented by R is preferably a straight-chain or branched alkyl group of 1 to 5 carbon atoms, and suitable examples include a methyl group, ethyl group, propyl group, isopropyl group, n-butyl group, isobutyl group, tert-butyl group, pentyl group, isopentyl group or neopentyl group. A methyl group is preferred industrially.

The group $R^1$ is preferably a straight-chain or branched lower alkyl group of 1 to 5 carbon atoms, and suitable examples include a methyl group, ethyl group, propyl group, isopropyl group, n-butyl group, isobutyl group, pentyl group, isopentyl group or neopentyl group. Of these groups, a methyl group or ethyl group is preferred in terms of industrial availability.

The groups $R^2$ and $R^3$ each preferably represent, independently, a straight-chain or branched lower alkyl group of 1 to 5 carbon atoms. Of the various possibilities, the case in which $R^2$ and $R^3$ are both methyl groups is preferred from an industrial viewpoint, and specific examples include structural units derived from 2-(1-adamantyl)-2-propyl(meth)acrylate.

The group $R^4$ represents a tertiary alkyl group such as a tert-butyl group or tert-amyl group, although the case in which $R^4$ is tert-butyl group is preferred industrially.

Furthermore, the group —$COOR^4$ may be bonded to either position 3 or 4 of the tetracyclododecanyl group shown in the formula, although the bonding position cannot be further specified. Furthermore, the carboxyl group residue of the (α-lower alkyl)acrylate structural unit may be bonded to either position 8 or 9 of the tetracyclododecanyl group, although similarly, the bonding position cannot be further specified.

The structural unit (a2) preferably accounts for 20 to 70 mol %, and even more preferably from 30 to 60 mol %, of the combined total of all the structural units that constitute the component (A). Ensuring that this proportion is at least as large as the lower limit of the above range enables a more favorable fine pattern to be obtained, whereas ensuring that the proportion is no greater than the upper limit enables a more favorable balance to be achieved with the other structural units.

Furthermore, examples of preferred units for the structural unit (a2-1) include structural units represented by the aforementioned general formula (I), whereas examples of preferred units for the structural unit (a2-2) include structural units derived from aliphatic tertiary alkyl(meth)acrylates.

Furthermore, using structural units represented by the aforementioned general formula (II) is ideal for those cases where the substrate includes a nitrogen-containing layer.

When a substrate that includes a nitrogen-containing layer is used, the resist pattern that contacts the nitrogen-containing layer is prone to a tailing phenomenon, which tends to cause a deterioration in the lithography characteristics such as the resolution. However, by using a structural unit represented by the above general formula (II), the effects of the present invention (improvements in the levels of sensitivity and resolution, and in the collapse margin and PEB margin) can be realized, while phenomena that are peculiar to substrates that employ a nitrogen-containing layer, such as the tailing phenomenon, can be suppressed.

A nitrogen-containing layer typically refers to a layer such as an insulating layer or metal layer or the like, which contains nitrogen, and is provided on top of the substrate in accordance with the intended use of the substrate. Examples of this type of insulating layer include silicon nitride (SiN), trisilicon tetranitride ($Si_3N_4$), and silicon oxynitride (SiON). Examples of the above type of metal layer include titanium nitride (TiN).

The nitrogen-containing layer is typically formed on top of a silicon substrate or the like, using a method such as vapor deposition.

Substrates that include this type of nitrogen-containing layer are typically referred to as "nitrogen-containing substrates".

Furthermore, using a structural unit represented by the above general formula (II) also provides a favorable reduction in LWR. This reduction in LWR is particularly favorable when a pattern is formed on a substrate that include a nitrogen-containing layer.

"LWR" is an abbreviation for "Line Width Roughness", which describes the phenomenon where the line width of a line pattern is irregular.

The relative proportions of the structural unit (a2-1) and the structural unit (a2-2) within all the structural units (a2) of the component (A) in this case are typically within a range from 50 to 99.9 mol %, and preferably from 70 to 90 mol % for the former, and within a range from 0.1 to 50 mol %, and preferably from 10 to 30 mol % for the latter, as these proportions result in a more favorable improvement in the collapse margin and PEB margin. Furthermore, these proportions yield a favorable improvement in the solubility of the star polymer within the resist solvent.

Structural Unit (b2)

The structural unit (b2) is a structural unit derived from a mono(α-lower alkyl)acrylate that contains a lactone ring, and preferably forms the polymer that functions as the arms. Examples of the structural unit (b2) include units in which a monocyclic group formed from a lactone ring or a polycyclic alicyclic group that includes a lactone ring is bonded to the ester side-chain portion of an (α-lower alkyl)acrylate.

The term "lactone ring" refers to a single ring containing a —O—C(O)— structure, and this ring is counted as the first ring. Accordingly, in this description, the case in which the only ring structure is the lactone ring is referred to as a monocyclic group, and groups containing other ring structures are described as polycyclic groups regardless of the structure of the other rings.

Specific examples of the structural unit (b2) include monocyclic groups in which one hydrogen atom has been removed from γ-butyrolactone, and polycyclic groups in which one hydrogen atom has been removed from a lactone ring-containing polycycloalkane.

Examples of the mono(α-lower alkyl)acrylates (monomers) that give rise to these types of structural unit (b2) include compounds represented by the chemical formulas (28), chemical formulas (29), chemical formulas (30), and chemical formulas (31) shown below.

(28)

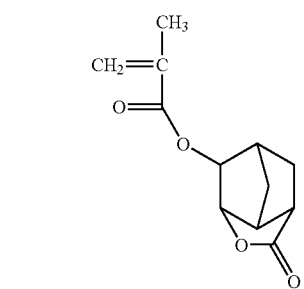

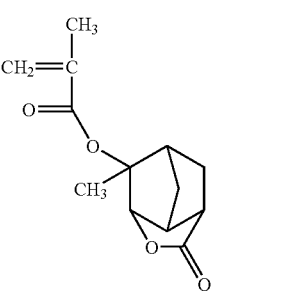

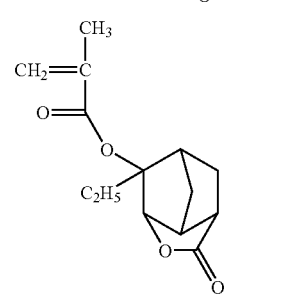

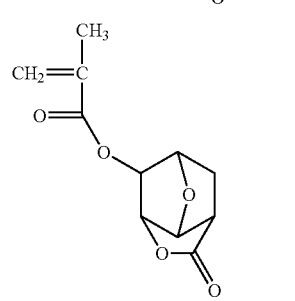

-continued

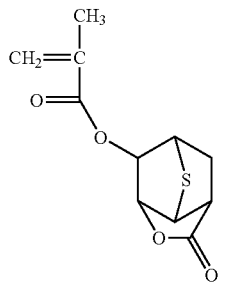

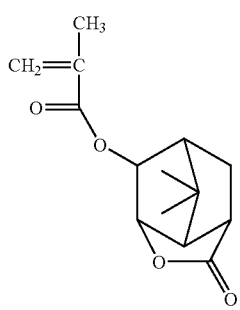

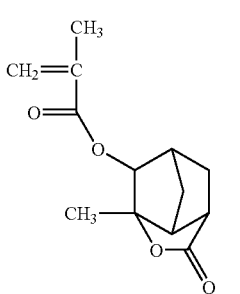

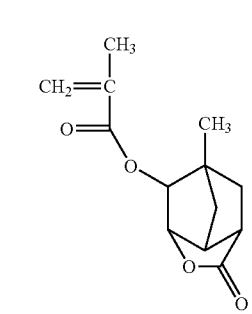

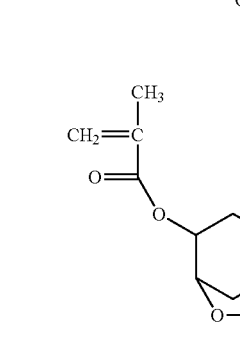

51
-continued
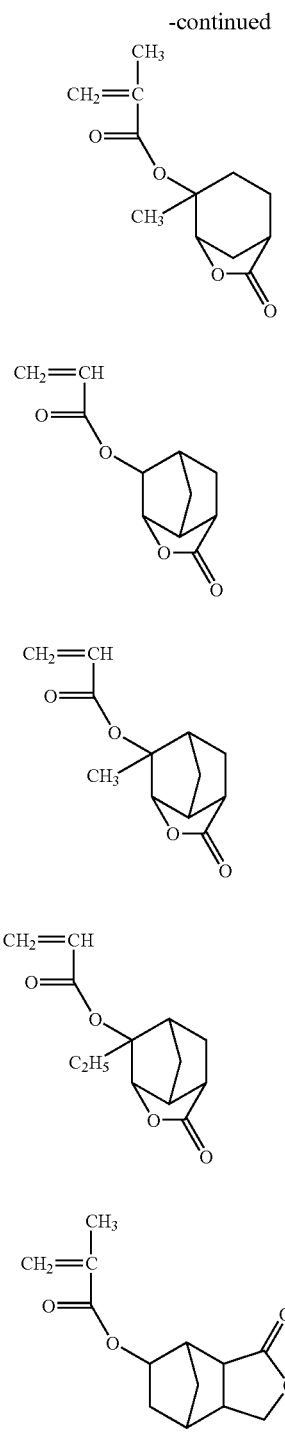
52
-continued
(29)
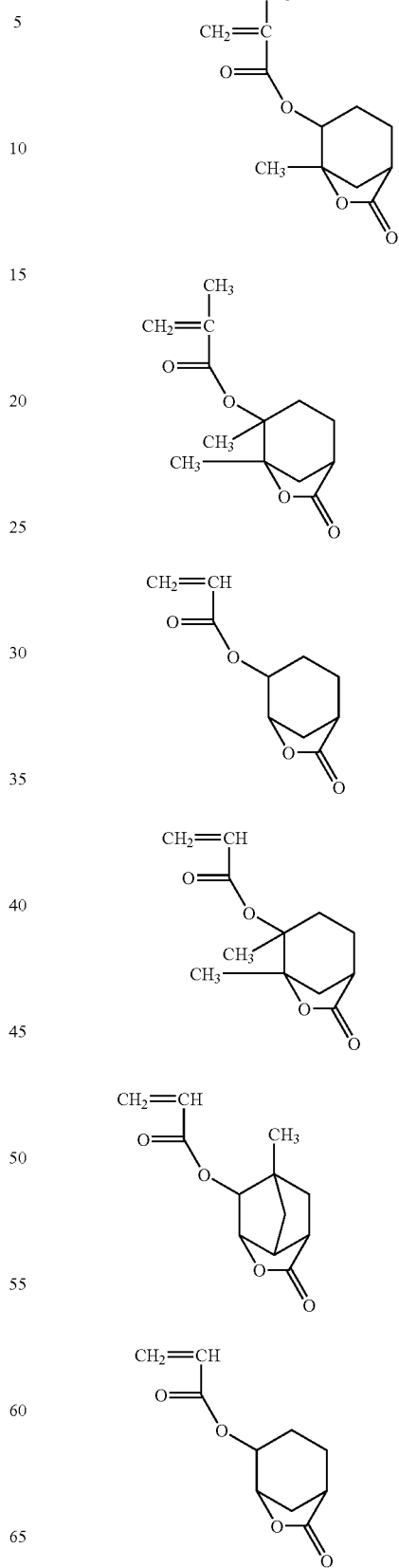

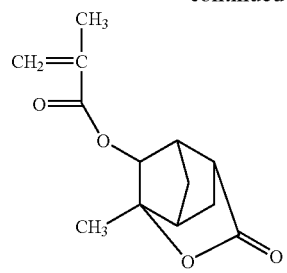
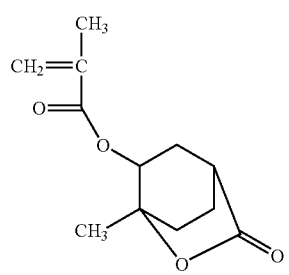
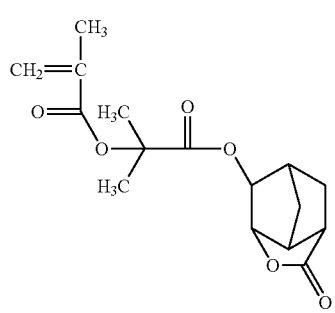
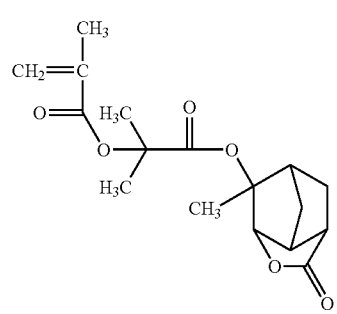
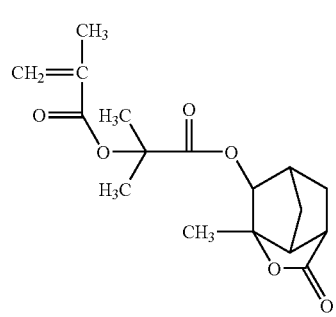
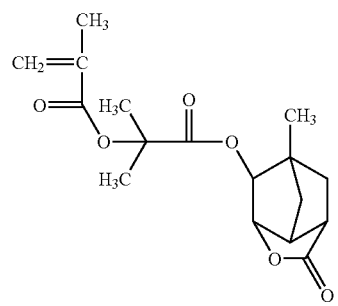
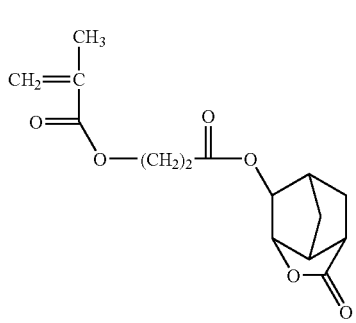
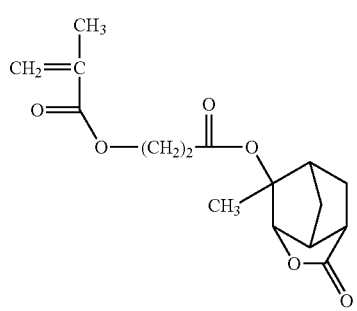
(30)
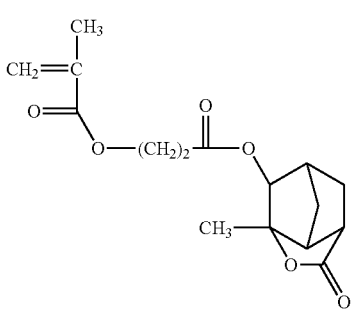
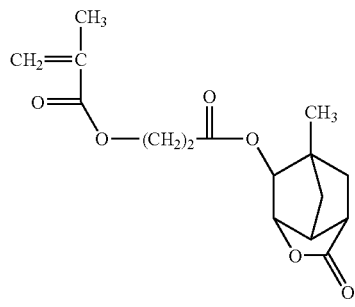

-continued
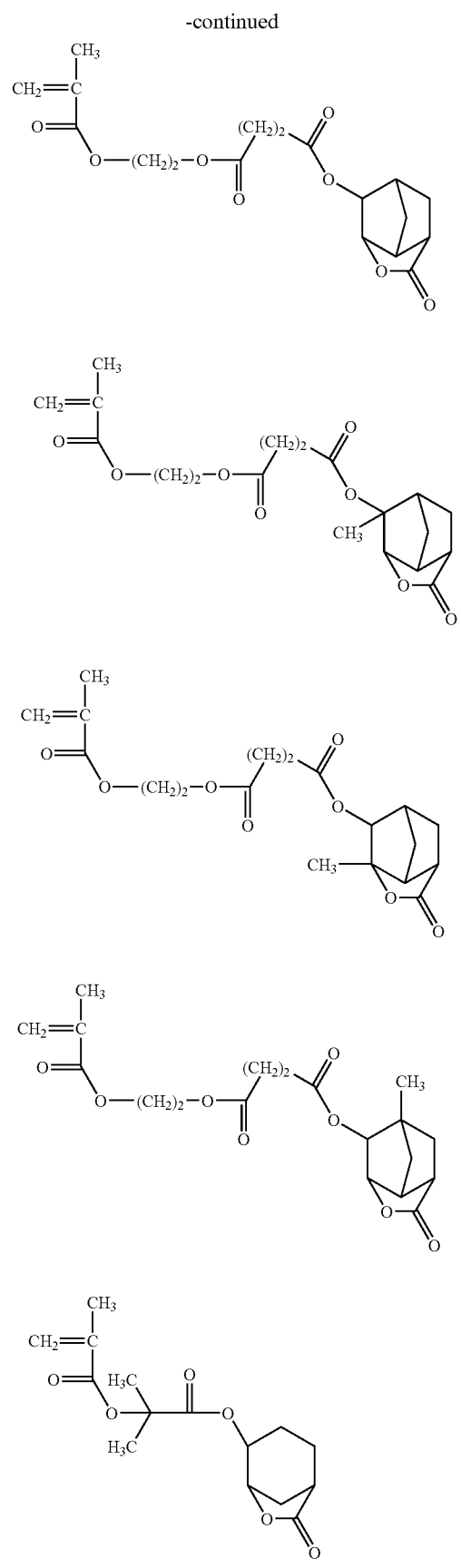
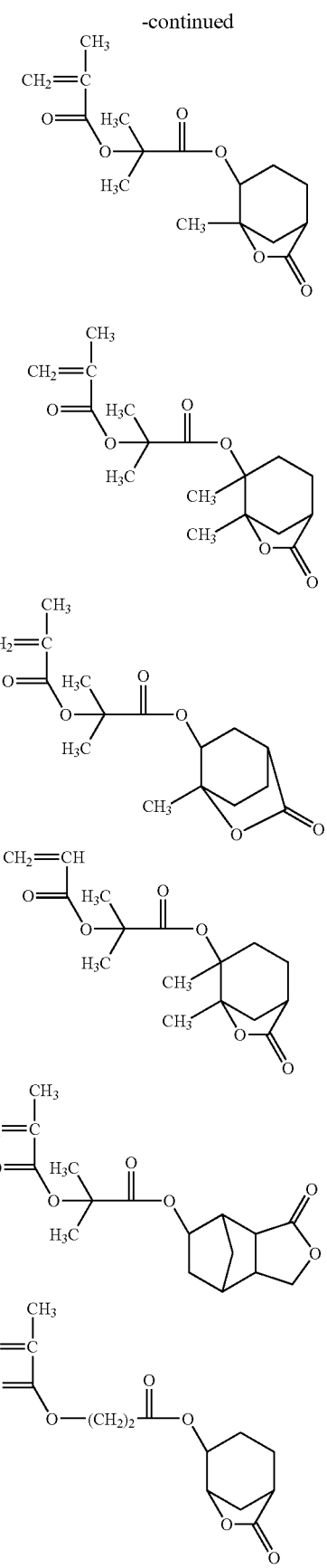
(31)

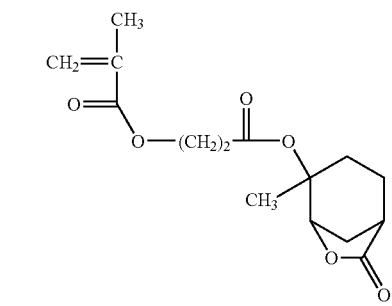

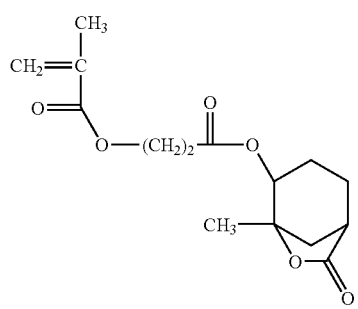

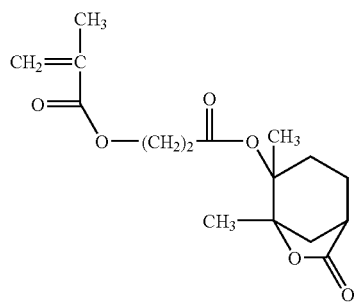

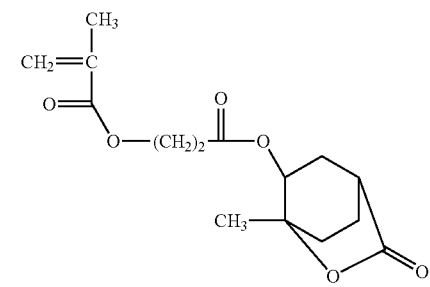

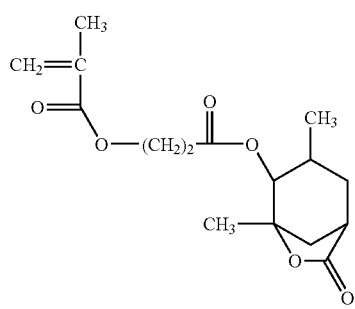

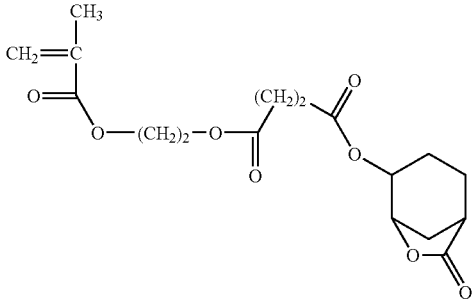

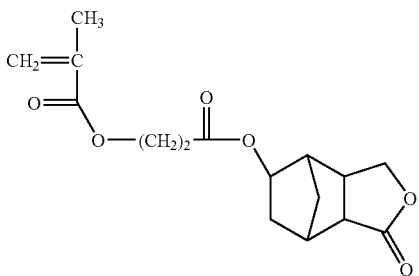

Of these possibilities, structural units represented by the structural formulas (IV) and (V) shown below are preferred.

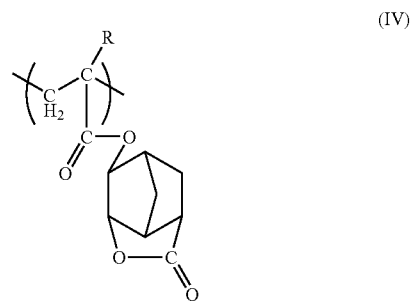

(IV)

(wherein, R represents a hydrogen atom or a lower alkyl group, and preferably a methyl group)

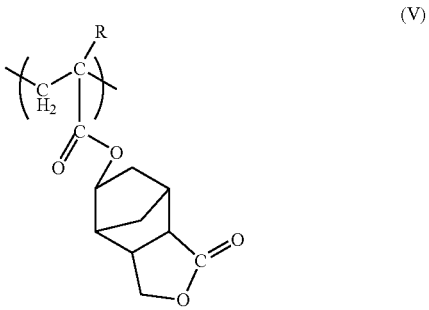

(V)

(wherein, R represents a hydrogen atom or a lower alkyl group, and preferably a methyl group)

The structural unit (b2) preferably accounts for 20 to 60 mol %, and even more preferably from 20 to 50 mol %, of the combined total of all the structural units that constitute the component (A). Ensuring that this proportion is at least as large as the lower limit of the above range improves the lithography characteristics such as the resistance to pattern collapse of very fine resist patterns, whereas ensuring that the proportion is no greater than the upper limit enables a more favorable balance to be achieved with the other structural units.

Structural Unit (c2)

The structural unit (c2) is a structural unit derived from a poly(α-lower alkyl)acrylate represented by a general formula (1) shown below, and preferably forms the polymer that functions as the core. Because the carbon atoms to which the groups $R^{11}$ and $R^{12}$ are bonded become tertiary alkyl groups, this structural unit also functions as an acid-dissociable group.

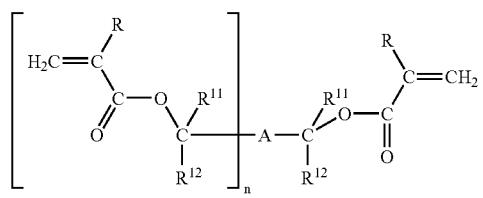

(1)

(wherein, R represents a lower alkyl group or a hydrogen atom, $R^{11}$ and $R^{12}$ each represent, independently, a lower alkyl group, n represents an integer from 1 to 5, and A represents a bivalent to hexavalent organic group)

The group R represents a hydrogen atom or a lower alkyl group. The groups $R^{11}$ and $R^{12}$ each represent, independently, a lower alkyl group. The group A represents a bivalent to hexavalent organic group.

In other words, when the group A is bivalent, n is 1, and the structural unit adopts a structure in which two (α-lower alkyl) acrylate residues are bonded to A. When the group A is trivalent, n is 2, and the structural unit adopts a structure in which three (α-lower alkyl)acrylate residues are bonded to A. In this manner, as the valency of the group A increases, the number of group residues bonded to A also increases, forming a structure with a more dense radial structure.

Specific examples of suitable lower alkyl groups for the groups R, $R^{11}$, and $R^{12}$ include lower alkyl groups such as a methyl group, ethyl group, n-propyl group, isopropyl group, n-butyl group, or t-butyl group, and of these, a methyl group is preferred.

Furthermore, examples of suitable organic groups for the group A include saturated or unsaturated aromatic or aliphatic hydrocarbon groups (which may include an oxygen atom in the form of an ether group, polyether group, or ester group) such as alkylene groups and arylene groups, and saturated or unsaturated aromatic or aliphatic hydrocarbon groups which may include other atoms such as nitrogen or the like.

Specific examples of suitable groups include the structures shown in the formulas below. In those cases where the component (A) includes two or more different partial structures represented by the formula (1), these structures may be either the same or different.

-continued

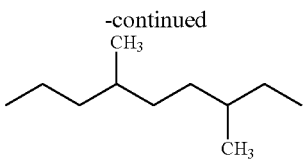
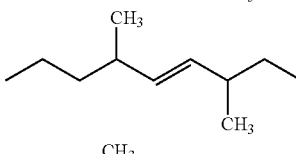
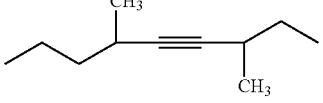
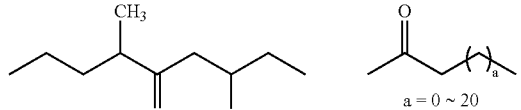
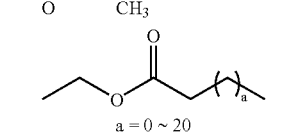
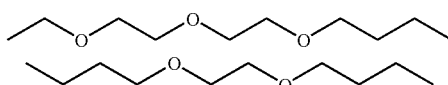
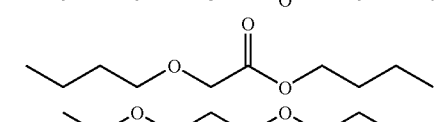
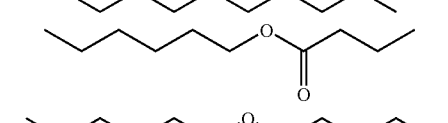
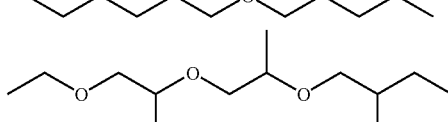
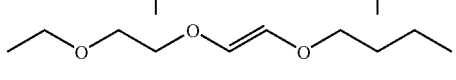
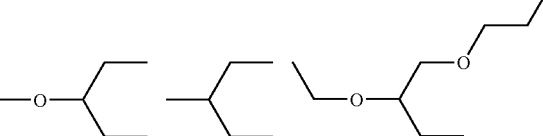
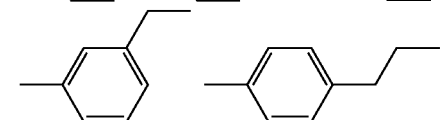
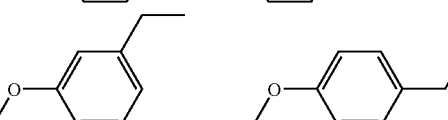
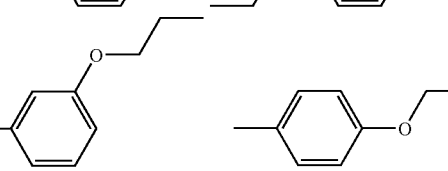

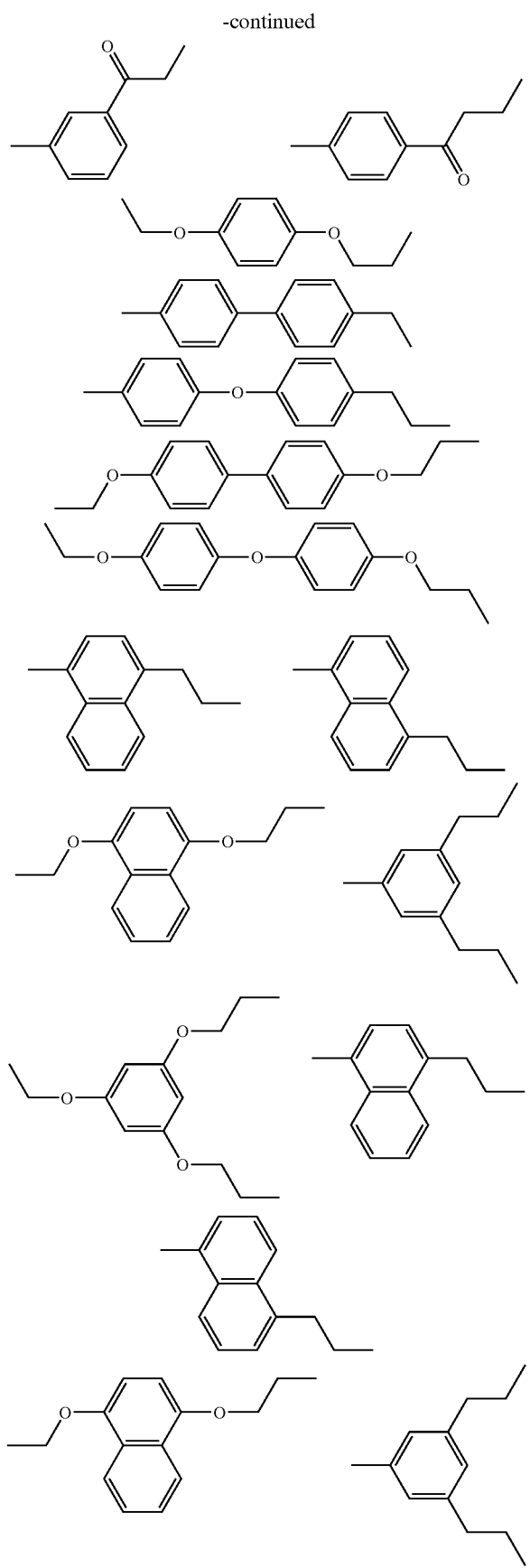
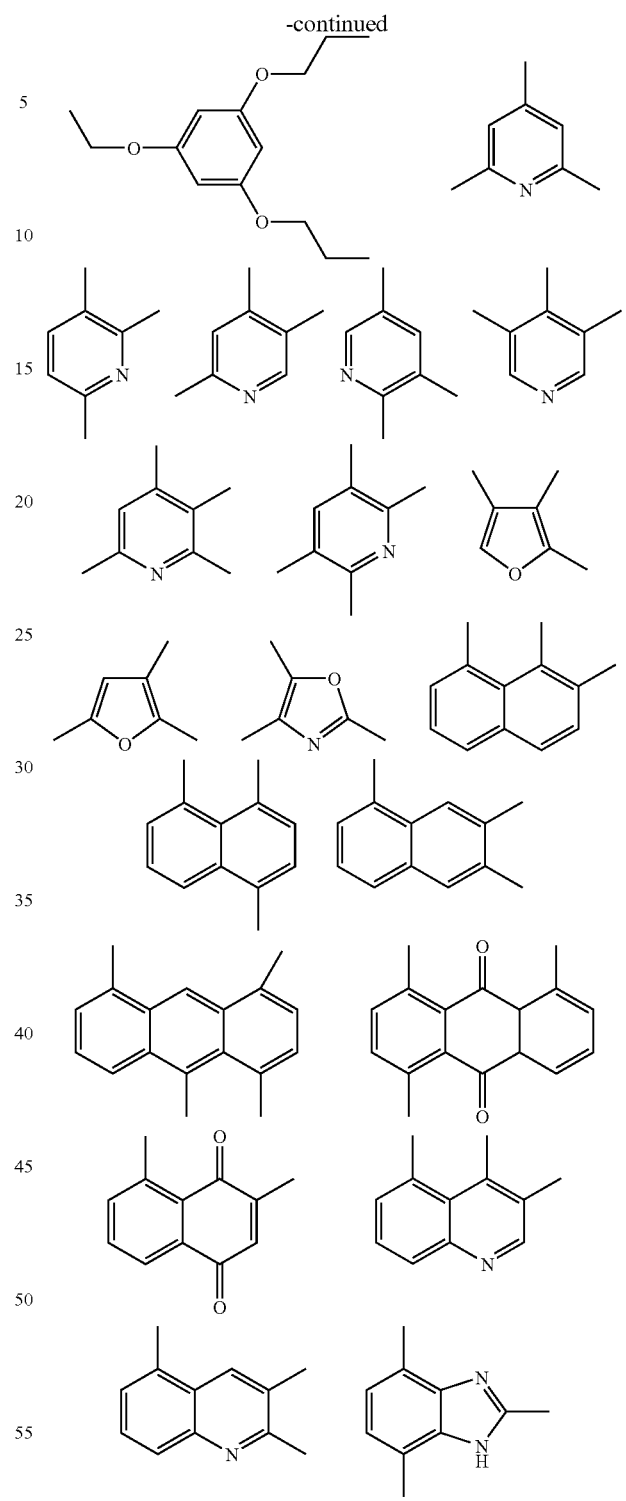

For the group A, of the organic groups shown above, alkylene groups of 2 to 5 carbon atoms, phenylene groups, and polyether groups of 3 to 6 carbon atoms are particularly preferred.

Compounds in which the group A is either bivalent or trivalent are preferred as the compound (monomer) that gives rise to the structural unit (c2), and the compounds shown below represent specific examples of preferred compounds.

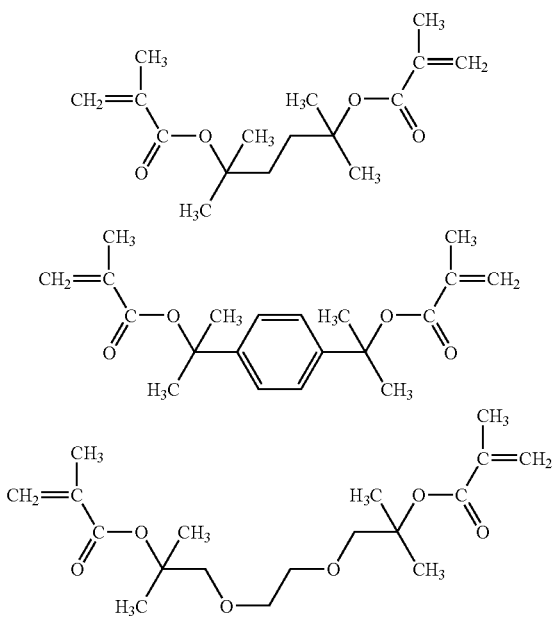

The structural unit (c2) preferably accounts for 1 to 30 mol %, and even more preferably from 5 to 20 mol %, of the combined total of all the structural units that constitute the component (A). Ensuring that this proportion is at least as large as the lower limit of the above range improves the lithography characteristics such as the resistance to pattern collapse of very fine resist patterns and the PEB margin, whereas ensuring that the proportion is no greater than the upper limit enables a more favorable balance to be achieved with the other structural units.

Other Structural Units

The component (A) may include structural units other than the aforementioned structural units (a2), (b2), and (c2), although the combined total of these three structural units, relative to the combined total of all the structural units, is typically at least 70 mol %, preferably 80 mol % or greater, and is most preferably 100 mol %.

Examples of other structural units (d2) besides the structural units (a2), (b2), and (c2) include units derived from the types of (meth)acrylate esters listed below.

In other words, examples of the monomers that give rise to the structural unit (d2) include acrylate esters such as methyl acrylate, ethyl acrylate, propyl acrylate, amyl acrylate, cyclohexyl acrylate, ethylhexyl acrylate, octyl acrylate, t-octyl acrylate, chloroethyl acrylate, 2-ethoxyethyl acrylate, 2,2-dimethyl-3-ethoxypropyl acrylate, 5-ethoxypentyl acrylate, 1-methoxyethyl acrylate, 1-ethoxyethyl acrylate, 1-methoxypropyl acrylate, 1-methyl-1-methoxyethyl acrylate, 1-(isopropoxy)ethyl acrylate, benzyl acrylate, methoxybenzyl acrylate, furfuryl acrylate, and tetrahydrofurfuryl acrylate; methacrylate esters such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-ethoxyethyl methacrylate, 4-methoxybutyl methacrylate, 5-methoxypentyl methacrylate, 2,2-dimethyl-3-ethoxypropyl methacrylate, 1-methoxyethyl methacrylate, 1-ethoxyethyl methacrylate, 1-methoxypropyl methacrylate, 1-methyl-1-methoxyethyl methacrylate, 1-(isopropoxy)ethyl methacrylate, furfuryl methacrylate, and tetrahydrofurfuyl methacrylate;

crotonate esters such as methyl crotonate, ethyl crotonate, propyl crotonate, amyl crotonate, cyclohexyl crotonate, ethylhexyl crotonate, octyl crotonate, t-octyl crotonate, chloroethyl crotonate, 2-ethoxyethyl crotonate, 2,2-dimethyl-3-ethoxypropyl crotonate, 5-ethoxypentyl crotonate, 1-methoxyethyl crotonate, 1-ethoxyethyl crotonate, 1-methoxypropyl crotonate, 1-methyl-1-methoxyethyl crotonate, 1-(isopropoxy)ethyl crotonate, benzyl crotonate, methoxybenzyl crotonate, furfuryl crotonate, and tetrahydrofurfuryl crotonate; and itaconate esters such as dimethyl itaconate, diethyl itaconate, dipropyl itaconate, diamyl itaconate, dicyclohexyl itaconate, bis(ethylhexyl)itaconate, dioctyl itaconate, di-t-octyl itaconate, bis(chloroethyl)itaconate, bis(2-ethoxyethyl)itaconate, bis(2,2-dimethyl-3-ethoxypropyl) itaconate, bis(5-ethoxypentyl)itaconate, bis(1-methoxyethyl)itaconate, bis(1-ethoxyethyl)itaconate, bis(1-methoxypropyl)itaconate, bis(1-methyl-1-methoxyethyl) itaconate, bis(1-(isopropoxy)ethyl)itaconate, dibenzyl itaconate, bis(methoxybenzyl)itaconate, difurfuryl itaconate, and ditetrahydrofurfuryl itaconate.

Preferred forms for the component (A) include star polymers in which a polymer is synthesized from the structural unit (c2) and used as the core, the arms are prepared from a polymer containing the structural unit (a2), and if required one or more units selected from the structural units (b2) and (d2), and the arms are bonded to the core. As described above, in these arm polymers, the structural units (a2), (b2) and (d2) may be incorporated within different arms, or within the same arm. In a preferred configuration, a plurality of arms each formed from a random polymer containing each of the structural units are bonded to the core. Of these possibilities, arm polymers in which the structural unit (a2) forms the terminal are preferred. Such polymers yield improved contrast and a reduced level of defects, and are consequently preferred.

Amongst the combined total of all the structural units that constitute the plurality of arms of a star polymer according to the present invention, the proportion of each repeating unit can be selected by altering the proportion of the corresponding monomer used in the reaction, and for example, the quantity of the structural unit (b2) typically represents from 20 to 60 mol %, preferably from 20 to 50 mol %, and even more preferably from 40 to 50 mol %, of all the repeating units within the arms, whereas the quantity of the structural unit (a2) typically represents from 20 to 70 mol %, preferably from 30 to 60 mol %, and even more preferably from 30 to 65 mol % of all the repeating units within the arms.

The quantity of the structural unit (c2) typically represents from 1 to 30 mol %, and preferably from 5 to 20 mol % of the combined total of repeating units.

The weight average molecular weight (Mw) of the star polymer of the component (A), as measured by gel permeation chromatography, and referenced against polystyrene standards, is typically within a range from 10,000 to 50,000, preferably from 15,000 to 40,000, and even more preferably from 20,000 to 38,000. The polydispersity, namely, the ratio (Mw/Mn) between the weight average molecular weight (Mw) and the number average molecular weight (Mn) is preferably within a range from 1.01 to 3.00, even more preferably from 1.01 to 2.00, and most preferably from 1.01 to 1.50.

The number average molecular weight (Mn) of the arms, as measured by gel permeation chromatography, and referenced against polystyrene standards, is typically within a range from 1,000 to 100,000, preferably from 1,500 to 500,000, even more preferably from 2,000 to 200,000, and most preferably from 2,500 to 100,000, and the ratio (Mw/Mn) between the weight average molecular weight (Mw) and the number average molecular weight (Mn) is preferably within a range from 1.01 to 3.00, even more preferably from 1.01 to 2.00, and most preferably from 1.01 to 1.50.

Living anionic polymerization is preferred as the method for producing the star polymer used in the present invention, and specific examples of such methods include (1) a method in which the (α-lower alkyl)acrylates or the like corresponding with the structural unit (a2) and the structural unit (b2) are subjected to anionic polymerization in the presence of an anionic polymerization initiator to synthesize the arm polymer, and this arm polymer is then reacted with a polyacrylate containing the structural unit (c2); (2) a method in which a polyacrylate containing the structural unit (c2) is reacted in the presence of an anionic polymerization initiator, thereby forming a polyfunctional core, and this polyfunctional core is then subjected to anionic polymerization with the (α-lower alkyl)acrylates or the like corresponding with the structural unit (a2) and the structural unit (b2); and (3) a method in which the (α-lower alkyl)acrylates or the like corresponding with the structural unit (a2) and the structural unit (b2) are subjected to anionic polymerization in the presence of an anionic polymerization initiator to synthesize the arm polymer, and this arm is reacted with a polyfunctional coupling agent, and then with an anionic polymerizable monomer that includes a monomer that gives rise to the structural unit (c2).

The methods (1) and (3) described above offer more ready control of the reaction, and are consequently preferred in terms of enabling production of a star polymer with a controlled structure.

Examples of the anionic polymerization initiator used in the aforementioned anionic polymerization include alkali metals and organic alkali metal compounds. Examples of suitable alkali metals include lithium, sodium, potassium, and cesium, whereas examples of suitable organic alkali metal compounds include alkylated, allylated or arylated alkali metal compounds, and specific examples include ethyl lithium, n-butyl lithium, sec-butyl lithium, tert-butyl lithium, ethyl sodium, lithium biphenyl, lithium naphthalene, lithium triphenyl, sodium naphthalene, α-methylstyrene sodium dianion, 1,1-diphenylhexyl lithium, and 1,1-diphenyl-3-methylpentyl lithium.

In the above methods (1) and (3), the polymerization reaction for synthesizing the arm polymers may be conducted either by a method in which the anionic polymerization initiator is added dropwise to the monomer (mixture) solution, or by a method in which the monomer (mixture) liquid is added dropwise to a solution containing the anionic polymerization initiator, although from the viewpoint of enabling better control of the molecular weight and the molecular weight distribution, a method in which the monomer (mixture) liquid is added dropwise to a solution containing the anionic polymerization initiator is preferred. This arm polymer synthesis reaction is typically conducted under an atmosphere of an inert gas such as nitrogen or argon, within an organic solvent, and at a temperature within a range from −100 to 50° C., and preferably from −100 to 40° C.

Examples of suitable organic solvents for use within the above arm polymer synthesis reaction include aliphatic hydrocarbons such as n-hexane and n-heptane, cyclic hydrocarbons such as cyclohexane and cyclopentane, aromatic hydrocarbons such as benzene and toluene, ethers such as diethyl ether, tetrahydrofuran (THF), and dioxane, as well as other solvents typically used within anionic polymerizations such as anisole and hexamethylphosphoramide, and these solvents may be used either alone, or in combinations of two or more different solvents. Of the above solvents, from the viewpoints of polarity and solubility, mixed solvents of tetrahydrofuran and toluene, tetrahydrofuran and hexane, and tetrahydrofuran and methylcyclohexane are preferred.

Examples of the polymer configuration of the arm polymers include random copolymers in which each of the components is distributed statistically randomly through the copolymer chain, partial block copolymers, and complete block copolymers, and these polymer configurations can be synthesized by appropriate selection of the method used for adding the acrylates.

The reaction for generating a star polymer, in which the arm polymers formed in the manner described above function as branch polymer chains, can be conducted by first completing the synthesis reaction for the arm polymers, and then adding the aforementioned polyacrylate to the reaction solution. Typically, by conducting this polymerization reaction under an atmosphere of an inert gas such as nitrogen or argon, within an organic solvent, and at a temperature within a range from −100 to 50° C., and preferably from −70 to 40° C., the structure of the resulting polymer can be better controlled, and a polymer with a narrow molecular weight distribution can be obtained. Furthermore, this reaction for producing the star polymer may be conducted as a consecutive reaction, using the same solvent used for the formation of the arm polymers, or alternatively, further solvent may be added to alter the composition, or the solvent may be substituted with an alternative solvent. Suitable solvents include the same solvents as those described above for use within the arm polymer synthesis reaction.

In a process for producing a star polymer according to the present invention, the molar ratio between the polyacrylate (P), and the polymer chain active terminals (D) produced by anionic polymerization of the (α-lower alkyl)acrylates or the like corresponding with the structural unit (a2) and the structural unit (b2) using an anionic polymerization initiator as the polymerization initiator [namely, the ratio (P)/(D)] is preferably set within a range from 0.1 to 10. The reaction between the arm polymer chains and the polyacrylate may use either a method in which the polyacrylate is added to the arm polymer chains containing the active terminals, or a method in which the arm polymer chains containing the active terminals are added to the polyacrylate.

The number of arms within the star polymer is determined on the basis of the quantity of polyacrylate added, the reaction temperature, and the reaction time, and usually, factors such as the difference in reactivity between the living polymer terminals and the vinyl groups of the polyacrylate, and steric hindrance and the like mean that a plurality of star-shaped block copolymers with differing numbers of arms are generated simultaneously.

Furthermore, the ratio (Mw/Mn) between the weight average molecular weight (Mw) and the number average molecular weight (Mn) of the produced star polymer preferably falls within a range from 1.00 to 1.50, and the number average molecular weight is preferably within a range from 2,500 to 100,000.

In the method (3), in which a central core (a polyfunctional core) containing active terminals formed by a reaction between prepared arm polymer chains and a polyacrylate is subjected to further reaction with an anionic polymerizable monomer to form new arm portion chains, star polymers with a variety of different arm polymer chains can be produced. A polymerizable monomer may be reacted directly with the active terminals present on the central core, but by first conducting a reaction with a compound such as diphenylethylene or stilbene, or first adding a mineral acid salt of an alkali metal or an alkaline earth metal, such as lithium chloride, and then conducting the reaction with the monomer, the polymerization reaction can be caused to proceed at a slower rate in those cases where a highly reactive monomer such as an acrylic acid derivative is used, which can be effective in enabling the overall structure of the generated star polymer to be better controlled. Furthermore, the above reaction may be conducted as a consecutive reaction within the same solvent used for forming the central core containing the active terminals, or alternatively, further solvent may be added to alter the composition, or the solvent may be substituted with an alternative solvent. Suitable solvents include the same solvents as those described above for use within the arm polymer synthesis. Furthermore, the arm polymer chains newly introduced to the active terminals present on the central core in the above method (3), and the arm polymer chains within the above method (2) may be either formed as randomly copolymerized polymer chains by conducting reaction using a mixture of two monomers, or formed as block polymer chains by adding the two monomers in a sequential manner. Furthermore, following completion of the reaction, functional groups can be introduced at the terminals by adding carbon dioxide or an epoxy or the like.

(B) Compound that Generates Acid on Irradiation (Exposure)

In the present invention, the component (B) can use any of the known so-called acid generators used in conventional chemically amplified resist compositions without any particular restrictions. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes, poly(bis-sulfonyl)diazomethanes, and diazomethane nitrobenzyl sulfonates, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, and diphenylmonomethylsulfonium trifluoromethanesulfonate, heptafluoropropanesulfonate or nonafluorobutanesulfonate.

Specific examples of suitable oxime sulfonate-based acid generators include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

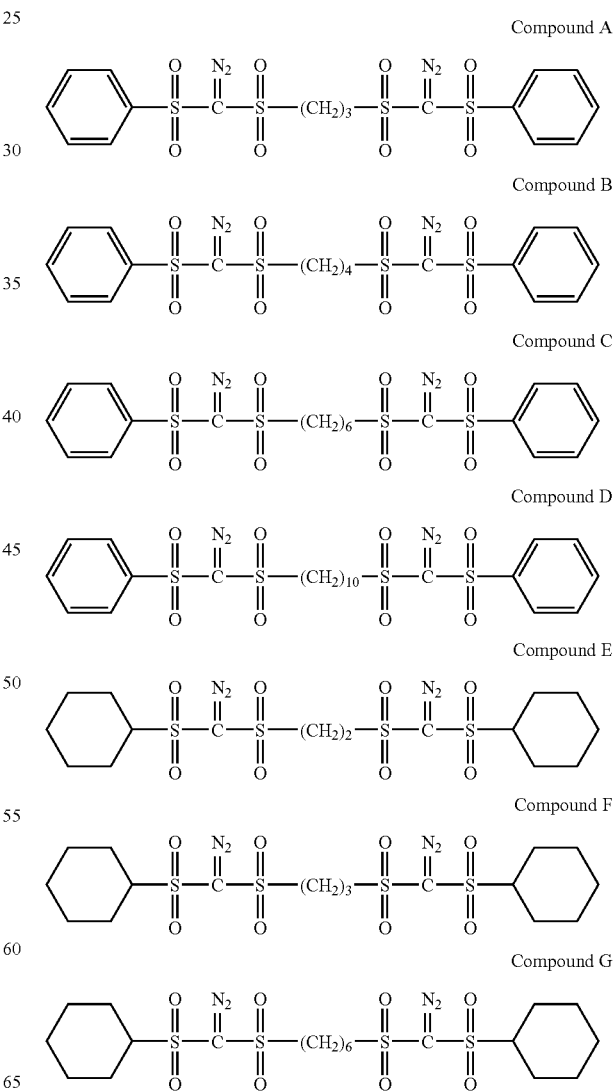

-continued

Compound H

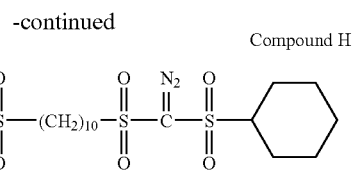

As the component (B), either a single acid generator may be used alone, or a combination of two or more different acid generators may be used.

The quantity used of the component (B) is typically within a range from 0.5 to 30 parts by weight, and preferably from 1 to 10 parts by weight, per 100 parts by weight of the component (A). By ensuring that the quantity is at least as large as the lower limit of the above range, favorable pattern formation can be achieved, whereas ensuring that the proportion is no greater than the upper limit enables a uniform solution to be obtained, and more favorable storage stability to be achieved.

(D) Nitrogen-containing Organic Compound

In a positive resist composition according to the third embodiment of the present invention, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds can be used, although an amine, and particularly a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and of these, tertiary alkanolamines such as triethanolamine are particularly preferred.

These compounds may be used either alone, or in combinations of two or more different compounds.

The component (D) is typically used in a quantity within a range from 0.01 to 5.0 parts by weight per 100 parts by weight of the component (A).

Component (E)

Furthermore, in order to prevent any deterioration in sensitivity caused by the addition of the aforementioned component (D), and improve the resist pattern shape and the post exposure stability of the latent image formed by the pattern-wise exposure of the resist layer, an organic carboxylic acid, or a phosphorus oxo acid or derivative thereof (E) may also be added as another optional component (hereafter referred to as the component (E)). The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Organic Solvent

A positive resist composition according to the third embodiment of the present invention can be produced by dissolving the materials in an organic solvent.

The organic solvent may be any solvent capable of dissolving the various components to generate a uniform solution, and one or more solvents selected from known materials used as the solvents for conventional chemically amplified resists can be used.

Specific examples of the solvent include ketones such as γ-butyrolactone, acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, mixed solvents prepared by mixing propylene glycol monomethyl ether acetate (PGMEA) and a polar solvent are preferred, and although the blend ratio (weight ratio) in such mixed solvents can be set in accordance with factors such as the co-solubility of the PGMEA and the polar solvent, the ratio is preferably within a range from 1:9 to 8:2, and even more preferably from 2:8 to 5:5.

More specifically, in those cases where EL is added as the polar solvent, the weight ratio PGMEA:EL is preferably within a range from 9:1 to 5:5, and even more preferably from 8:2 to 6:4.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent, although the quantity should provide a concentration that enables favorable application of the solution to a support such as a substrate or the like, and should be set in accordance with the required coating film thickness, and is typically set so that the solid fraction concentration within the resist composition falls within a range from 2 to 20% by weight, and even more preferably from 5 to 15% by weight.

Other Optional Components

Other miscible additives can also be added to a positive resist composition of the third embodiment of the present invention according to need, and examples include additive resins for improving the properties of the resist film, surfactants for improving the ease of application, dissolution inhibitors, plasticizers, stabilizers, colorants, and halation prevention agents.

Process for Forming a Resist Pattern According to a Fourth Embodiment

A process for forming a resist pattern according to a fourth embodiment of the present invention can be conducted, for example, in the manner described below.

Namely, a positive resist composition described above is first applied to a support such as a silicon wafer using a spinner or the like, a prebake is then conducted under temperature conditions of 80 to 150° C., for a period of 40 to 120 seconds, and preferably for 60 to 90 seconds, and following selective exposure (irradiation) of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the support (substrate) and the applied layer of the resist composition.

As the support, conventional materials can be used without any particular restrictions, and suitable examples include substrates for electronic componentry, as well as substrates on which a predetermined wiring pattern has already been formed.

Specific examples of suitable substrates include silicon wafers, metal-based substrates such as copper, chrome, iron and aluminum, as well as glass substrates.

Suitable materials for the wiring pattern include copper, solder, chrome, aluminum, nickel, and gold.

There are no particular restrictions on the wavelength used for the exposure (irradiation), and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A resist composition according to the present invention is particularly effective for use with an ArF excimer laser.

In other words, the positive resist composition according to the third embodiment of the present invention, and the process for forming a resist pattern according to the fourth embodiment of the present invention are ideal for use within the production of electronic elements such as semiconductor elements and liquid crystal display elements. Furthermore, they are particularly suited to use within processes that employ a wavelength of 200 mn or lower, and particularly an ArF excimer laser. In the present invention, a resin with a narrow molecular weight distribution obtained using an anionic polymerization method, namely a star polymer, is preferably used.

In the present invention, resist patterns can be formed that exhibit high levels of sensitivity and resolution, as well as an excellent collapse margin and PEB margin.

Furthermore, as an additional effect, a resist pattern with minimal defects, and particularly bridge-mode defects, can be formed.

Furthermore, in the present invention, forming the core from the structural unit (c2) enables the production of a densely clustered star polymer copolymer, which improves the solubility of the copolymer in the resist solvent, lowers the viscosity, and ensures excellent coating characteristics for the resist. Furthermore, because the core is acid-dissociable, the contrast between the exposed and unexposed portions is enhanced.

Moreover, this polymer of the present invention has a narrow molecular weight distribution, and can be obtained in high yield, meaning a cheap resist composition can be provided.

Furthermore, the positioning of each of the monomer units within the polymer can be controlled, meaning an improvement in the resist characteristics can also be achieved.

EXAMPLES

As follows is a more detailed description of the present invention using a series of examples, although the scope of the present invention is in no way restricted by these examples.

Synthesis Example 1

Under a nitrogen atmosphere, 331 g of tetrahydrofuran (THF) containing 13 mmol of lithium chloride was held at a temperature of −40° C., and with constant stirring, 26 mmol of sec-butyl lithium (SBL) was added, and then 88 g of a THF (tetrahydrofuran) solution containing 97 mmol of 2-methyl-2-adamantyl methacrylate (2MAdMA), 78 mmol of a mixture (TLMA) of (±)-octahydro-3-oxo-4,7-methanoisobenzofuran-5-yl methacrylate and its positional isomer (±)-octahydro-1-oxo-4,7-methanoisobenzofuran-5-yl methacrylate, and 19 mmol of tert-butyl methacrylate (tBMA) was added dropwise to the reaction mixture, and the reaction was continued for 30 minutes. A small quantity of the reaction solution was then removed from the reaction system, and gas chromatography (hereafter abbreviated as GC) was used to confirm that the monomers had been completely consumed.

Subsequently, 12 g of a THF solution containing 22 mmol of 2,5-dimethyl-2,5-hexanediol dimethacrylate (MDMA) was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer. When the thus obtained polymer was analyzed using GPC (gel permeation chromatography), the star polymer portion exhibited Mw=29,400, Mw/Mn=1.23, and surface area=67%, whereas the arm polymer portion exhibited Mw=4,800, Mw/Mn=1.19, surface area=33%, and $^{13}$C-NMR measurements revealed a polymer composition ratio of 2MAdMA:TLMA:tBMA:MDMA=46:31:11:12 (molar ratio).

Synthesis Example 2

Under a nitrogen atmosphere, 233 g of THF containing 15 mmol of lithium chloride was held at a temperature of −40° C., and with constant stirring, 31 mmol of SBL was added, and then 171 g of a THF solution containing 88 mmol of 2MAdMA, 88 mmol of 5-oxo-4-oxatricyclo[4.2.1.0$^{3,7}$] nonan-2-yl methacrylate (NLMA), and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer. When the thus obtained polymer was analyzed using GPC, the star polymer portion exhibited Mw=32,700, Mw/Mn=1.23, and surface area=52%, whereas the arm polymer portion exhibited Mw=5,400, Mw/Mn=1.20, surface area=48%, and $^{13}$C-NMR measurements revealed a polymer composition ratio of 2MAdMA:NLMA:tBMA:MDMA=43:37:9:11 (molar ratio). This polymer is termed the star polymer 1.

Synthesis Example 3

Under a nitrogen atmosphere, 341 g of THF containing 7 mmol of lithium chloride was held at a temperature of −40° C., and with constant stirring, 14 mmol of SBL was added, and then 10 g of a THF solution containing 22 mmol of 2MAdMA was added dropwise to the reaction mixture, and the reaction was continued for 30 minutes. A small quantity of the reaction solution was then removed from the reaction system, and GC was used to confirm that the 2MAdMA monomer had been completely consumed. Subsequently, 78 g of a THF solution containing 66 mmol of 2MAdMA, 88 mmol of TLMA and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which 2MAdMA units were positioned at the outermost extremities. When the thus obtained polymer was analyzed using GPC, the star polymer portion exhibited Mw=21,400, Mw/Mn=1.23, and surface area=62%, whereas the arm polymer portion exhibited Mw=3,800, Mw/Mn=1.13, surface area=38%, and $^{13}$C-NMR measurements revealed a polymer composition ratio of 2MAdMA:TLMA:tBMA:MDMA=43:37:10:11 (molar ratio). This polymer is termed the star polymer 2.

Synthesis Example 4

Under a nitrogen atmosphere, 343 g of THF containing 5 mmol of lithium chloride was held at a temperature of −40° C., and with constant stirring, 11 mmol of SBL was added, and then 10 g of a THF solution containing 22 mmol of 2MAdMA was added dropwise to the reaction mixture, and the reaction was continued for 30 minutes. A small quantity of the reaction solution was then removed from the reaction system, and GC was used to confirm that the 2MAdMA monomer had been completely consumed. Subsequently, 78 g of a THF solution containing 79 mmol of 2MAdMA, 74 mmol of TLMA and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which 2MAdMA units were positioned at the outermost extremities. When the thus obtained polymer was analyzed using GPC, the star polymer portion exhibited Mw=25,400, Mw/Mn=1.23, and surface area=62%, whereas the arm polymer portion exhibited Mw=4,400, Mw/Mn=1.15, surface area=38%, and $^{13}$C-NMR measurements revealed a polymer composition ratio of 2MAdMA:TLMA:tBMA:MDMA=48:32:10:11 (molar ratio).

Synthesis Example 5

Under a nitrogen atmosphere, 256 g of THF containing 7 mmol of lithium chloride was held at a temperature of −40° C., and with constant stirring, 14 mmol of SBL was added, and then 10 g of a THF solution containing 22 mmol of 2MAdMA was added dropwise to the reaction mixture, and the reaction was continued for 30 minutes. A small quantity of the reaction solution was then removed from the reaction system, and GC was used to confirm that the 2MAdMA monomer had been completely consumed. Subsequently, 151 g of a THF solution containing 66 mmol of 2MAdMA, 88 mmol of NLMA and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which 2MAdMA units were positioned at the outermost extremities. Analysis of the thus obtained polymer using GPC revealed Mw=29,900 and Mw/Mn=1.26, and $^{13}$C-NMR measurements revealed a polymer composition ratio of 2MAdMA:NLMA:tBMA:MDMA=40:42:8:10 (molar ratio).

Synthesis Example 6

Under a nitrogen atmosphere, 315 g of THF containing 7 mmol of lithium chloride was held at a temperature of −40° C., and with constant stirring, 14 mmol of SBL was added, and then 9 g of a THF solution containing 22 mmol of 1-ethyl-1-cyclohexyl methacrylate (ECHMA) was added dropwise to the reaction mixture, and the reaction was continued for 30 minutes. A small quantity of the reaction solution was then removed from the reaction system, and GC was used to confirm that the ECHMA monomer had been completely consumed. Subsequently, 72 g of a THF solution containing 66 mmol of ECHMA, 88 mmol of TLMA and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which ECHMA units were positioned at the outermost extremities. When the thus obtained polymer was analyzed using GPC, the star polymer portion exhibited Mw=24,100, Mw/Mn=1.22, and surface area=64%, whereas the arm polymer portion exhibited Mw=3,600, Mw/Mn=1.19, surface area=36%, and $^{13}$C-NMR measurements revealed a polymer composition ratio of ECHMA:TLMA:tBMA:MDMA=42:37:10:11 (molar ratio). This polymer is termed the star polymer 3.

Example 1

A positive resist composition was produced with the composition shown below.
Component (A): 100 parts by weight of the star polymer 2 obtained in the above synthesis example 3, which is a copolymer formed from the structural units represented by the chemical formulas (40) shown below (wherein, p:q:r:s=43 mol %:37 mol %:11 mol %:10 mol %), in which the r unit forms the core, the p, q, and s units form the arms, and the p units form the arm terminals.

Component (B): 0.8 parts by weight of tri(tert-butylphenyl)sulfonium nonafluorobutanesulfonate per 100 parts by weight of the component (A), and 2.0 parts by weight of diphenylmonomethylphenylsulfonium nonafluorobutanesulfonate per 100 parts by weight of the component (A).

Component (D): 0.25 parts by weight of triethanolamine per 100 parts by weight of the component (A).

Organic solvent: 1200 parts by weight of a mixed solvent of PGMEA/EL (weight ratio 6/4).

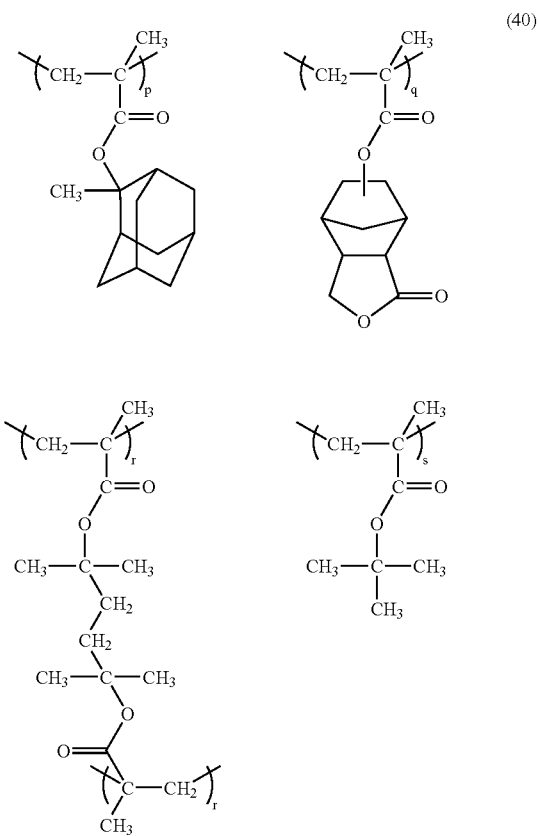

(40)

Example 2

A positive resist composition was produced with the composition shown below.

Only component (A) was altered from the example 1, in the manner described below.

Component (A): 100 parts by weight of the star polymer 1 obtained in the above synthesis example 2, which is a copolymer formed from the structural units represented by the chemical formulas (41) shown below (wherein, p:q:r:s=43 mol %:37 mol %:11 mol %:9 mol %), in which the r unit forms the core, and the p, q, and s units form the arms, but the p units do not form the arm terminals.

(41)

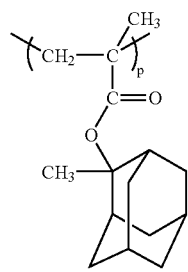 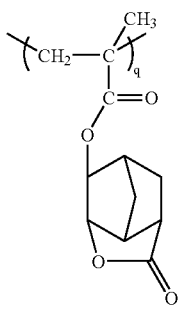

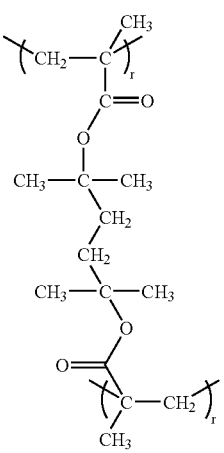 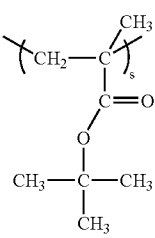

Example 3

A positive resist composition was produced with the composition shown below.

Only component (A) was altered from the example 1, in the manner described below.

Component (A): 100 parts by weight of the star polymer 3 obtained in the above synthesis example 6, which is a copolymer formed from the structural units represented by the chemical formulas (42) shown below (wherein, p:q:r:s=42 mol %:37 mol %:11 mol %:10 mol %), in which the r unit forms the core, the p, q, and s units form the arms, and the p units form the arm terminals.

(40)

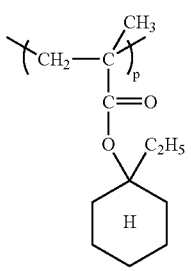 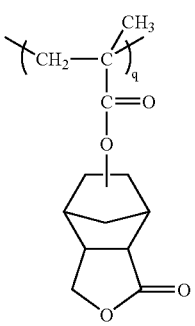

-continued

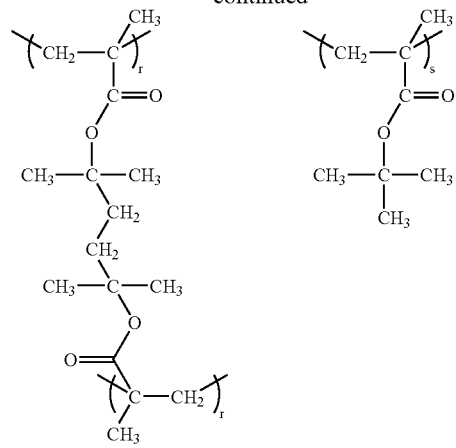

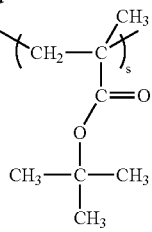

Comparative Example 1

With the exception of altering the component (A) to a resin component described below, a positive resist composition was produced in the same manner as the example 1.

Resin Component

A copolymer produced by conventional radical polymerization and containing the structural units represented by the chemical formulas (43) shown below (weight average molecular weight: 10,000, p:q:r=40 mol %:40 mol %:20 mol %)

(43)

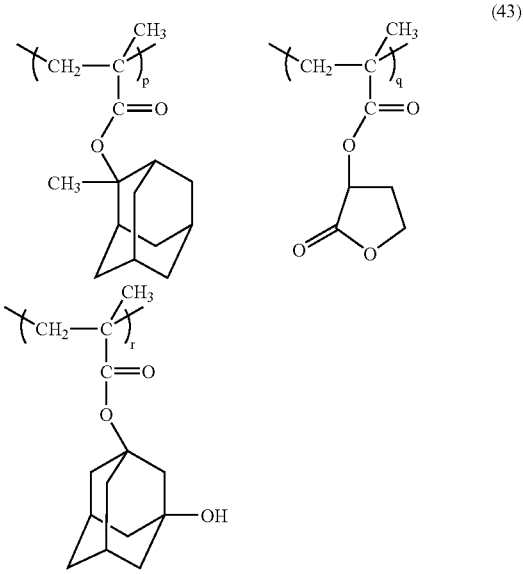

(Test Methods)

(1) Lithography Conditions (Sensitivity, Critical Resolution, Coating Characteristics)

An organic anti-reflective film composition "ARC-29A" (a product name, manufactured by Brewer Science Ltd.) was applied to the surface of an 8-inch silicon wafer using a spinner, and the composition was then baked and dried on a hotplate at 205° C. for 60 seconds, thereby forming an organic anti-reflective film with a film thickness of 77 nm.

The positive resist composition was then applied to the surface of this anti-reflective film using a spinner, and was then prebaked (PAB (post applied bake)) and dried on a hotplate at 120° C. for 90 seconds, thereby forming a resist layer with a film thickness of 250 nm.

Subsequently, this layer was selectively irradiated with an ArF excimer laser (193 nm) through a (binary) mask pattern, using an ArF exposure apparatus NSR-S302 (manufactured by Nikon Corporation; NA (numerical aperture)=0.60, ⅔ annular illumination).

The resist was then subjected to PEB treatment at 120° C. for 90 seconds, subsequently subjected to puddle development for 30 seconds at 23° C. in a 2.38% by weight aqueous solution of tetramethylammonium hydroxide, and was then washed for 30 seconds with water, and dried, thus forming a resist pattern. In the case of the comparative example 1, the PAB and PEB conditions were altered to treatment at 130° C. for 90 seconds.

As a result, in the example 1, a line and space pattern with a critical resolution of 120 nm was obtained, the sensitivity for this pattern was 25 mJ/cm$^2$, and the resist coating characteristics were good.

In the example 2, a line and space pattern with a critical resolution of 120 nm was obtained, the sensitivity for this pattern was 31 mJ/cm$^2$, and the resist coating characteristics were good.

In the example 3, a line and space pattern with a critical resolution of 120 nm was obtained, the sensitivity for this pattern was 21 mJ/cm$^2$, and the resist coating characteristics were good.

In the comparative example 1, a line and space pattern with a critical resolution of 120 nm was obtained, the sensitivity for this pattern was 27 mJ/cm$^2$, and the resist coating characteristics were good.

(2) (Collapse Margin)

For the resist patterns obtained within the above section entitled (1) lithography conditions, the collapse margin was determined at a pitch (the sum of the resist pattern size 120 nm and the space pattern size 120 nm) of 240 nm, by increasing the exposure dose, and determining the smallest resist pattern size at which a fine resist pattern could be formed.

The results were 64 nm for the example 1, 60 nm for the example 2, 70 nm for the example 3, and 72 nm for the comparative example 1.

(3) (PEB Margin)

For the resist patterns obtained within the above section entitled (1) lithography conditions, the PEB margin was determined by varying the PEB temperature between 115° C., 120° C., and 125° C., determining the resist pattern size formed at each of the temperatures, and then calculating a value for the variation in resist pattern size per unit of temperature.

The results were 2.8 nm/° C. for the example 1, 2.4 nm/° C. for the example 2, 2.6 nm/° C. for the example 3, and 7.4 mn/° C. for the comparative example 1.

(4) (Defects)

The resist patterns obtained within the above section entitled (1) lithography conditions were evaluated for defects by measuring the resist pattern using a surface defect inspection device KLA2351 (a product name) manufactured by KLA Tencor Corporation, and calculating the number of defects within the wafer.

The results were 20 defects/8-inch wafer for the example 1, 22 defects/8-inch wafer for the example 2, 25 defects/8-inch wafer for the example 3, and 227 defects/8-inch wafer for the comparative example 1.

From the results for the examples 1 to 3 it is evident that the present invention enables the formation of resist patterns that exhibit high levels of sensitivity and resolution, and an excellent collapse margin and PEB margin. Furthermore, it is also clear that a resist pattern with minimal defects can be formed, and that the coating characteristics are favorable.

Synthesis Example 7

Using the process detailed below, a star polymer 4 represented by the formulas shown below was synthesized.

Under a nitrogen atmosphere, 315 g of THF containing 7 mmol of lithium chloride was held at a temperature of −40° C., and with constant stirring, 15 mmol of SBL was added, and then 9 g of a THF solution containing 32 mmol of 1-(1-methacryloyloxy-1-methylethyl)adamantane (IAMA) was added dropwise to the reaction mixture, and the reaction was continued for 30 minutes. A small quantity of the reaction solution was then removed from the reaction system, and GC was used to confirm that the IAMA monomer had been completely consumed. Subsequently, 74 g of a THF solution containing 53 mmol of IAMA, 85 mmol of TLMA, and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 13 g of a THF solution containing 24 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which IAMA units were positioned at the outermost extremities. When the thus obtained polymer was analyzed using GPC, the star polymer portion exhibited Mw=30,000, Mw/Mn=1.27, and surface area=52%, whereas the arm polymer portion exhibited Mw=3,400, Mw/Mn=1.21, surface area=48%, and $^{13}$C-NMR measurements revealed a polymer composition ratio of IAMA:TLMA:tBMA:MDMA=40:40:9:11 (molar ratio).

Example 4

With the exception of altering the component (A) to the component shown below, a positive resist composition was produced in the same manner as the example 1.

Component (A): 100 parts by weight of the star polymer 4 obtained in the above synthesis example 7, which is a copolymer formed from the structural units represented by the chemical formulas (44) shown below (wherein, b:c:d:e=40:40:9:11 (mol %)), in which the d unit forms the core, the b, c, and e units form the arms, and the b units form the arm terminals.

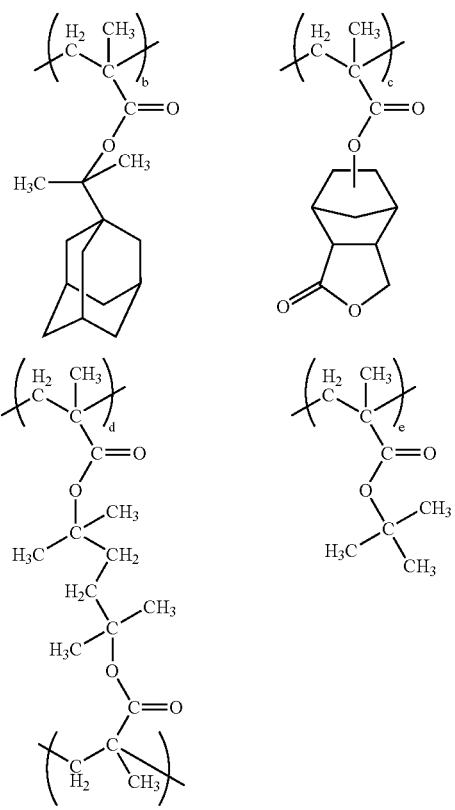

(44)

Comparative Example 2

With the exception of altering the component (A) to the resin component described below, a positive resist composition was produced in the same manner as the example 1.

Resin Component

A copolymer produced by conventional radical polymerization and containing the structural units represented by the chemical formulas (45) shown below (weight average molecular weight: 10,000, polydispersity: 1.9, f:g:h=40 mol %:40 mol %:20 mol %)

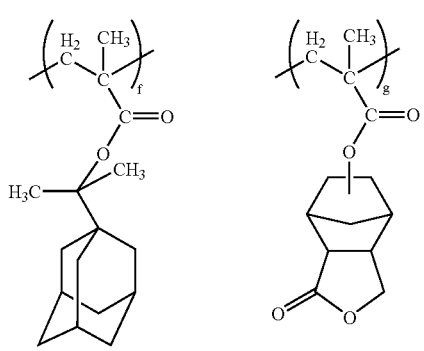

(45)

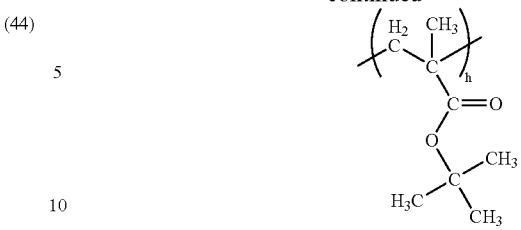

-continued

The positive resist compositions of the example 4 and the comparative example 2 were evaluated in the manner described below.

(2-1) Lithography Conditions (Sensitivity, Critical Resolution)

The positive resist composition was applied to the surface of an 8-inch SiON substrate using a spinner, and was then prebaked (PAB) and dried on a hotplate at 105° C. for 90 seconds, thereby forming a resist layer with a film thickness of 250 nm.

Subsequently, this layer was selectively irradiated with an ArF excimer laser (193 nm) through a (6% halftone) mask pattern, using an ArF exposure apparatus NSR-S-306 (manufactured by Nikon Corporation; NA (numerical aperture) =0.78, ⅔ annular illumination).

The resist was then subjected to PEB treatment at 115° C. for 90 seconds, subsequently subjected to puddle development for 30 seconds at 23° C. in a 2.38% by weight aqueous solution of tetramethylammonium hydroxide, and was then washed for 30 seconds with water, and dried, thus forming a resist pattern.

The exposure dose at which a 100 nm line and space pattern was able to faithfully reproduced was measured and recorded as the sensitivity (mJ/cm$^2$).

Furthermore, using this sensitivity, the pattern size was gradually reduced to determined the limiting pattern size, which was recorded as the critical resolution.

The results are shown in Table 1.

(2-2) PEB Margin

For the resist patterns obtained within the above section entitled (2-1) lithography conditions, the PEB margin was determined by varying the PEB temperature between 115° C., 120° C., and 125° C., determining the resist pattern size formed at each of the temperatures, and then calculating a value for the variation in resist pattern size per unit of temperature.

The results are shown in Table 1.

(2-3) Collapse Margin

For the resist patterns obtained within the above section entitled (2-1) lithography conditions, the collapse margin was determined at a pitch (the sum of the resist pattern size 100 nm and the space pattern size 100 nm) of 200 nm, by increasing the exposure dose, and determining the smallest resist pattern size at which a fine resist pattern could be formed.

The results are shown in Table 1.

(2-4) LWR

The line width of the 100 nm line and space pattern formed above in (2-1) was measured at 5 locations along the line direction using a measuring SEM (product name: S-9220, manufactured by Hitachi, Ltd.), and the results of these measurements were used to calculate a value of 3 times the standard deviation s (namely, 3s), which was used as an indicator of the LWR. The smaller this 3s value is, the lower the level of roughness in the line width, indicating a resist pattern with a more uniform width.

The results are shown in Table 1.

TABLE 1

| | Sensitivity | Critical resolution | Collapse margin | PEB margin | LWR |
|---|---|---|---|---|---|
| Example 4 | 23.0 mJ/cm$^2$ | 100 nm | 62.0 nm | 4.0 nm/° C. | 11.7 nm |
| Comparative Example 2 | 23.0 mJ/cm$^2$ | 100 nm | 65.3 nm | 7.0 nm/° C. | 18.1 nm |

From the results in Table 1 it is evident that in the example 4 according to the present invention, the sensitivity and resolution were favorable even on a SiON substrate, and the collapse margin, the PEB margin, and the LWR were also excellent.

Synthesis Example 8

Under a nitrogen atmosphere, 331 g of tetrahydrofuran (THF) containing 13 mmol of lithium chloride was held at a temperature of −40° C., and with constant stirring, 26 mmol of sec-butyl lithium (SBL) was added, and then 88 g of a THF (tetrahydrofuran) solution containing 97 mmol of 2-methyl-2-adamantyl methacrylate (2MAdMA), 78 mmol of a mixture (TLMA) of (±)-octahydro-3-oxo-4,7-methanoisobenzofuran-5-yl methacrylate and its positional isomer (±)-octahydro-1-oxo-4,7-methanoisobenzofuran-5-yl methacrylate, and 19 mmol of tert-butyl methacrylate (tBMA) was added dropwise to the reaction mixture, and the reaction was continued for 30 minutes. A small quantity of the reaction solution was then removed from the reaction system, and gas chromatography (hereafter abbreviated as GC) was used to confirm that the monomers had been completely consumed.

Subsequently, 12 g of a THF solution containing 22 mmol of 2,5-dimethyl-2,5-hexanediol dimethacrylate (MDMA) was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer. When the thus obtained polymer was analyzed using GPC, the star polymer portion exhibited Mw=29,400, Mw/Mn=1.23, and surface area=67%, whereas the arm polymer portion exhibited Mw=4,800, Mw/Mn=1.19, surface area=33%, and $^{13}$C-NMR measurements revealed a polymer composition ratio of 2MAdMA:TLMA:tBMA:MDMA=46:31:11:12 (molar ratio).

Synthesis Example 9

Under a nitrogen atmosphere, 233 g of THF containing 15 mmol of lithium chloride was held at a temperature of −40° C., and with constant stirring, 31 mmol of SBL was added, and then 171 g of a THF solution containing 88 mmol of 2MAdMA, 88 mmol of 5-oxo-4-oxatricyclo[4.2.1.0$^{3,7}$] nonan-2-yl methacrylate (NLMA), and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer. When the thus obtained polymer was analyzed using GPC, the star polymer portion exhibited Mw=32,700, Mw/Mn=1.23, and surface area=52%, whereas the arm polymer portion exhibited Mw=5,400, Mw/Mn=1.20, surface area=48%, and $^{13}$C-NMR measurements revealed a polymer composition ratio of 2MAdMA:NLMA:tBMA:MDMA=43:37:9:11 (molar ratio). This polymer is termed the star polymer 1.

Synthesis Example 10

Under a nitrogen atmosphere, 341 g of THF containing 7 mmol of lithium chloride was held at a temperature of −40° C., and with constant stirring, 14 mmol of SBL was added, and then 10 g of a THF solution containing 22 mmol of 2MAdMA was added dropwise to the reaction mixture, and the reaction was continued for 30 minutes. A small quantity of the reaction solution was then removed from the reaction system, and GC was used to confirm that the 2MAdMA monomer had been completely consumed. Subsequently, 78 g of a THF solution containing 66 mmol of 2MAdMA, 88 mmol of TLMA and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which 2MAdMA units were positioned at the outermost extremities. When the thus obtained polymer was analyzed using GPC, the star polymer portion exhibited Mw=21,400, Mw/Mn=1.23, and surface area=62%, whereas the arm polymer portion exhibited Mw=3,800, Mw/Mn=1.13, surface area=38%, and $^{13}$C-NMR measurements revealed a polymer composition ratio of 2MAdMA:TLMA:tBMA:MDMA=43:37:10:11 (molar ratio). This polymer is termed the star polymer 2.

Synthesis Example 11

Under a nitrogen atmosphere, 343 g of THF containing 5 mmol of lithium chloride was held at a temperature of −40° C., and with constant stirring, 11 mmol of SBL was added, and then 10 g of a THF solution containing 22 mmol of 2MAdMA was added dropwise to the reaction mixture, and the reaction was continued for 30 minutes. A small quantity of the reaction solution was then removed from the reaction system, and GC was used to confirm that the 2MAdMA monomer had been completely consumed. Subsequently, 78 g of a THF solution containing 79 mmol of 2MAdMA, 74 mmol of TLMA and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which 2MAdMA units were positioned at the outermost extremities. When the thus obtained polymer was analyzed using GPC, the star polymer portion exhibited Mw=25,400, Mw/Mn=1.23, and surface area=62%, whereas the arm polymer portion exhibited Mw=4,400, Mw/Mn=1.15, surface area=38%, and $^{13}$C-NMR measurements revealed a polymer composition ratio of 2MAdMA:TLMA:tBMA:MDMA=48:32:10:11 (molar ratio).

Synthesis Example 12

Under a nitrogen atmosphere, 256 g of THF containing 7 mmol of lithium chloride was held at a temperature of −40° C., and with constant stirring, 14 mmol of SBL was added, and then 10 g of a THF solution containing 22 mmol of 2MAdMA was added dropwise to the reaction mixture, and the reaction was continued for 30 minutes. A small quantity of the reaction solution was then removed from the reaction system, and GC was used to confirm that the 2MAdMA monomer had been completely consumed. Subsequently, 151 g of a THF solution containing 66 mmol of 2MAdMA, 88 mmol of NLMA and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which 2MAdMA units were positioned at the outermost extremities. Analysis of the thus obtained polymer using GPC revealed Mw=29,900 and Mw/Mn=1.26, and $^{13}$C-NMR measurements revealed a polymer composition ratio of 2MAdMA:NLMA:tBMA:MDMA=40:42:8:10 (molar ratio).

Synthesis Example 13

Under a nitrogen atmosphere, 315 g of THF containing 7 mmol of lithium chloride was held at a temperature of −40° C., and with constant stirring, 14 mmol of SBL was added, and then 9 g of a THF solution containing 22 mmol of 1-ethyl-1-cyclohexyl methacrylate (ECHMA) was added dropwise to the reaction mixture, and the reaction was continued for 30 minutes. A small quantity of the reaction solution was then removed from the reaction system, and GC was used to confirm that the ECHMA monomer had been completely consumed. Subsequently, 72 g of a THF solution containing 66 mmol of ECHMA, 88 mmol of TLMA and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 12 g of a THF solution containing 22 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which ECHMA units were positioned at the outermost extremities. When the thus obtained polymer was analyzed using GPC, the star polymer portion exhibited Mw=24,100, Mw/Mn=1.22, and surface area=64%, whereas the arm polymer portion exhibited Mw=3,600, Mw/Mn=1.19, surface area=36%, and $^{13}$C-NMR measurements revealed a polymer composition ratio of ECHMA:TLMA:tBMA:MDMA=42:37:10:11 (molar ratio). This polymer is termed the star polymer 3.

Example 5

A positive resist composition was produced with the composition shown below.

Component (A): 100 parts by weight of the star polymer 2 obtained in the above synthesis example 10, which is a copolymer formed from the structural units represented by the chemical formulas (46) shown below (wherein, p:q:r:s=43 mol %:37 mol %:11 mol %:10 mol %), in which the r unit forms the core, the p, q, and s units form the arms, and the p units form the arm terminals.

Component (B): 0.8 parts by weight of tri(tert-butylphenyl) sulfonium nonafluorobutanesulfonate per 100 parts by weight of the component (A), and 2.0 parts by weight of diphenylmonomethylphenylsulfonium nonafluorobutanesulfonate per 100 parts by weight of the component (A).

Component (D): 0.25 parts by weight of triethanolamine per 100 parts by weight of the component (A).

Organic solvent: 1200 parts by weight of a mixed solvent of PGMEA/EL (weight ratio 6/4).

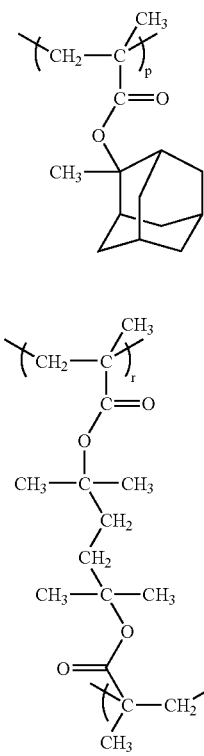

(46)

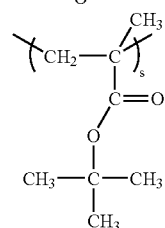

Example 6

A positive resist composition was produced with the composition shown below.

Only component (A) was altered from the example 5, in the manner described below.

Component (A): 100 parts by weight of the star polymer 1 obtained in the above synthesis example 9, which is a copolymer formed from the structural units represented by the chemical formulas (47) shown below (wherein, p:q:r:s=43 mol %:37 mol %:11 mol %:9 mol %), in which the r unit forms the core, and the p, q, and s units form the arms, but the p units do not form the arm terminals.

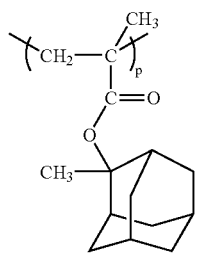 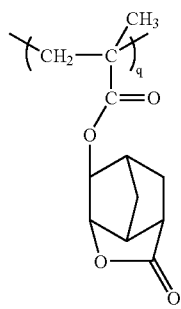

(47)

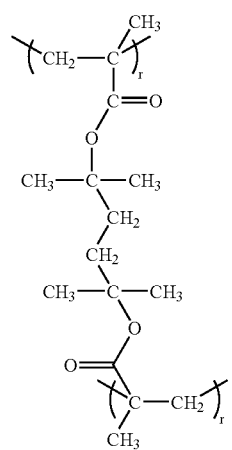 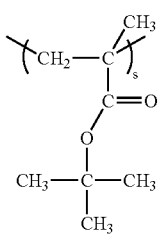

Example 7

A positive resist composition was produced with the composition shown below.

Only component (A) was altered from the example 5, in the manner described below.

Component (A): 100 parts by weight of the star polymer 3 obtained in the above synthesis example 13, which is a copolymer formed from the structural units represented by the chemical formulas (48) shown below (wherein, p:q:r:s=42 mol %:37 mol %:11 mol %:10 mol %), in which the r unit forms the core, the p, q, and s units form the arms, and the p units form the arm terminals.

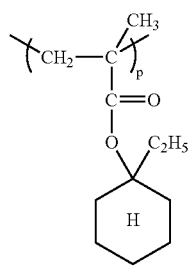 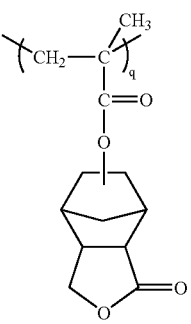

(48)

-continued

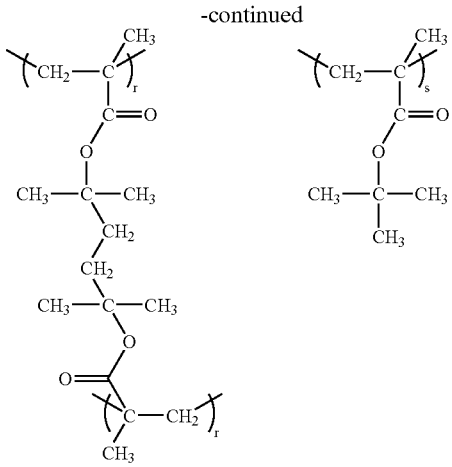

Comparative Example 3

With the exception of altering the component (A) to a resin component described below, a positive resist composition was produced in the same manner as the example 5.

Resin Component

A copolymer produced by conventional radical polymerization and containing the structural units represented by the chemical formulas (49) shown below (weight average molecular weight: 10,000, p:q:r=40 mol %:40 mol %:20 mol %)

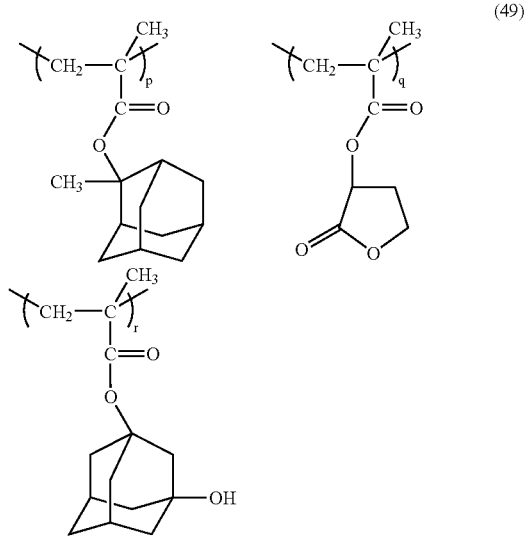

(49)

(Test Methods)

(5) Lithography Conditions (Sensitivity, Critical Resolution, Coating Characteristics)

An organic anti-reflective film composition "ARC-29A" (a product name, manufactured by Brewer Science Ltd.) was applied to the surface of an 8-inch silicon wafer using a spinner, and the composition was then baked and dried on a hotplate at 205° C. for 60 seconds, thereby forming an organic anti-reflective film with a film thickness of 77 nm.

The positive resist composition was then applied to the surface of this anti-reflective film using a spinner, and was then prebaked (PAB) and dried on a hotplate at 120° C. for 90 seconds, thereby forming a resist layer with a film thickness of 250 nm.

Subsequently, this layer was selectively irradiated with an ArF excimer laser (193 nm) through a (binary) mask pattern, using an ArF exposure apparatus NSR-S302 (manufactured by Nikon Corporation; NA (numerical aperture)=0.60, ⅔ annular illumination).

The resist was then subjected to PEB treatment at 120° C. for 90 seconds, subsequently subjected to puddle development for 30 seconds at 23° C. in a 2.38% by weight aqueous solution of tetramethylammonium hydroxide, and was then washed for 30 seconds with water, and dried, thus forming a resist pattern. In the case of the comparative example 3, the PAB and PEB conditions were altered to treatment at 130° C. for 90 seconds.

As a result, in the example 5, a line and space pattern with a critical resolution of 120 nm was obtained, the sensitivity for this pattern was 25 mJ/cm$^2$, and the resist coating characteristics were good.

In the example 6, a line and space pattern with a critical resolution of 120 nm was obtained, the sensitivity for this pattern was 31 mJ/cm$^2$, and the resist coating characteristics were good.

In the example 7, a line and space pattern with a critical resolution of 120 nm was obtained, the sensitivity for this pattern was 21 mJ/cm$^2$, and the resist coating characteristics were good.

In the comparative example 3, a line and space pattern with a critical resolution of 120 nm was obtained, the sensitivity for this pattern was 27 mJ/cm$^2$, and the resist coating characteristics were good.

(6) (Collapse Margin)

For the resist patterns obtained within the above section entitled (5) lithography conditions, the collapse margin was determined at a pitch (the sum of the resist pattern size 120 nm and the space pattern size 120 nm) of 240 nm, by increasing the exposure dose, and determining the smallest resist pattern size at which a fine resist pattern could be formed.

The results were 64 nm for the example 5, 60 nm for the example 6, 70 nm for the example 7, and 72 nm for the comparative example 3.

(7) (PEB Margin)

For the resist patterns obtained within the above section entitled (5) lithography conditions, the PEB margin was determined by varying the PEB temperature between 115° C., 120° C., and 125° C., determining the resist pattern size formed at each of the temperatures, and then calculating a value for the variation in resist pattern size per unit of temperature.

The results were 2.8 nm/° C. for the example 5, 2.4 nm/° C. for the example 6, 2.6 nm/° C. for the example 7, and 7.4 nm/° C. for the comparative example 3.

(8) (Defects)

The resist patterns obtained within the above section entitled (5) lithography conditions were evaluated for defects by measuring the resist pattern using a surface defect inspection device KLA2351 (a product name) manufactured by KLA Tencor Corporation, and calculating the number of defects within the wafer.

The results were 20 defects/8-inch wafer for the example 5, 22 defects/8-inch wafer for the example 6, 25 defects/8-inch wafer for the example 7, and 227 defects/8-inch wafer for the comparative example 3.

From the results for the examples 5 to 7 it is evident that the present invention enables the formation of resist patterns that exhibit high levels of sensitivity and resolution, and an excellent collapse margin and PEB margin. Furthermore, it is also clear that a resist pattern with minimal defects can be formed, and that the coating characteristics are favorable.

Synthesis Example 14

Using the process detailed below, a star polymer 4 represented by the formulas shown below was synthesized.

Under a nitrogen atmosphere, 315 g of THF containing 7 mmol of lithium chloride was held at a temperature of −40° C., and with constant stirring, 15 mmol of SBL was added, and then 9 g of a THF solution containing 32 mmol of 1-(1-methacryloyloxy-1-methylethyl)adamantane (IAMA) was added dropwise to the reaction mixture, and the reaction was continued for 30 minutes. A small quantity of the reaction solution was then removed from the reaction system, and GC was used to confirm that the IAMA monomer had been completely consumed. Subsequently, 74 g of a THF solution containing 53 mmol of IAMA, 85 mmol of TLMA, and 19 mmol of tBMA was added dropwise to the reaction mixture, and the reaction was continued for 30 minutes. A small quantity of the reaction solution was then removed from the reaction system, and GC was used to confirm that the monomers had been completely consumed.

Subsequently, 13 g of a THF solution containing 24 mmol of MDMA was added, the reaction was continued for a further 30 minutes, a small quantity of the reaction solution was then removed from the reaction system, GC was used to confirm that the MDMA monomer had been completely consumed, and then a THF solution containing hydrochloric acid was used to halt the reaction. The halted reaction liquid was poured into a large quantity of water to precipitate the polymer, which was filtered, washed and then dried, yielding a white powdery polymer. The thus obtained polymer was redissolved in THF and poured into a large quantity of methanol to precipitate the polymer, which was filtered, washed and then dried under reduced pressure for 10 hours, yielding a white powdery star polymer in which IAMA units were positioned at the outermost extremities. When the thus obtained polymer was analyzed using GPC, the star polymer portion exhibited Mw=30,000, Mw/Mn=1.27, and surface area=52%, whereas the arm polymer portion exhibited Mw=3,400, Mw/Mn=1.21, surface area=48%, and $^{13}$C-NMR measurements revealed a polymer composition ratio of IAMA:TLMA:tBMA:MDMA=40:40:9:11 (molar ratio).

Example 8

With the exception of altering the component (A) to the component shown below, a positive resist composition was produced in the same manner as the example 5.

Component (A): 100 parts by weight of the star polymer 4 obtained in the above synthesis example 14, which is a copolymer formed from the structural units represented by the chemical formulas (50) shown below (wherein, b:c:d:e=40:40:9:11 (mol %)), in which the d unit forms the core, the b, c, and e units form the arms, and the b units form the arm terminals.

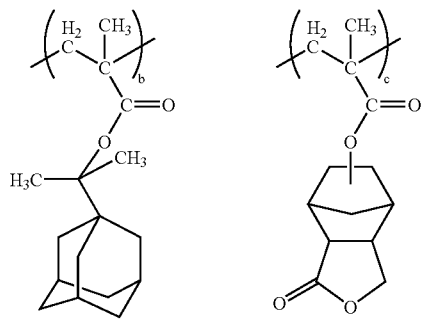

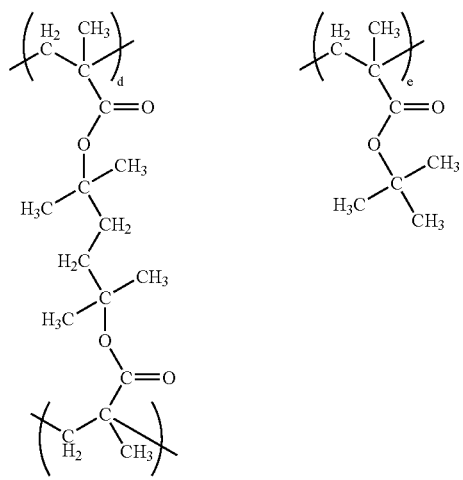

(50)

Comparative Example 4

With the exception of altering the component (A) to the resin component described below, a positive resist composition was produced in the same manner as the example 5.

Resin Component

A copolymer produced by conventional radical polymerization and containing the structural units represented by the chemical formulas (51) shown below (weight average molecular weight: 10,000, polydispersity: 1.9, f:g:h=40 mol %:40 mol %:20 mol %)

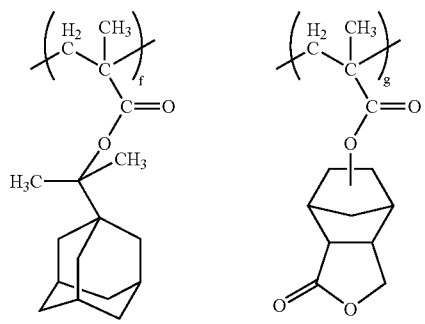

(51)

-continued

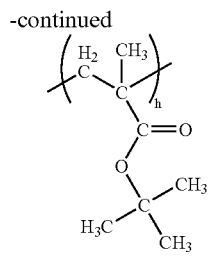

The positive resist compositions of the example 8 and the comparative example 4 were evaluated in the manner described below.

(2-5) Lithography Conditions (Sensitivity, Critical Resolution)

The positive resist composition was applied to the surface of an 8-inch SiON substrate using a spinner, and was then prebaked (PAB) and dried on a hotplate at 115° C. for 90 seconds, thereby forming a resist layer with a film thickness of 250 nm.

Subsequently, this layer was selectively irradiated with an ArF excimer laser (193 nm) through a (6% halftone) mask pattern, using an ArF exposure apparatus NSR-S-306 (manufactured by Nikon Corporation; NA (numerical aperture) =0.78, ⅔ annular illumination).

The resist was then subjected to PEB treatment at 105° C. for 90 seconds, subsequently subjected to puddle development for 30 seconds at 23° C. in a 2.38% by weight aqueous solution of tetramethylammonium hydroxide, and was then washed for 30 seconds with water, and dried, thus forming a resist pattern.

The exposure dose at which a 100 nm line and space pattern was able to faithfully reproduced was measured and recorded as the sensitivity (mJ/cm$^2$).

Furthermore, using this sensitivity, the pattern size was gradually reduced to determined the limiting pattern size, which was recorded as the critical resolution.

The results are shown in Table 2.

(2-6) PEB Margin

For the resist patterns obtained within the above section entitled (2-5) lithography conditions, the PEB margin was determined by varying the PEB temperature between 115° C., 120° C., and 125° C., determining the resist pattern size formed at each of the temperatures, and then calculating a value for the variation in resist pattern size per unit of temperature.

The results are shown in Table 2.

(2-7) Collapse Margin

For the resist patterns obtained within the above section entitled (2-5) lithography conditions, the collapse margin was determined at a pitch (the sum of the resist pattern size 100 nm and the space pattern size 100 nm) of 200 nm, by increasing the exposure dose, and determining the smallest resist pattern size at which a fine resist pattern could be formed.

The results are shown in Table 2.

(2-8) LWR

The line width of the 100 nm line and space pattern formed above in (2-5) was measured at 5 locations along the line direction using a measuring SEM (product name: S-9220, manufactured by Hitachi, Ltd.), and the results of these measurements were used to calculate a value of 3 times the standard deviation s (namely, 3s), which was used as an indicator of the LWR. The smaller this 3s value is, the lower the level of roughness in the line width, indicating a resist pattern with a more uniform width.

The results are shown in Table 2.

TABLE 2

| | Sensitivity | Critical resolution | Collapse margin | PEB margin | LWR |
|---|---|---|---|---|---|
| Example 8 | 23.0 mJ/cm$^2$ | 100 nm | 62.0 nm | 4.0 nm/° C. | 11.7 nm |
| Comparative Example 4 | 23.0 mJ/cm$^2$ | 100 nm | 65.3 nm | 7.0 nm/° C. | 18.1 nm |

From the results in Table 2 it is evident that in the example 8 according to the present invention, the sensitivity and resolution were favorable even on a SiON substrate, and the collapse margin, the PEB margin, and the LWR were also excellent.

The invention claimed is:

1. A positive resist composition, comprising:
a resin component (A) that exhibits increased alkali solubility under action of acid; and
an acid generator component (B) that generates acid on irradiation, wherein
said component (A) is a copolymer including a structural unit (a1) derived from a mono(α-lower alkyl)acrylate that contains an acid-dissociable, dissolution-inhibiting group, a structural unit (b1) derived from a mono(α-lower alkyl)acrylate that contains a lactone ring, and a structural unit (c1) derived from a poly(α-lower alkyl) acrylate represented by a general formula (1) below:

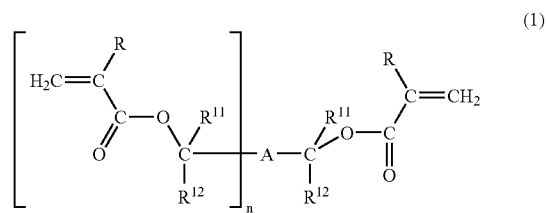

(wherein, R represents a lower alkyl group or a hydrogen atom, R$^{11}$ and R$^{12}$ each represent, independently, a lower alkyl group, n represents an integer from 1 to 5, and A represents a bivalent to hexavalent organic group).

2. A positive resist composition according to claim 1, wherein said structural unit (a1) within said component (A) includes two different structural units (a1-1) and (a1-2).

3. A positive resist composition according to claim 2, wherein said structural unit (a1-1) is a structural unit derived from a mono(α-lower alkyl)acrylate that contains a monocyclic or polycyclic group-containing acid-dissociable, dissolution-inhibiting group.

4. A positive resist composition according to claim 3, wherein said structural unit (a1-1) includes a structural unit represented by a general formula (II) shown below:

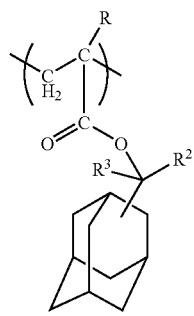

(II)

(wherein, R represents a hydrogen atom or a lower alkyl group, and $R^2$ and $R^3$ each represent, independently, a lower alkyl group).

5. A positive resist composition according to claim 2, wherein said structural unit (a1-2) is a structural unit derived from a mono(α-lower alkyl)acrylate that contains a chain-like acid-dissociable, dissolution-inhibiting group.

6. A positive resist composition according to claim 1, wherein said component (A) includes from 20 to 70 mol % of said structural unit (a1), from 20 to 60 mol % of said structural unit (b1), and from 1 to 30 mol % of said structural unit (c1).

7. A positive resist composition according to claim 2, wherein said structural unit (a1) includes from 50 to 99.9 mol % of said structural unit (a1-1), and from 0.1 to 50 mol % of said structural unit (a1-2).

8. A process for forming a resist pattern, comprising the steps of:
applying a positive resist composition according to any one of claim 1 through claim 7 to a support;
conducting a prebake;
performing selective exposure;
conducting PEB (post exposure baking); and
performing alkali developing to form a resist pattern.

9. A positive resist composition, comprising:
a resin component (A) tat exhibits increased alkali solubility under action of acid; and
an acid generator component (B) that generates acid on irradiation, wherein
said component (A) is a star polymer in which a core includes a polymer containing a structural unit (c2) derived from a poly(α-lower alkyl)acrylate that contains an acid-dissociable, dissolution-inhibiting group, as represented by a general formula (1) shown below, and in which arms including a structural unit (a2) derived from a mono(α-lower alkyl)acrylate that contains an acid-dissociable, dissolution-inhibiting group are bonded to said core:

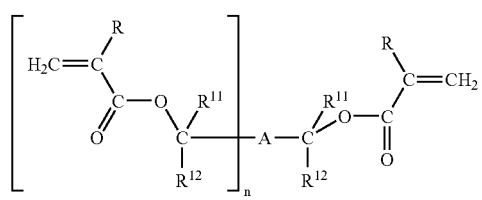

(1)

(wherein, R represents a lower alkyl group or a hydrogen atom, $R^{11}$ and $R^{12}$ each represent, independently, a lower alkyl group, n represents an integer from 1 to 5, and A represents a bivalent to hexavalent organic group).

10. A positive resist composition according to claim 9, wherein said component (A) is a star polymer in which arms including a structural unit (b2) derived from a mono(α-lower alkyl)acrylate that contains a lactone ring are bonded to said core.

11. A positive resist composition according to claim 9, wherein said structural unit (a2) within said component (A) includes two different structural units (a2-1) and (a2-2).

12. A positive resist composition according to claim 11, wherein said structural unit (a2-1) is a structural unit derived from a mono(α-lower alkyl)acrylate that contains a monocyclic or polycyclic group-containing acid-dissociable, dissolution-inhibiting group.

13. A positive resist composition according to claim 12, wherein said structural unit (a2-1) includes a structural unit represented by a general formula (II) shown below:

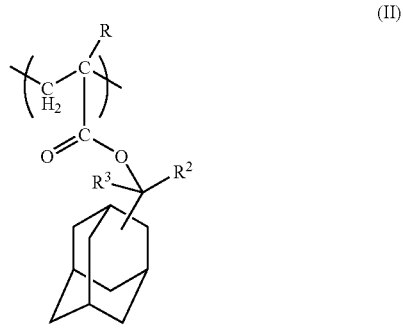

(II)

(wherein, R represents a hydrogen atom or a lower alkyl group, and $R^2$ and $R^3$ each represent, independently, a lower alkyl group).

14. A positive resist composition according to claim 11, wherein said structural unit (a2-2) is a structural unit derived from a mono(α-lower alkyl)acrylate that contains a chain-like acid-dissociable, dissolution-inhibiting group.

15. A positive resist composition according to claim 9, wherein said component (A) includes from 20 to 70 mol % of said structural unit (a2), from 20 to 60 mol % of said structural unit (b2), and from 1 to 30 mol % of said structural unit (c2).

16. A positive resist composition according to claim 11, wherein said structural unit (a2) includes from 50 to 99.9 mol % of said structural unit (a2-1), and from 0.1 to 50 mol % of said structural unit (a2-2).

17. A process for forming a resist pattern, comprising the steps of:
applying a positive resist composition according to any one of claim 9 through claim 16 to a support;
conducting a prebake;
performing selective exposure;
conducting PEB (post exposure baking); and
performing alkali developing to form a resist pattern.

* * * * *